(12) United States Patent
Shiraishi

(10) Patent No.: US 6,915,017 B2
(45) Date of Patent: Jul. 5, 2005

(54) IMAGE COMPRESSION APPARATUS, IMAGE EXPANSION APPARATUS, IMAGE FORMING APPARATUS, IMAGE COMPRESSION METHOD, IMAGE EXPANSION METHOD AND STORAGE MEDIUM

(75) Inventor: Naoto Shiraishi, Tokyo (JP)

(73) Assignee: Ricoh Company, Ltd., Tokyo (JP)

( * ) Notice: Subject to any disclaimer, the term of this patent is extended or adjusted under 35 U.S.C. 154(b) by 612 days.

(21) Appl. No.: 10/127,553

(22) Filed: Apr. 23, 2002

(65) Prior Publication Data

US 2003/0063813 A1 Apr. 3, 2003

(30) Foreign Application Priority Data

Apr. 24, 2001 (JP) ........................................ 2001-126558

(51) Int. Cl.[7] ................................................ G06K 9/36
(52) U.S. Cl. ...................................... 382/245; 382/238
(58) Field of Search ................................ 382/172, 232, 382/233, 234, 238, 244, 245, 246; 375/240.12, 240.23, 240.25; 341/59, 63, 65; 358/426.12, 426.13

(56) References Cited

U.S. PATENT DOCUMENTS

| | | | | |
|---|---|---|---|---|
| 4,509,194 A | * | 4/1985 | Harrington | ................... 382/245 |
| 4,800,441 A | * | 1/1989 | Sato | ....................... 358/426.12 |
| 4,809,081 A | * | 2/1989 | Linehan | ....................... 382/233 |
| 4,843,632 A | * | 6/1989 | Lee et al. | .................... 382/233 |
| 5,170,445 A | * | 12/1992 | Nelson et al. | .............. 382/233 |
| 5,280,361 A | * | 1/1994 | Ishikawa | ..................... 382/233 |
| 6,658,159 B1 | * | 12/2003 | Taubman | .................... 382/240 |
| 6,778,709 B1 | * | 8/2004 | Taubman | .................... 382/240 |

FOREIGN PATENT DOCUMENTS

| | | |
|---|---|---|
| JP | 5-183760 | 7/1993 |
| JP | 7-236065 | 9/1995 |
| JP | 7-264417 | 10/1995 |
| JP | 9-65147 | 3/1997 |
| JP | 9-248943 | 9/1997 |
| JP | 10-117289 | 5/1998 |
| JP | 2000-217005 | 8/2000 |

* cited by examiner

Primary Examiner—Andrew W. Johns
Assistant Examiner—Amir Alavi
(74) Attorney, Agent, or Firm—Dickstein Shapiro Morin & Oshinsky LLP

(57) ABSTRACT

An image compression apparatus compresses image data by carrying out a parallel processing for every image pattern made up of a plurality of bits. The apparatus includes a first unit for obtaining a run length of the image data and a repetition number of the run length, a second unit for coding the run length and the repetition number obtained by the first unit, and a third unit for predicting whether or not a code length of a code generated by a word which is to be coded by the second unit exceeds a predetermined threshold value, based on the run length and the repetition number obtained by the first unit. The second unit carries out a pass coding to output the image pattern as it is when the third unit predicts that the code length exceeds the predetermined threshold value.

15 Claims, 68 Drawing Sheets

FIG.12

Particular Example 1

|  | 0 | 1 | 2 | 3 | 4 |
|---|---|---|---|---|---|
| PIXEL | 0011 1110 | 0011 1100 | 0011 1000 | 1101 0010 | 1100 1110 |
| RUN LENGTH | 2   5 | 3   4 | 4  3 3 | 2 1 1   2 1 1 | 2 2   3 |
| AMOUNT OF CODE | 2 | 2 | 3 | 6 | 3 |
| CODE | 1 4 | 2 3 | 3 2 2 | 1 0 0 1 0 0 | 2 2 3 |

↓

|  |  |  |  |  |  |
|---|---|---|---|---|---|
| PIXEL | 0011 1110 | 0011 1100 | 0011 1000 | 1101 0010 | 1100 1110 |
| RUN LENGTH | 2   5 | 3   4 | 4  3 3 | PASS | 2 2   3 |
| AMOUNT OF CODE | 2 | 2 | 3 | 3 | 3 |
| CODE | 2 5 | 3 4 | 4 3 3 | 9 D 2 | 2 2 3 |

Particular Example 2

|  | 0 | 1 | 2 | 3 | 4 |
|---|---|---|---|---|---|
| PIXEL | 0011 1110 | 0011 1100 | 0011 1000 | 0010 1101 | 1100 1110 |
| RUN LENGTH | 2   5 | 3   4 | 4   3 | 5 1 1   2 1 | 3 2   3 |
| AMOUNT OF CODE | 2 | 2 | 2 | 5 | 3 |
| CODE | 2 5 | 3 4 | 4 3 | 4 0 0 1 0 | 2 2 3 |

↓

|  |  |  |  |  |  |
|---|---|---|---|---|---|
| PIXEL | 0011 1110 | 0011 1100 | 0011 1000 | 0010 1101 | 1100 1110 |
| RUN LENGTH | 2   5 | 3   4 | 4  3 3 | PASS | 2 2   3 |
| AMOUNT OF CODE | 2 | 2 | 3 | 3 | 3 |
| CODE | 2 5 | 3 4 | 4 3 3 | 9 2 D | 2 2 3 |

FIG.13

Particular Example 3

|  | 0 | 1 | 2 | 3 | 4 |
|---|---|---|---|---|---|
| PIXEL | 0011 1110 | 0011 0011 | 0011 0011 | 0010 1001 | 1010 1010 |
| RUN LENGTH | 2  5 | 3 2 2 |  | 1 1  1 2 | 2 1 1 |
| REPETITION NO. |  |  |  | 6 |  |
| AMOUNT OF CODE | 2 | 3 | 2 | 4 | 3 |
| CODE | 1 4 | 2 1 1 | F A | 0 0 0 1 | 1 0 0 |

↓

| PIXEL | 0011 1110 | 0011 0011 | 0011 0011 | 0010 1001 | 1010 1010 |
|---|---|---|---|---|---|
| RUN LENGTH | 2  5 | 3 2 2 |  | PASS | 1 1 |
| REPETITION NO. |  |  | 5 |  |  |
| AMOUNT OF CODE | 2 | 3 | 2 | 3 | 2 |
| CODE | 1 4 | 2 1 1 | F 9 | 9 2 9 | 0 0 |

Particular Example 4

|  | 0 | 1 | 2 | 3 | 4 |
|---|---|---|---|---|---|
| PIXEL | 0011 1110 | 0011 0011 | 0011 0011 | 1101 0010 | 0011 0011 |
| RUN LENGTH | 2  5 | 3 2 2 |  | 4 1 1  2 | 3 2 2 |
| REPETITION NO. |  |  | 4 | 1 | 1 |
| AMOUNT OF CODE | 2 | 3 | 2 | 5 | 4 |
| CODE | 1 4 | 2 1 1 | E E | 3 0 0 1 D | 2 1 1 D |

↓

| PIXEL | 0011 1110 | 0011 0011 | 0011 0011 | 1101 0010 | 0011 0011 |
|---|---|---|---|---|---|
| RUN LENGTH | 2  5 | 3 2 2 |  | PASS | 2 2 |
| REPETITION NO. |  |  | 5 |  | 2 |
| AMOUNT OF CODE | 2 | 3 | 2 | 3 | 3 |
| CODE | 1 4 | 2 1 1 | F 8 | 8 D 2 | 1 1 E |

FIG. 51
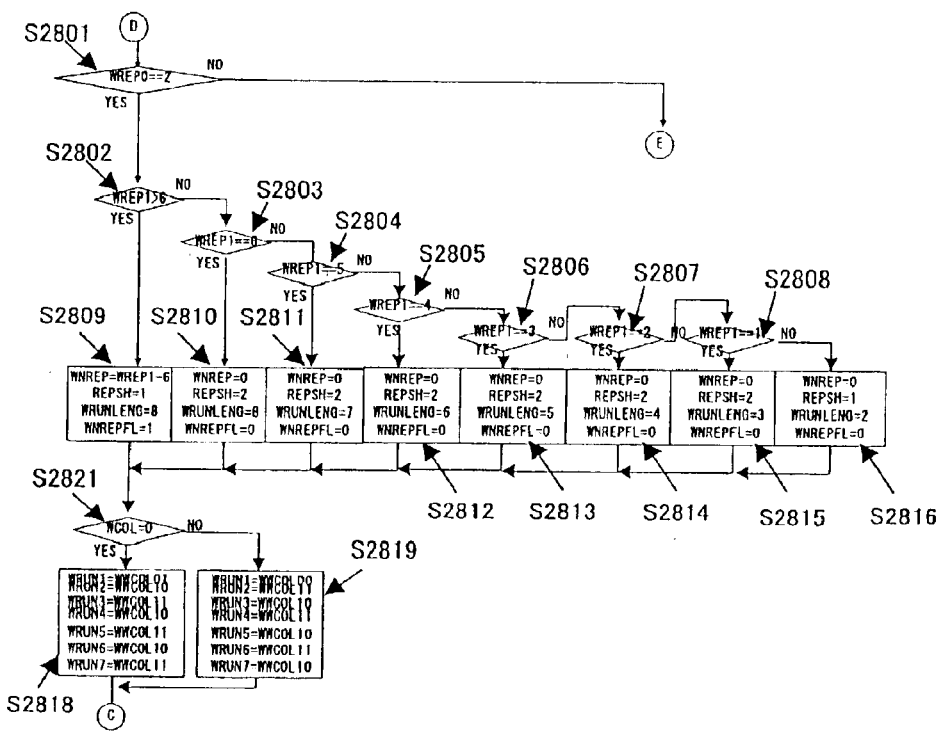
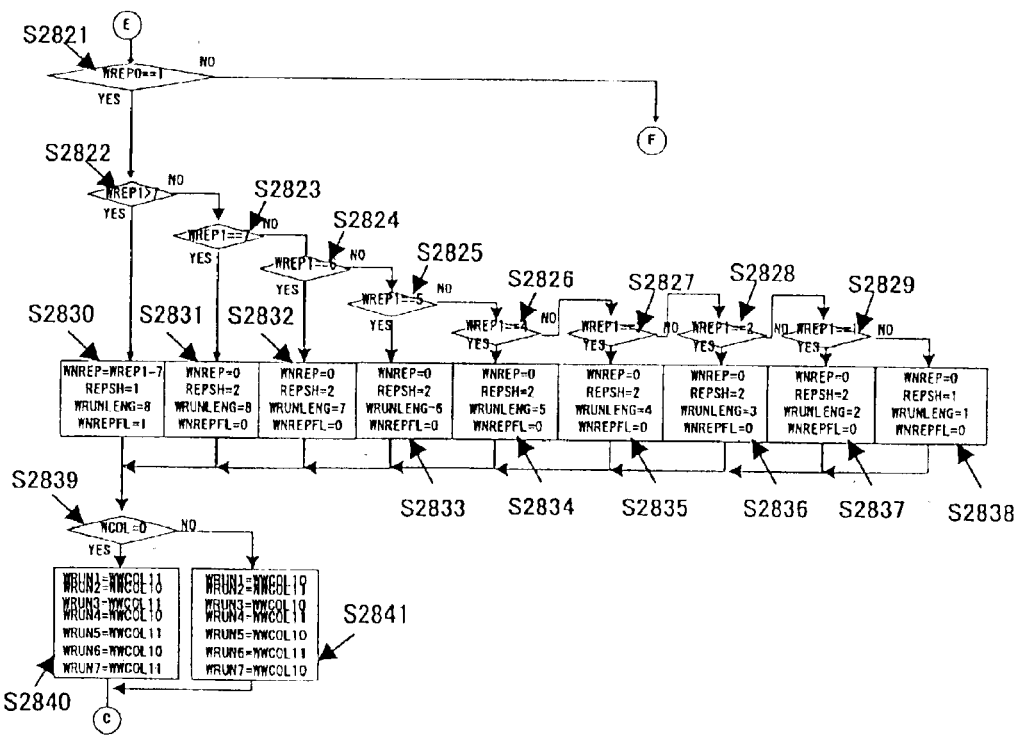

FIG. 52
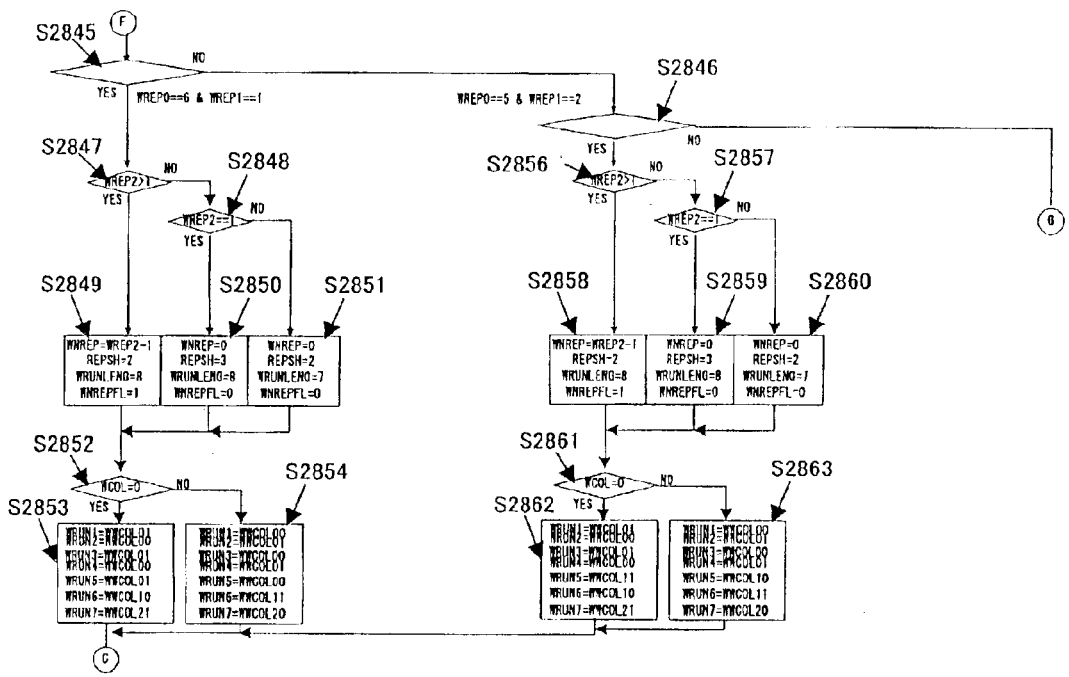
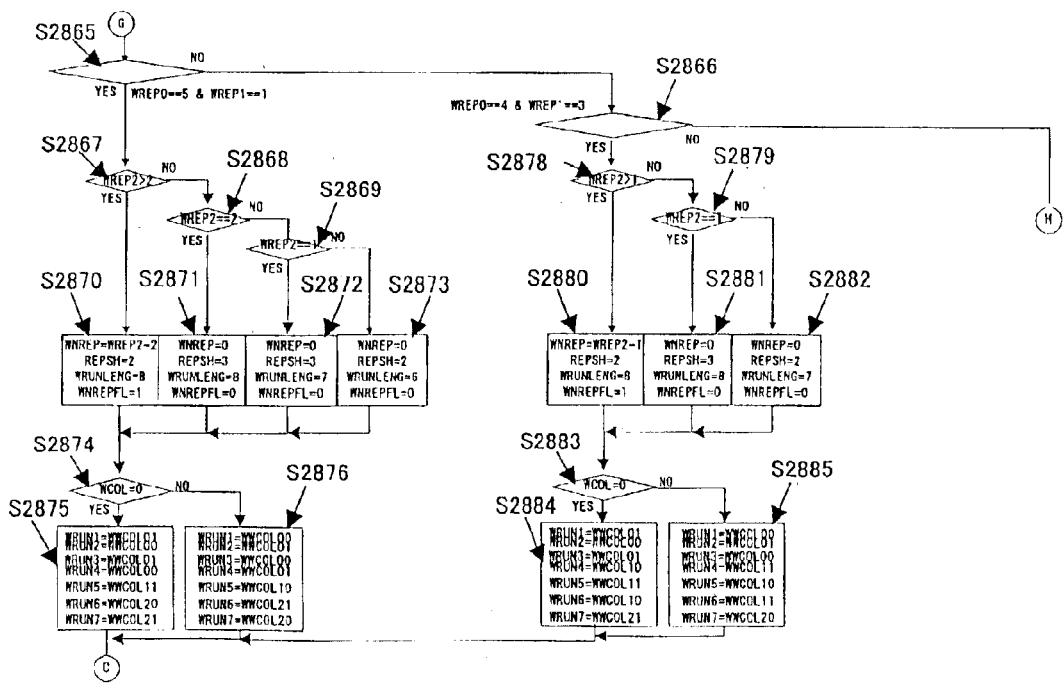

FIG. 53
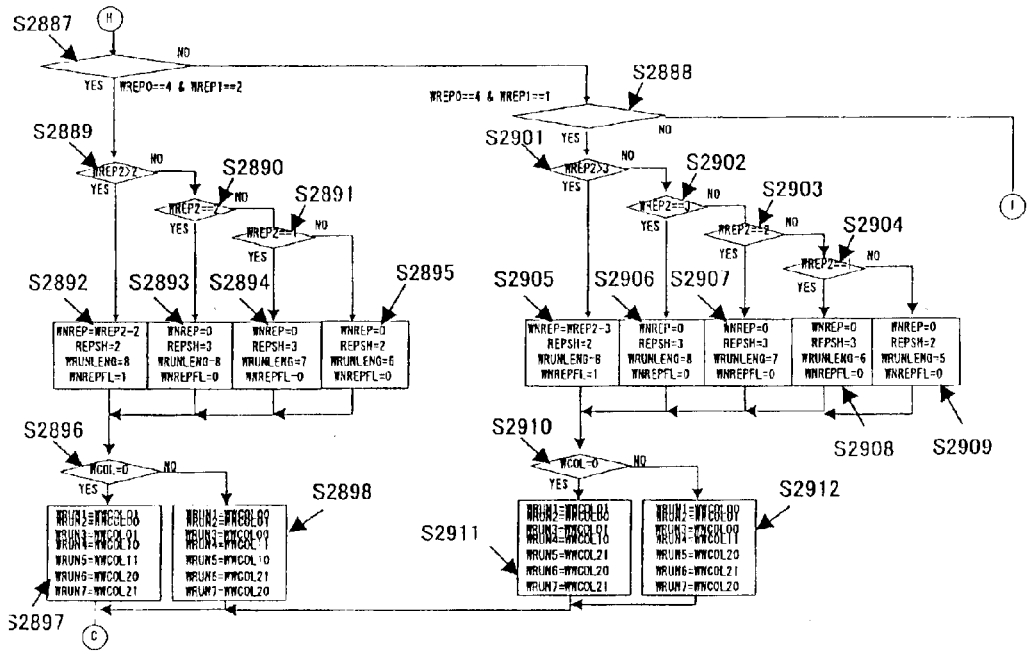
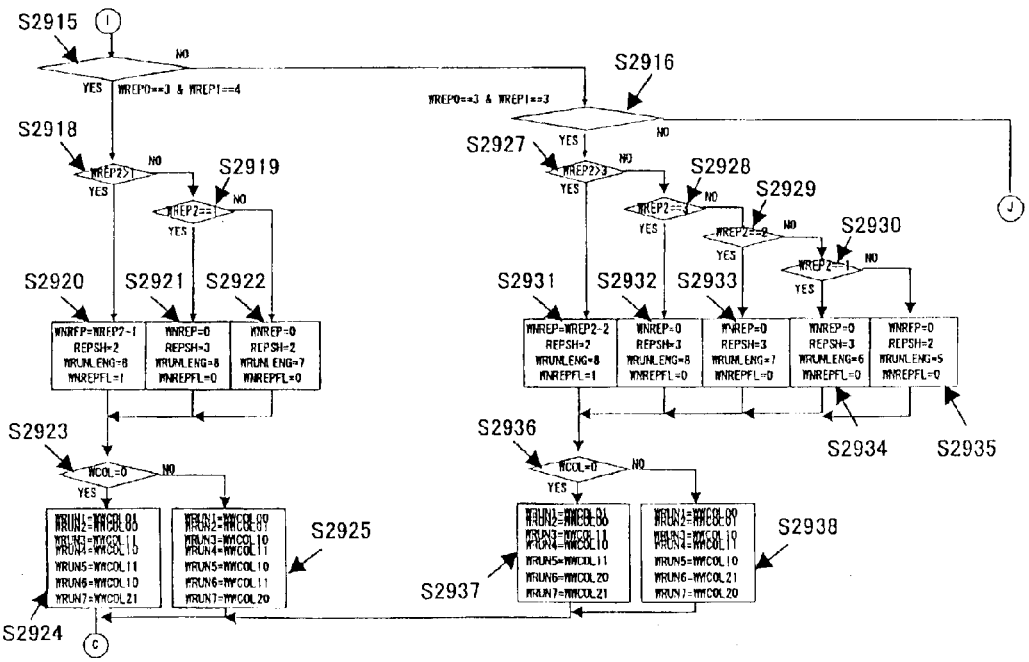

FIG. 67

| | | | |
|---|---|---|---|
| 7, 1 | 2, 6 | 1, 7 | 1, 1, 6 |
| 6, 2 | 2, 5, 1 | 1, 6, 1 | 1, 1, 5, 1 |
| 6, 1, 1 | 2, 4, 2 | 1, 5, 2 | 1, 1, 4, 2 |
| 5, 3 | 2, 4, 1, 1 | 1, 5, 1, 1 | 1, 1, 4, 1, 1 |
| 5, 2, 1 | 2, 3, 3 | 1, 4, 3 | 1, 1, 3, 3 |
| 5, 1, 2 | 2, 3, 2, 1 | 1, 4, 2, 1 | 1, 1, 3, 2, 1 |
| 5, 1, 1, 1 | 2, 3, 1, 2 | 1, 4, 1, 2 | 1, 1, 3, 1, 2 |
| 4, 4 | 2, 3, 1, 1, 1 | 1, 4, 1, 1, 1 | 1, 1, 3, 1, 1, 1 |
| 4, 3, 1 | 2, 2, 4 | 1, 3, 4 | 1, 1, 2, 4 |
| 4, 2, 2 | 2, 2, 3, 1 | 1, 3, 3, 1 | 1, 1, 2, 3, 1 |
| 4, 2, 1, 1 | 2, 2, 2, 2 | 1, 3, 2, 2 | 1, 1, 2, 2, 2 |
| 4, 1, 3 | 2, 2, 2, 1, 1 | 1, 3, 2, 1, 1 | 1, 1, 2, 2, 1, 1 |
| 4, 1, 2, 1 | 2, 2, 1, 3 | 1, 3, 1, 3 | 1, 1, 2, 1, 3 |
| 4, 1, 1, 2 | 2, 2, 1, 2, 1 | 1, 3, 1, 2, 1 | 1, 1, 2, 1, 2, 1 |
| 4, 1, 1, 1, 1 | 2, 2, 1, 1, 2 | 1, 3, 1, 1, 2 | 1, 1, 2, 1, 1, 2 |
| 3, 5 | 2, 2, 1, 1, 1, 1 | 1, 3, 1, 1, 1, 1 | 1, 1, 2, 1, 1, 1, 1 |
| 3, 4, 1 | 2, 1, 5 | 1, 2, 5 | 1, 1, 1, 5 |
| 3, 3, 2 | 2, 1, 4, 1 | 1, 2, 4, 1 | 1, 1, 1, 4, 1 |
| 3, 3, 1, 1 | 2, 1, 3, 2 | 1, 2, 3, 2 | 1, 1, 1, 3, 2 |
| 3, 2, 3 | 2, 1, 3, 1, 1 | 1, 2, 3, 1, 1 | 1, 1, 1, 3, 1, 1 |
| 3, 2, 2, 1 | 2, 1, 2, 3 | 1, 2, 2, 3 | 1, 1, 1, 2, 3 |
| 3, 2, 1, 2 | 2, 1, 2, 2, 1 | 1, 2, 2, 2, 1 | 1, 1, 1, 2, 2, 1 |
| 3, 2, 1, 1, 1 | 2, 1, 2, 1, 2 | 1, 2, 2, 1, 2 | 1, 1, 1, 2, 1, 2 |
| 3, 1, 4 | 2, 1, 2, 1, 1, 1 | 1, 2, 2, 1, 1, 1 | 1, 1, 1, 2, 1, 1, 1 |
| 3, 1, 3, 1 | 2, 1, 1, 4 | 1, 2, 1, 4 | 1, 1, 1, 1, 4 |
| 3, 1, 2, 2 | 2, 1, 1, 3, 1 | 1, 2, 1, 3, 1 | 1, 1, 1, 1, 3, 1 |
| 3, 1, 2, 1, 1 | 2, 1, 1, 2, 2 | 1, 2, 1, 2, 2 | 1, 1, 1, 1, 2, 2 |
| 3, 1, 1, 3 | 2, 1, 1, 2, 1, 1 | 1, 2, 1, 2, 1, 1 | 1, 1, 1, 1, 2, 1, 1 |
| 3, 1, 1, 2, 1 | 2, 1, 1, 1, 3 | 1, 2, 1, 1, 3 | 1, 1, 1, 1, 1, 3 |
| 3, 1, 1, 1, 2 | 2, 1, 1, 1, 2, 1 | 1, 2, 1, 1, 2, 1 | 1, 1, 1, 1, 1, 2, 1 |
| 3, 1, 1, 1, 1, 1 | 2, 1, 1, 1, 1, 2 | 1, 2, 1, 1, 1, 2 | 1, 1, 1, 1, 1, 1, 2 |
| 8 | 2, 1, 1, 1, 1, 1, 1 | 1, 2, 1, 1, 1, 1, 1 | 1, 1, 1, 1, 1, 1, 1, 1 |

FIG. 68

| | | | |
|---|---|---|---|
| 7, 1 | 2, 6 | 1, 7 | 1, 1, 6 |
| 6, 2 | 2, 5, 1 | 1, 6, 1 | 1, 1, 5 |
| 6, 1, 1 | 2, 4, 2 | 1, 5, 2 | 1, 1, 4 |
| 5, 3 | 2, 4, 1 | 1, 5, 1 | |
| 5, 2, 1 | 2, 3, 3 | 1, 4, 3 | 1, 1, 3 |
| 5, 1, 2 | 2, 3, 2 | 1, 4, 2 | |
| 5, 1, 1 | 2, 3, 1 | 1, 4, 1 | |
| 4, 4 | | | |
| 4, 3, 1 | 2, 2, 4 | 1, 3, 4 | 1, 1, 2 |
| 4, 2, 2 | 2, 2, 3 | 1, 3, 3 | |
| 4, 2, 1 | 2, 2, 2 | 1, 3, 2 | |
| 4, 1, 3 | | | |
| 4, 1, 2 | 2, 2, 1 | 1, 3, 1 | |
| 4, 1, 1 | | | |
| | | | |
| 3, 5 | | | |
| 3, 4, 1 | 2, 1, 5 | 1, 2, 5 | 1, 1, 1 |
| 3, 3, 2 | 2, 1, 4 | 1, 2, 4 | |
| 3, 3, 1 | 2, 1, 3 | 1, 2, 3 | |
| 3, 2, 3 | | | |
| 3, 2, 2 | 2, 1, 2 | 1, 2, 2 | |
| 3, 2, 1 | | | |
| | | | |
| 3, 1, 4 | | | |
| 3, 1, 3 | 2, 1, 1 | 1, 2, 1 | |
| 3, 1, 2 | | | |
| 3, 1, 2 | | | |
| 3, 1, 1 | | | |

IMAGE COMPRESSION APPARATUS, IMAGE EXPANSION APPARATUS, IMAGE FORMING APPARATUS, IMAGE COMPRESSION METHOD, IMAGE EXPANSION METHOD AND STORAGE MEDIUM

BACKGROUND OF THE INVENTION

This application claims the benefit of a Japanese Patent Application No.2001-126558 filed Apr. 24, 2001, in the Japanese Patent Office, the disclosure of which is hereby incorporated by reference.

1. Field of the Invention

The present invention generally relates to image compression apparatuses, image expansion apparatuses, image forming apparatuses, image compression methods, image expansion methods and storage media, and more particularly to an image compression apparatus, image expansion apparatus, image compression method and image expansion method which are suited for a memory saving mechanism which saves a required frame buffer capacity, to an image forming apparatus which employs such image compression and image expansion methods, and to a computer-readable storage medium which stores a program for causing a computer to carry out such image compression and image expansion methods.

2. Description of the Related Art

Image data compression techniques are used for the purposes of reducing the memory capacity required to hold the image data and for reducing a transmission time of the image data.

As methods of compressing binary image data, the run length coding of the first order compression, MH (Modified Huffman) coding used in facsimile machines, and the JBIG (Joint Bi-level Image experts Group) which is an international standard of the second order compression system are well known. In addition, a modification of the MH coding is proposed in a Japanese Laid-Open Patent Application No.9-65147, so as to improve the compression rate and the processing speed. According to the coding system proposed in the Japanese Laid-Open Patent Application No.9-65147, the run lengths of the immediately preceding black and white are stored when carrying out the MG coding, and a predetermined iterative code is generated when a run length of a certain color matches the immediately preceding run length.

According to the coding systems described above, it is possible to obtain a high compression rate with respect to particular image data, but it is difficult to obtain a sufficiently high compression rate with respect to image data in which the color frequently changes at a short period.

In addition, the JBIG uses for the entropy coding a QM coder which is an arithmetic coder. For this reason, there are problems in that the hardware cost of a context memory and a line memory for creating the context is high, and that it is difficult to realize a high-speed operation.

On the other hand, according to the coding system proposed in the Japanese Laid-Open Patent Application No.9-65147, the compression rate is improved only in a case where the amount of data of the code word when the run lengths match is sufficiently small compared to the amount of data of the code word when the run lengths do not match. However, since allocating a short code word by the iterative code relatively increases the length of the code word of the run lengths which do not match, there is a problem in that it is difficult to obtain a code set having a sufficiently high compression rate with respect to the image data in which the color frequently changes at a short period. In addition, since the code set used in the Japanese Laid-Open Patent Application No.9-65147 is similar to the MH code, a large number of gates are required in order to process the plurality of bits, and it is difficult to expect high-speed processing using parallel processing.

A coding method for solving this problem is proposed in a Japanese Laid-Open Patent Application No.2000-217005. According to this proposed coding method, a numeric sequence of the alternate run lengths of every color obtained by scanning the image data is converted into a predetermined code sequence and output. When a predetermined run length is input, this coding methods sets a case where this run length matches an immediately preceding run length of the same color as a matching phenomenon, and sets a case where this run length does match the immediately preceding run length of the same color as a non-matching phenomenon. A number of consecutive matching phenomena is set as an iterative number. An iterative code corresponding to the iterative number is generated when the generation of the matching phenomenon or the consecutive non-matching phenomena occurs. A code which indicates the value of the run length is generated when the non-matching phenomenon is generated.

In addition, systems of compressing and expanding the run length code are proposed in a Japanese Laid-Open Patent Application No.7-236065. According to the proposed compressing and expanding systems, a 1-bit comparison is made for every one clock and the run length is counted up or, a matching of the same run length values is made, to realize a high-speed compression and expansion.

However, when these compressing and expanding systems are employed, the coded data may have a size greater than the original data, depending on the image data. For this reason, a system having an image compression apparatus must be provided with a memory having a memory capacity which takes into account the worst case for the compression rate, that is, a case where the amount of data increases due to the compression. As a result, there are problems in that the cost of the memory increases due to the need to provide the memory capacity for the worst case, and the processing speed deteriorates because of the increased memory accesses.

Japanese Laid-Open Patent Applications No.5-183760 and No.7-264417 propose systems which prevent the amount of data from increasing when compressed, by comparing the sizes of the coded data and the original data for every line, and storing the original data in a memory if the size of the coded data exceeds the size of the original data.

Furthermore, Japanese Laid-Open Patent Applications No.9-248943 and No.10-117289 propose systems which prevent the amount of data from increasing when compressed, by comparing the size of the coded data and the original data for every block instead of every line, and storing the original data in the memory if the size of the coded data exceeds the size of the original data.

But the systems described above require a line memory for storing the original data and the compressed data in units of lines or, a block memory for storing the original data and the compressed data in units of blocks, thereby increasing the cost for the required memory. Moreover, the image data compression must be made by sectioning the image data in units of lines or blocks. Consequently, even the image data of a blank which extends for several lines is compressed to the coded data which is made up of the initial data and the length of the data, for every line, for example, to thereby deteriorate the compression rate.

SUMMARY OF THE INVENTION

Accordingly, it is a general object of the present invention to provide a novel and useful image compression apparatus, image expansion apparatus, image forming apparatus, image compression method, image expansion method and storage medium, in which the problems described above are eliminated.

Another and more specific object of the present invention is to provide an image compression apparatus and method which can carry out an efficient image data compression by avoiding increase of the amount of data and avoiding deterioration of the compression rate, without requiring surplus line memory or block memory.

Still another and more specific object of the present invention is to provide an image expansion method and apparatus which can efficiently expand the coded data obtained by the image compression method and apparatus.

A further and more specific object of the present invention is to provide an image forming apparatus, such as a printer and a digital copying machine, which can reduce the memory capacity required for the image data compression and expansion processes and reduce the memory capacity required to store the coded data of the image data.

Another and more specific object of the present invention is to provide a computer-readable storage medium which stores a program for causing a computer to carry out the image compression method and/or the image expansion method described above.

Still another object of the present invention is to provide an image compression apparatus for compressing image data by carrying out a parallel processing for every image pattern made up of a plurality of bits, comprising first processing means for obtaining a run length of the image data and a repetition number of the run length; second processing means for coding the run length and the repetition number obtained by the first processing means; and third processing means for predicting whether or not a code length of a code generated by a word which is to be coded by the second processing means exceeds a predetermined threshold value, based on the run length and the repetition number obtained by the first processing means, where the second processing means carries out a pass coding to output the image pattern as it is when the third processing means predicts that the code length exceeds the predetermined threshold value. According to the image compression apparatus of the present invention, it is possible to positively avoid the amount of data from increasing due to the coding, by judging the increase of the amount of data for every word which is to be coded, and by carrying out a pass coding if the coding would increase the amount of data. In addition, no surplus line memory or block memory is required as in the prior art. Furthermore, since the image data compression is not made by sectioning into lines or blocks, it is possible to realize a high compression rate. The image data compression can also be made at a high speed without considerably increasing the frequency of the operation clock by carrying out a parallel processing.

The first processing means may include means for obtaining a number of closed run lengths equal to the number of bits processed by the parallel processing for every image pattern and a run length carried over to a next image pattern; and means for cumulatively adding the run length which is carried over until the run length closes. In this case, it is possible to obtain the run length and repetition number exceeding the number of bits of the parallel processing, thereby enabling efficient coding of a long run length and further improved compression rate.

The third processing means may includes means for obtaining a code length of the code generated by the word which is to be coded by the second processing means based on the run length and the repetition number obtained by the first processing means; and means for comparing the obtained code length and the predetermined threshold value.

The third processing means may include means for obtaining a code length of the code generated by the word which is to be coded by the second processing means based on the run length and the repetition number obtained by the first processing means; correcting means for correcting the obtained code length so as to include halfway run lengths and halfway repetition numbers which are not closed in the word which is to be coded; and means for comparing the corrected code length and the predetermined threshold value. Further, the image compression apparatus may further comprise fourth processing means for judging whether or not a pass coding is carried out in a word which is next to the word which is to be processed by the second processing means, based on the run length and the repetition number obtained by the first processing means, and outputting a judgement result, where the judgement result of the fourth processing means controls a correction amount of the code length by the correcting means included in the second processing means. In these cases, it is possible to avoid deterioration of the compression rate which would otherwise occur due to unnecessary pass coding.

A further object of the present invention is to provide an image expansion apparatus for restoring an image data by a parallel processing based on coded data including a code of a run length, a code of a repetition number and a pass code, comprising first processing means for analyzing the coded data and outputting output information which includes the run length, the repetition number and the pass code; second processing means for generating a run length based on the output information of the first processing means; and third processing means for generating image data made up of a plurality of bits, based on the run length generated by the second processing means and the pass code obtained by the first processing means. According to the image expansion apparatus of the present invention, it is possible to restore at a high speed the image data which has been compressed as described above.

Another object of the present invention is to provide an image forming apparatus comprising an image compression apparatus; storage means for storing coded data compressed and output by the image compression apparatus; an image expansion apparatus; and image forming means for forming the image data expanded by the image expansion apparatus on a recording medium, where the image compression apparatus compresses image data by carrying out a parallel processing for every image pattern made up of a plurality of bits, and comprises first means for obtaining a run length of the image data and a repetition number of the run length; second means for coding the run length and the repetition number obtained by the first means; and third means for predicting whether or not a code length of a code generated by a word which is to be coded by the second means exceeds a predetermined threshold value, based on the run length and the repetition number obtained by the first means, and the second means carries out a pass coding to output the image pattern as it is when the third means predicts that the code length exceeds the predetermined threshold value, and the image expansion apparatus restores the image data by a parallel processing based on the coded data including a code of a run length, a code of a repetition number and a pass code, and comprises fourth means for analyzing the coded data and outputting output information which includes the run length, the repetition number and the pass code; fifth means for generating a run length based on the output information of the first means; and sixth means for generating image data made up of a plurality of bits, based on the run length generated by the fifth means and the pass code obtained by the fourth means. According to the image forming apparatus of the present invention, it is unnecessary to provide surplus line memory or block memory for the image data compression and expansion as in the case of the prior art. An increase of the amount of data by the compression is avoided, so as to realize a high compression rate. As a result, it is also possible to reduce the memory capacity required to store the coded data. Therefore, the required total memory capacity can be reduced, and a high-speed image data compression and expansion becomes possible.

Still another object of the present invention is to provide an image compression method for compressing image data by carrying out a parallel processing for every image pattern made up of a plurality of bits, comprising a first processing step obtaining a run length of the image data and a repetition number of the run length; a second processing step coding the run length and the repetition number obtained by the first processing step; and a third processing step predicting whether or not a code length of a code generated by a word which is to be coded by the second processing step exceeds a predetermined threshold value, based on the run length and the repetition number obtained by the first processing step, where the second processing step carries out a pass coding to output the image pattern as it is when the third processing step predicts that the code length exceeds the predetermined threshold value. According to the image compression method of the present invention, it is possible to positively avoid the amount of data from increasing due to the coding, by judging the increase of the amount of data for every word which is to be coded, and by carrying out a pass coding if the coding would increase the amount of data. In addition, no surplus line memory or block memory is required as in the prior art. Furthermore, since the image data compression is not made by sectioning into lines or blocks, it is possible to realize a high compression rate. The image data compression can also be made at a high speed without considerably increasing the frequency of the operation clock by carrying out a parallel processing.

A further object of the present invention is to provide an image expansion method for restoring an image data by a parallel processing based on coded data including a code of a run length, a code of a repetition number and a pass code, comprising a first processing step analyzing the coded data and outputting output information which includes the run length, the repetition number and the pass code; a second processing step generating a run length based on the output information of the first processing step; and a third processing step generating image data made up of a plurality of bits, based on the run length generated by the second processing step and the pass code obtained by the first processing step. According to the image expansion method of the present invention, it is possible to restore at a high speed the image data which has been compressed as described above.

Another object of the present invention is to provide a computer-readable storage medium which stores a program for causing a computer to execute an image compression process which compresses image data by carrying out a parallel processing for every image pattern made up of a plurality of bits, where the program comprises a first processing procedure which causes the computer to obtain a run length of the image data and a repetition number of the run length; a second processing which causes the computer to code the run length and the repetition number obtained by the first processing procedure; and a third processing procedure which causes the computer to predict whether or not a code length of a code generated by a word which is to be coded by the second processing procedure exceeds a predetermined threshold value, based on the run length and the repetition number obtained by the first processing procedure, and the second processing procedure causes the computer to carry out a pass coding to output the image pattern as it is when the third processing procedure predicts that the code length exceeds the predetermined threshold value. According to the computer-readable storage medium of the present invention, it is possible to positively avoid the amount of data from increasing due to the coding, by judging the increase of the amount of data for every word which is to be coded, and by carrying out a pass coding if the coding would increase the amount of data. In addition, no surplus line memory or block memory is required as in the prior art. Furthermore, since the image data compression is not made by sectioning into lines or blocks, it is possible to realize a high compression rate. The image data compression can also be made at a high speed without considerably increasing the frequency of the operation clock by carrying out a parallel processing.

Still another object of the present invention is to provide a computer-readable storage medium which stores a program for causing a computer to execute an image expansion process which restores an image data by a parallel processing based on coded data including a code of a run length, a code of a repetition number and a pass code, where the program comprises a first processing procedure which causes the computer to analyze the coded data and outputting output information which includes the run length, the repetition number and the pass code; a second processing procedure which causes the computer to generate a run length based on the output information of the first processing procedure; and a third processing procedure which causes the computer to generate image data made up of a plurality of bits, based on the run length generated by the second processing procedure and the pass code obtained by the first processing procedure. According to the computer-readable storage medium of the present invention, it is possible to restore at a high speed the image data which has been compressed as described above.

Other objects and further features of the present invention will be apparent from the following detailed description when read in conjunction with the accompanying drawings.

BRIEF DESCRIPTION OF THE DRAWINGS

FIG. 12 is a diagram for explaining particular examples of pass codes;

FIG. 13 is a diagram for explaining particular examples of the pass codes;

FIG. 51 is a flow chart for explaining the process of the run length generating unit;

FIG. 52 is a flow chart for explaining the process of the run length generating unit;

FIG. 53 is a flow chart for explaining the process of the run length generating unit;

FIG. 67 is a diagram showing repetition patterns; and FIG. 68 is a diagram showing repetition patterns.

DESCRIPTION OF THE PREFERRED EMBODIMENTS

Figure 1:
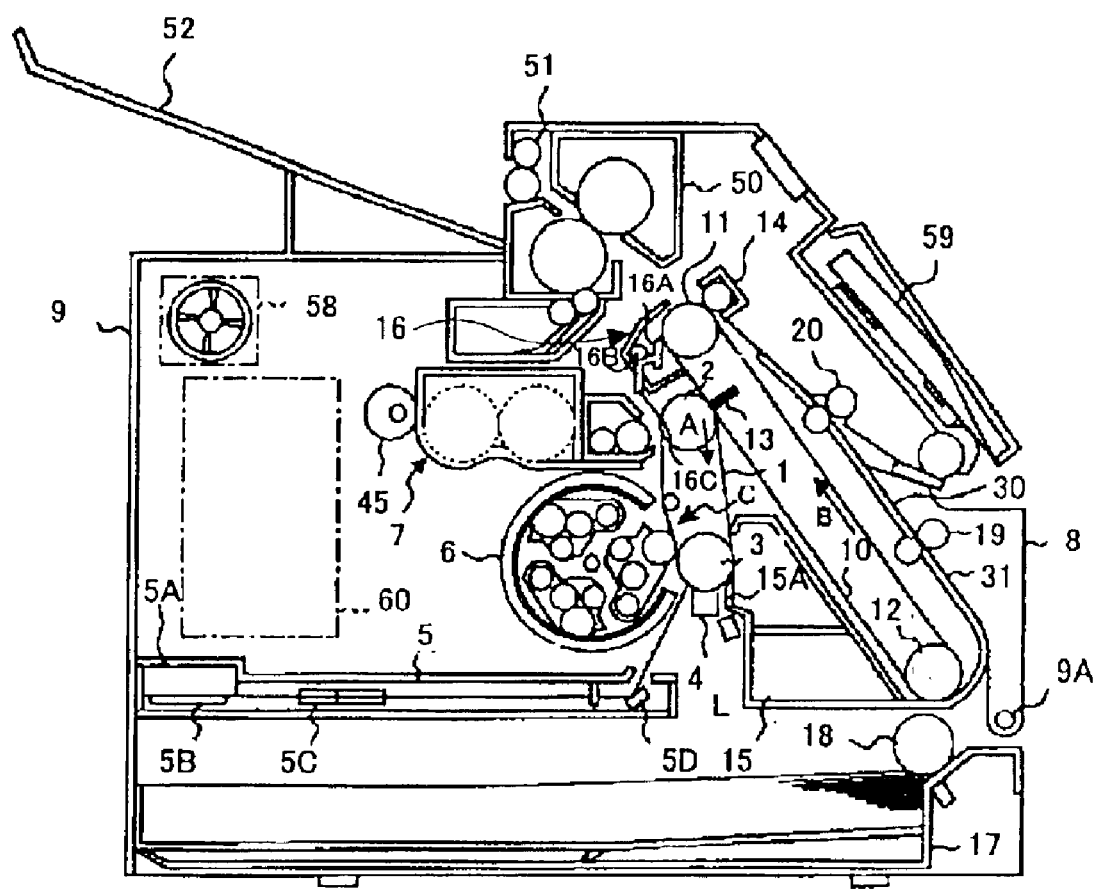
FIG. 1 is a cross sectional view showing a general structure of an embodiment of an image forming apparatus according to the present invention.

FIG. 1 is a cross sectional view showing a general structure of an embodiment of an image forming apparatus according to the present invention. In this embodiment, the present invention is applied to a multi-color image forming apparatus.

The multi-color image forming apparatus shown in FIG. 1 includes a belt-shaped photoconductive body 1 which functions as an image bearing member, and this photoconductive body 1 is movably supported by rotary rollers 2 and 3. The photoconductive body 1 is driven by the rotary rollers 2 and 3 to move and revolve in a direction A. A charging unit 4, a discharge lamp L, and a cleaning blade 15A are arranged in the outer periphery of the photoconductive body 1. An optical write section which is irradiated by a laser beam emitted from a laser write unit 5 is arranged on a downstream side of the charging unit 4. The charging unit 4 forms a charging means, and the laser write unit 5 forms an optical write means.

A multi-color developing unit 6 which supports and switches a plurality of developing units (developing means) is arranged on a downstream side of the optical write section. The multi-color developing unit 6 includes a yellow developing unit, a magenta developing unit, and a cyan developing unit with respect to the colors of the toners accommodated therein. A black developing unit 7 which accommodates black toner is arranged above the multi-color developing unit 6.

One of the developing units moves to a developing position in synchronism with a developing timing of the corresponding color. The multi-color developing unit 6 has a function of selecting one of the three developing units by revolving in a circumferential direction for 120 degrees. When one of the three developing units of the multi-color developing unit 6 operates, the black developing unit 7 moves to a position separated from the photoconductive body 1. The black developing unit 7 is moved by rotating a cam 45.

The laser write unit 5 successively generates a laser beam depending on image forming signals (write information) of a plurality of colors from a laser light source (not shown). This laser beam is periodically deflected by a polygon mirror 5B which is rotated by a polygon motor 5A, and scans a surface of the charged photoconductive body 1 via a fθ lens 5C, a mirror 5D and the like, so as to form an electrostatic latent image on the surface of the photoconductive body 1.

The electrostatic latent image formed on the surface of the photoconductive body 1 is developed by the toner from the corresponding developing unit, to thereby form and hold a toner image. An intermediate transfer belt 10 is arranged adjacent to the photoconductive body 1, and is movably supported by rotary rollers 11 and 12 to revolve in a direction B. The toner image on the photoconductive body 1 is transferred to a front side of the intermediate transfer belt 10 by a transfer brush (first transfer means) 13 on a back side of the intermediate transfer belt 10.

The surface of the photoconductive body 1 is cleaned by the cleaning blade 15A for every one color, and a toner image of a predetermined color is formed. Every time the intermediate transfer belt 10 makes one revolution, the toner image on the photoconductive body 1 is transferred onto the same position on the surface of the intermediate transfer belt 10, and the toner images of a plurality of colors are overlapped and held on the intermediate transfer belt 10. Thereafter, the overlapping toner images are transferred onto a recording medium such as paper and plastic sheet.

When transferring the overlapping toner images onto the paper, the paper accommodated within a paper supply unit (paper supply cassette) 17 is supplied by a paper supply roller 18 and is transported by a transport roller 19. The transported paper is once stopped in a state pushed against a resist roller pair 20, and is thereafter transported again between the intermediate transfer belt 10 and a transfer roller (second transfer means) 14 at a timing which ensures a correct transfer position of the toner images. The overlapping toner images of the plurality of colors on the intermediate transfer belt 10 are simultaneously transferred onto the paper by the transfer roller 14, and are thereafter fixed by a fixing unit 50. The paper bearing the fixed toner image is ejected via a paper eject roller pair 51 onto a paper eject stacker 52 provided in an upper portion of a main frame 9.

A cleaning unit 16 for the intermediate transfer belt 10 is provided at a position corresponding to the rotary roller 11. The cleaning unit 16 includes a cleaning blade 16A which is provided on an engaging/disengaging arm 16C, and is free to engage and disengage the intermediate transfer belt 10. The cleaning blade 16A disengages from the intermediate transfer belt 10 during a process in which the toner image is received from the photoconductive body 1, and engages the intermediate transfer belt 10 after the toner image is transferred from the intermediate transfer belt 10 onto the paper so as to remove residual toner on the intermediate transfer belt 10 after the toner image is transferred onto the paper.

The residual toner removed by the cleaning blade 15A for the photoconductive body 1 and the cleaning blade 16A for the intermediate transfer belt 10 is collected by a recovery container 15. This recovery container 15 is appropriately replaced. An auger 16B provided within the cleaning unit 16 transports the residual toner removed by the cleaning blade 16A to the recovery container 15 by a transport means (not shown).

The photoconductive body 1, the charging unit 4, the intermediate transfer belt 10, the cleaning unit 16, a transport guide 30 which forms a paper transport path, and the like are integrally assembled within a process cartridge 31 which forms a unit. This process cartridge 31 can be replaced when a service life thereof ends. The multi-color developing unit 6, the black developing unit 7 and the like are also replaced when the service lives thereof end, similarly to the process cartridge 31. In order to facilitate replacement of such parts or units and to also facilitate removal of paper jam, a front frame 8 which forms a part of the main frame 9 can open and close about an axis 9A.

A control unit 60 is also accommodated within the multi-color image forming apparatus. A fan 58 is provided above the control unit 60 to forcibly exhaust air within the multi-color image forming apparatus in order to prevent an internal temperature from rising excessively. In addition, a paper supply unit 59 which has a relatively small scale and is separate from the paper supply unit (paper supply cassette) 17 is provided above the process cartridge 31. In this embodiment, the intermediate transfer belt 10 is used as an intermediate transfer body, but it is of course possible to use other intermediate transfer bodies such as an intermediate transfer drum.

[Control Unit 60]

Figure 2:
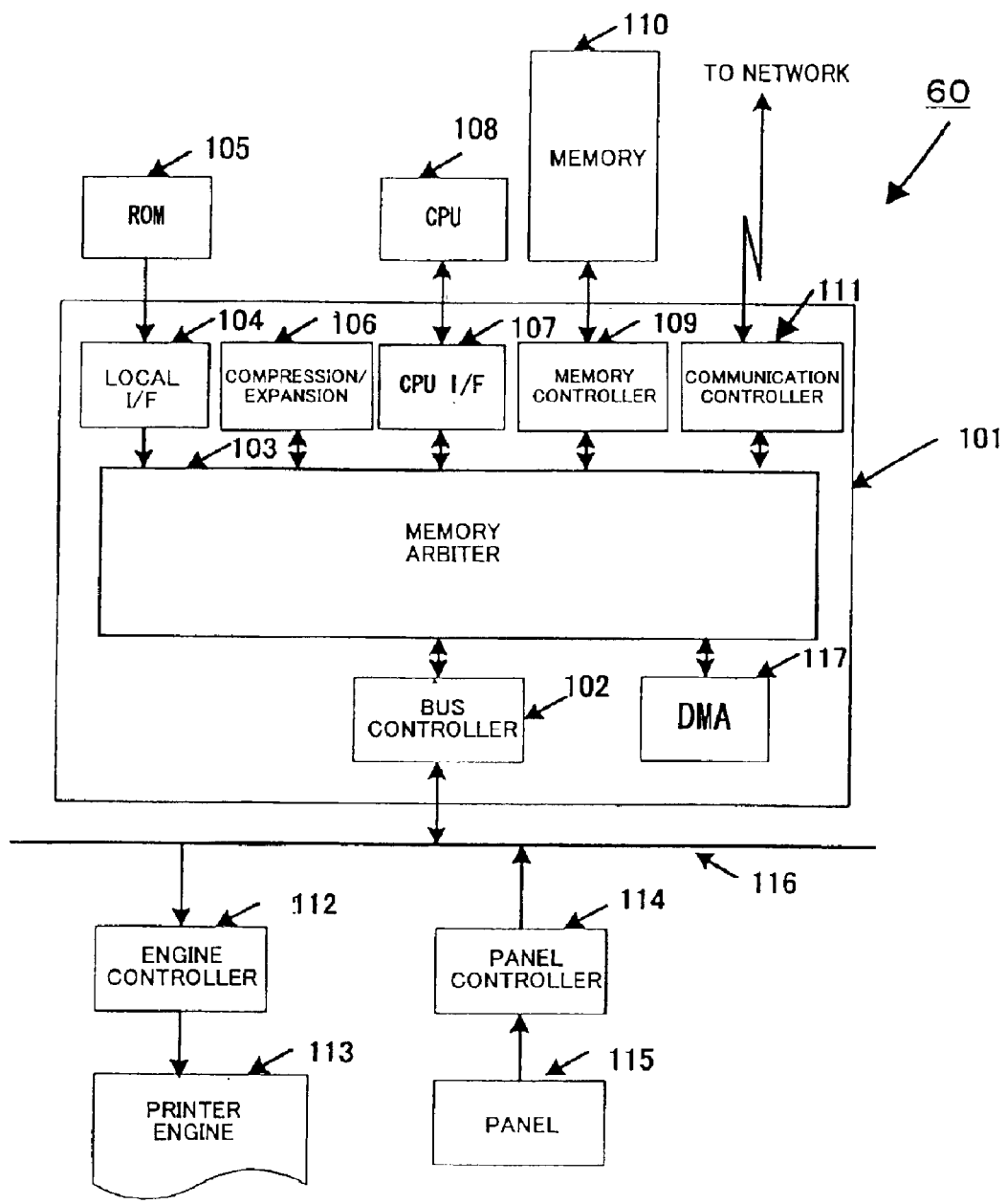
FIG. 2 is a system block diagram showing a structure of a control unit.

A description will be given of the control unit 60 of the multi-color image forming apparatus. FIG. 2 is a system block diagram showing a structure of the control unit 60.

In FIG. 2, a memory accelerator 101 mainly operates a memory 110. This memory accelerator 101 receives image data from a host computer (not shown) via a network under control of a CPU 108, and carries out processes such as coding, and transfers processed data to the memory 110. The memory accelerator 101 also carries out processes such as transferring the read image data to a printer engine controller 112 to print the image data by a printer engine 113. When carrying out the above described processes, the memory accelerator 101 communicates with each host computer, controls the memory 110, inputs information from a panel 115, and carries out a bus control with a peripheral equipment such as the printer engine controller 112. The memory 110 is used to store the image data, coded data of the image data, programs of the CPU 108, and the like.

The memory accelerator 101 includes a bus controller 114 which is connected to a bus 116, the printer engine controller 112, a bus controller 102 which carries out bus arbitration with each controller of other peripheral equipments (not shown), a memory arbiter 103 which carries out arbitration with the memory 110 and various internal controllers, a local interface (I/F) 104 for elements such as a ROM 105 which stores various programs and font information of characters and the like, a CPU interface 107 for the CPU 108, a memory controller 110 which carries out access control of the memory 110, a communication controller 111 which controls communication via the network, an image compression and expansion (hereinafter simply referred to as compression/expansion) apparatus 106 for compressing image data read from the memory 110 or the like and expanding coded data read from the memory 110 or the like, and a direct memory access controller (DMAC) 117 which controls a direct memory access (DMA) among each of the controllers connected to the memory arbiter 103. The image compression/expansion apparatus 106 corresponds to an embodiment of the image compression apparatus according to the present invention and an embodiment of the image expansion apparatus according to the present invention. The panel 115 is used by the user to input operation instructions and the like with respect to the multi-color image forming apparatus.

The compression/expansion apparatus 106 is formed by a composite apparatus which is made up of an image compression apparatus 106e for carrying out a compression process, and an image expansion apparatus 106d for carrying out an expansion process. It is not necessary for the hardware of the image compression apparatus 106e to be completely independent of the hardware of the image expansion apparatus 106d, and a portion of the hardware may of course be used in common for the compression process and the expansion process.

[Image Compression Apparatus 106e]

A description will be given of an embodiment of the image compression apparatus 106e according to the present invention. Prior to describing the structure of the image compression apparatus 106e, a description will first be given of a code format and coded examples.

Figure 11:
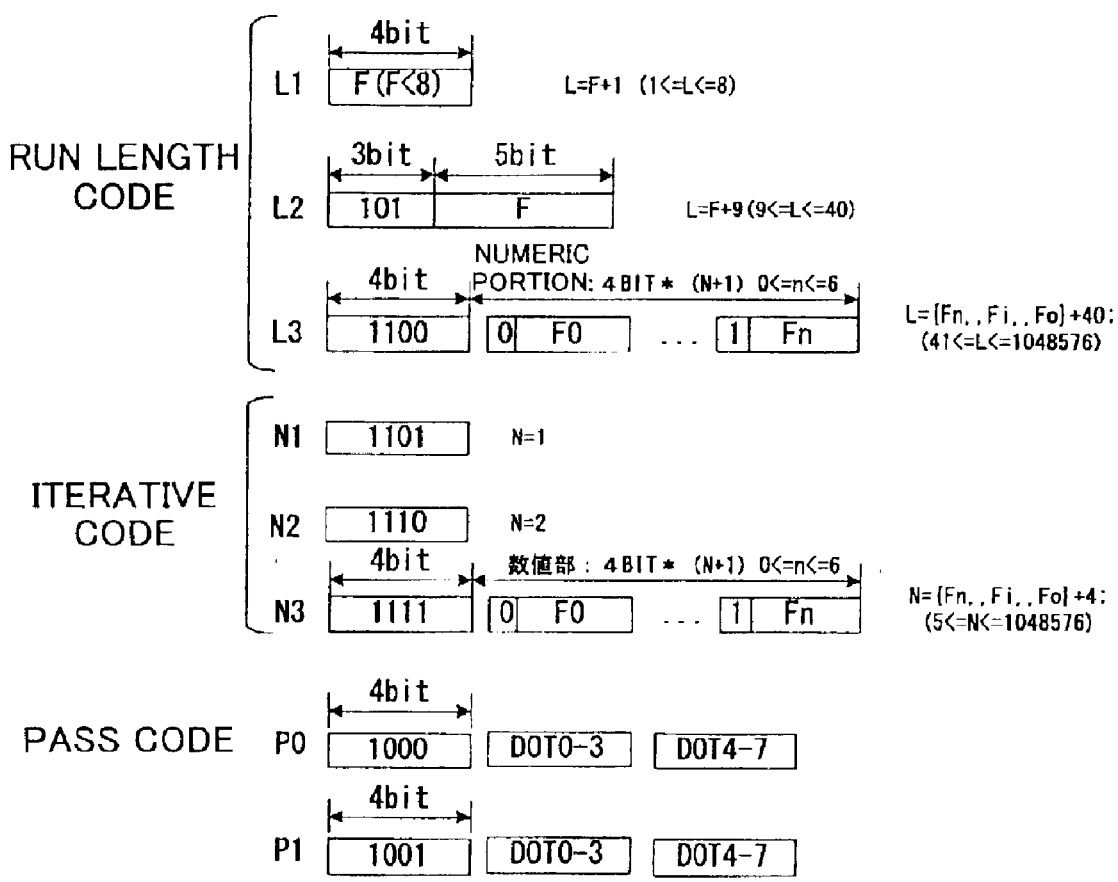
FIG. 11 is a diagram for explaining code formats.

In this embodiment, a code that is output has a format for every four bits as shown in FIG. 11. Of course, the format of the code is not limited to such, and the format may be for every predetermined number of bits. FIG. 11 shows nine kinds of code formats. L0 through L3 are run length codes indicating a run length. N1 through N3 are iterative codes indicating a repetition number. P0 and P1 are pass codes. In the present invention, in order to suppress the increase of the amount of code under a worst compressing condition, a pass coding is carried out and a pass code is generated in place of a run length code or an iterative code when the amount of codes exceeds a predetermined threshold value for a word which is to be coded.

The run length code L1 has a 4-bit width to indicate a run length from 1 to 8. However, a numerical value of the run length code L1 is 1 less than the run length indicated thereby. The run length code L2 has a 8-bit width to indicate the run length from 9 to 40. However, a numerical value of the run length code L1 is 9 less than the run length indicated thereby. The run length code L3 has a 4m-bit width, where m is an integer greater than or equal to 2. A numerical value of the run length code L3 indicated by concatenation of F0 through Fn is 40 less than the run length indicated thereby.

The iterative code N1 has a 4-bit width to indicate a repetition number 1. The iterative code N2 has a 4-bit width to indicate a repetition number 2. The iterative code N3 has a 2n-bit width, where n is an integer greater than or equal to 2. A numerical value of the iterative code N3 indicated by concatenation of F0 through Fn is 4 less than the repetition number indicated thereby. A repetition number 3 is coded by a combination of the iterative codes N1 and N2, and the amount of the codes is the same as a minimum amount of the codes for the iterative code N3.

The pass codes P0 and P1 have a 12-bit width, and upper 4 bits (LEFT) of an 8-bit image data are stored in $5^{th}$ through $8^{th}$ bits, and lower 4 bits (RIGHT) of the 8-bit image data are stored in the $9^{th}$ through $12^{th}$ bits.

Particular examples of the pass codes will be described with reference to FIGS. 12 and 13. In the present invention, the run length and the repetition number are coded, but in order to prevent the increase of the amount of codes, the pass code is generated when the amount of codes (code length) for each word exceeds a predetermined threshold value (pass coding threshold value). In this particular case, the pass coding threshold value is set to 1.5 times the 8-bit data.

In Example 1 shown in FIG. 12, the amount of codes of the $4^{th}$ word is 6. This is because, one code is 4 bits and 6×4=24 bits is three times the amount of the 8-bit data, and the pass coding takes place as shown in the lower row, to suppress the amount of codes to 3.

In Example 2 shown in FIG. 12, the word to be subjected to the pass coding spans the run length. In this Example 2, the amount of codes of the $4^{th}$ word is 5. This is because, one code is 4 bits and 5×4=20 bits is 2.5 times the amount of the 8-bit data, and the pass coding takes place as shown in the lower row. In this case, the previous run length is cut by the pass code, and a new run length "3" is generated by the previous word.

In Example 3 shown in FIG. 13, the word to be subjected to the pass coding is repeatedly spans the run length. In this Example 3, the amount of codes of the $4^{th}$ word is 4. This is because, one code is 4 bits and 4×4=16 bits is 2.0 times the amount of the 8-bit data, and the pass coding takes place as shown in the lower row. In this case, the previous repetition is cut by the pass code, and a new repetition number "5" is generated by the previous word.

In Example 4 shown in FIG. 13, a repetition is generated by the word to be subjected to the pass coding. In this Example 4, the amount of codes of the $4^{th}$ word is 5. This is because, one code is 4 bits and 5×4=20 bits is 2.5 times the amount of the 8-bit data, and the pass coding takes place as shown in the lower row. In this case, the previous run length is cut by the pass code, and a new repetition number "5" is generated by the previous word.

Figure 3:
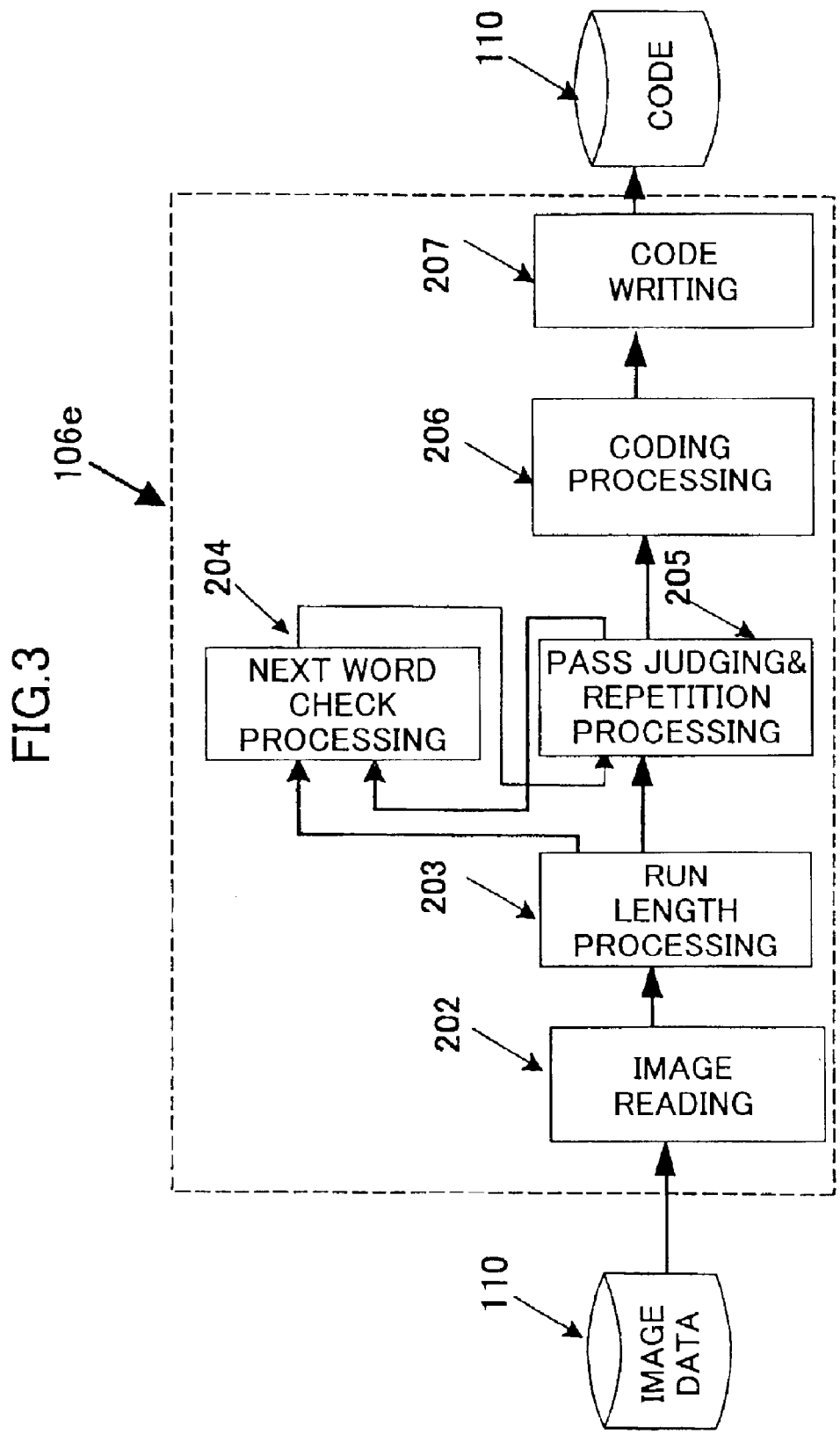
FIG. 3 is a system block diagram showing an entire structure of an image compression apparatus.

FIG. 3 is a system block diagram showing an entire structure of the image compression apparatus 106e. In FIG. 3, an image reading unit 202 reads from the memory 110 image data (binary image data) in units of bits which are processed in parallel. In this embodiment, the image compression apparatus 106e carries out the parallel process in units of 8 bits, and the image reading unit 202 reads the image data in units of 8 bits. In this specification, the 8-bit image data will b referred to as an image pattern or, simply, pattern. When treating color image data, the image data is processed independently for each color.

A run length processing unit 203 converts the image data read by the image reading unit 202 into a run length, that is, a 0-value run length or a 1-value run length.

A next word check processing unit 204 obtains conditions such as a code length of a next word and whether or not all are repetitions, so as to obtain a relaxation signal for use in judging the pass coding of the present word A pass judging and repetition processing unit 205 calculates a repetition of the run length transferred from the run length processing unit 203, obtains a code length from the obtained run length and the repetition number, so as to carry out a pass coding judgement based on a comparison of the code length and the pass coding threshold value. The pass judging and repetition processing unit 205 receives the relaxation signal from the next word check processing unit 204, and reflects the relaxation signal to the pass coding judgement. The judging and repetition processing unit 205 transfers a judgement result of the pass coding judgement, the actual data, and the obtained run lengths and repetition number to a coding processing unit 206. The coding processing unit 206 codes the run length and the repetition number transferred from the pass judging and repetition processing unit 205. A code writing unit 207 writes coded data output from the coding processing unit 206 into the memory 110.

Next, a description will be given of each of the constituent elements forming the image compression apparatus 106e, by assuming that 8 bits are processed in parallel.

[Image Reading Unit 202 of Image Compression Apparatus 106e]

Figure 4:
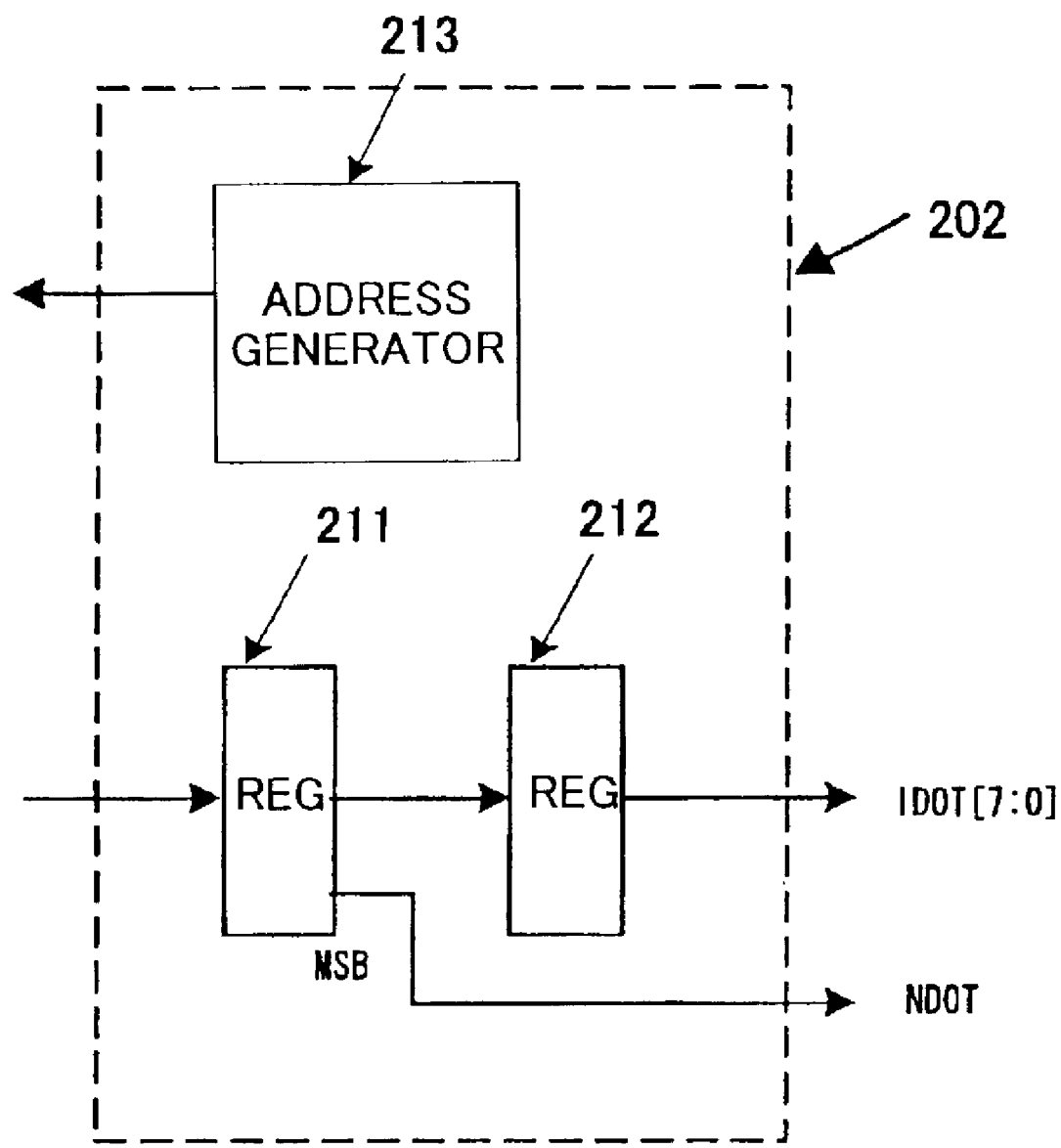
FIG. 4 is a system block diagram showing a structure of an image reading unit.

FIG. 4 is a system block diagram showing a structure of the image reading unit 202. The image reading unit 202 shown in FIG. 4 includes registers 211 and 212, and an address generator 213. The register 211 stores the 8-bit image data read from the memory 110. The register 212 is connected to the register 211 by a pipeline connection. The register 212 stores the data which is to be processed at the present, and data IDOT[7:0] from the register 212 is input to the run length processing unit 203. The register 211 stores the data which is to be processed next, and a most significant bit (MSB) of data NDOT (first bit of the next data) is input to the run length processing unit 203. The address generator 213 generates a read address of the memory 110.

[Run Length Processing Unit 203 of Image Compression Apparatus 106e]

Figure 5:
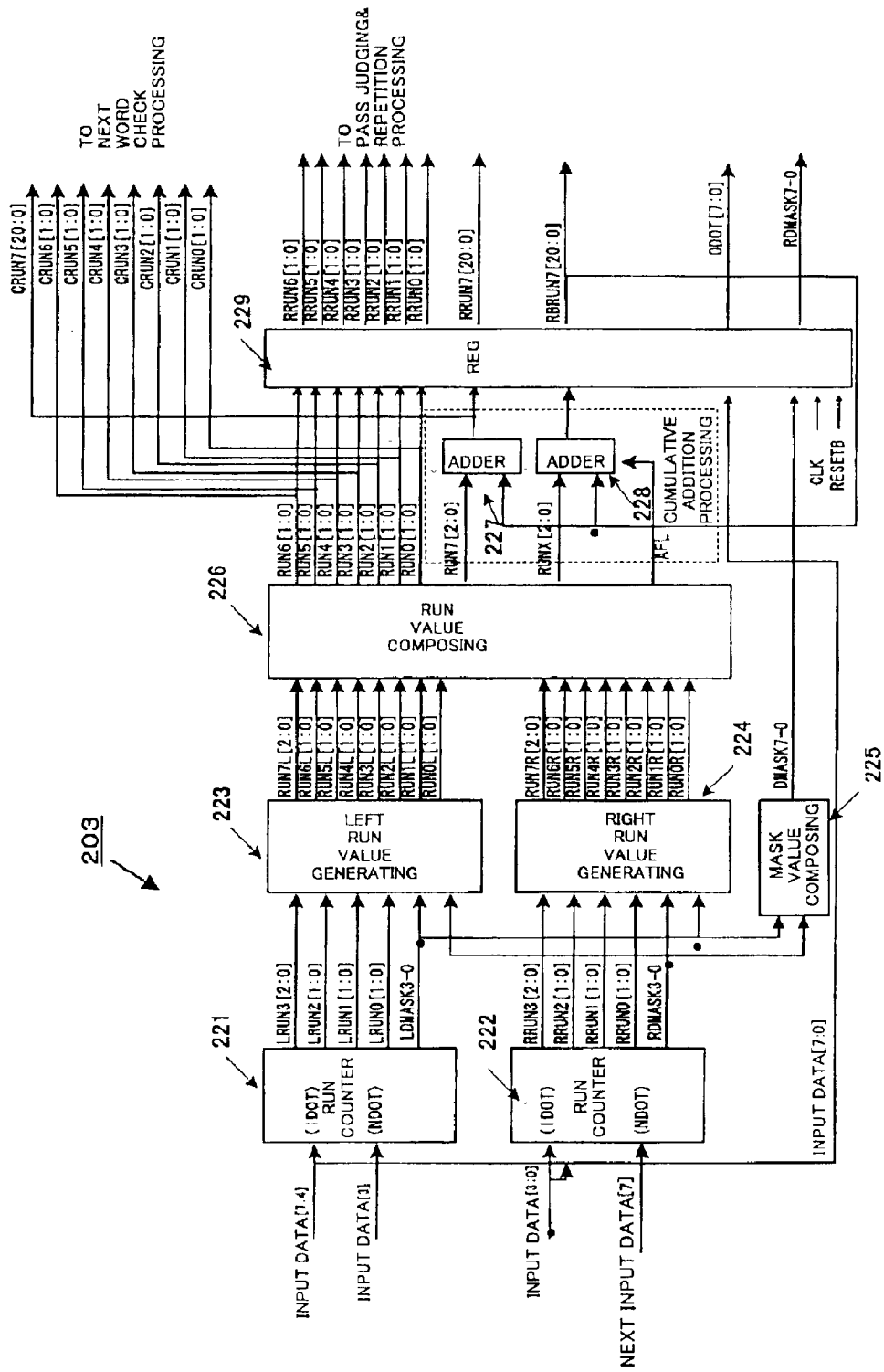
FIG. 5 is a system block diagram showing a structure of a run length processing unit.

FIG. 5 is a system block diagram showing a structure of the run length processing unit 203. The run length processing unit 203 includes run counters 221 and 222, LEFT run value generating unit 223, a RIGHT run value generating unit 224, a mask value combining unit 225, a run value combining unit 226, adders 227 and 228, and a register 229.

Based on the 8-bit image pattern (IDOT) and the first bit (NDOT) of the next pattern which are input from the image reading unit 202, a plurality of run lengths, mask values indicating whether or not the run lengths are valid (whether or not the run lengths are closed), and a next carrying-over run length are obtained by the two run counters 221 and 222, for each of the upper 4 bits (IDOT[7:4]) and the lower 4 bits (IDOT[3:0]) of IDOT. The obtained run lengths are corrected by the LEFT run value generating unit 223 and the RIGHT run value generating unit 224 into 8 run length positions in 8 bits, and the run lengths at the same position are added to obtain a set of 8 run lengths by the run value combining unit 226. Furthermore, a cumulative addition processing unit formed by the adders 227 and 228 adds the run lengths carried over up to the present to a first run length (RUN7) of the processing target pattern (IDOT) or, judges whether or not to continue carrying over, so as to generate closed run lengths and mask values.

The run counter 221 receives the upper 4 bits (IDOT) and the first bit (NDOT) of the lower 4 bits of the 8-bit image pattern which is the present processing target, and outputs a maximum of 4 run lengths (LRUN3 through LRUN0) and mask values (LDMASK3 through LDMASK0) which are flags indicating whether each run length is valid (closed) or invalid. In addition, although omitted in FIG. 5, the run counter 221 also generates a run length (LRUNX) to be carried over next, and a flag (LAFL) which takes a value 1 when all of the upper 4 bits (IDOT) are 0 or 1 and the first bit (NDOT) of the lower 4 bits has the same value as the upper 4 bits.

The run counter 222 receives the lower 4 bits (IDOT) of the 8-bit image pattern which is the present processing target and the uppermost 1 bit (NDOT) of the next image pattern, and outputs a maximum of 4 run lengths (RRUN3 through RRUN0) and mask values (RDMASK3 through RDMASK0) which are flags indicating whether each run length is valid invalid. In addition, although omitted in FIG. 5, the run counter 222 also generates a run length (RRUNX) to be carried over next, and a flag (RAFL) which takes a value 1 when all of the lower 4 bits (IDOT) are 0 or 1 and the first bit (NDOT) of the lower 4 bits has the same value as the upper 4 bits.

Figure 15:
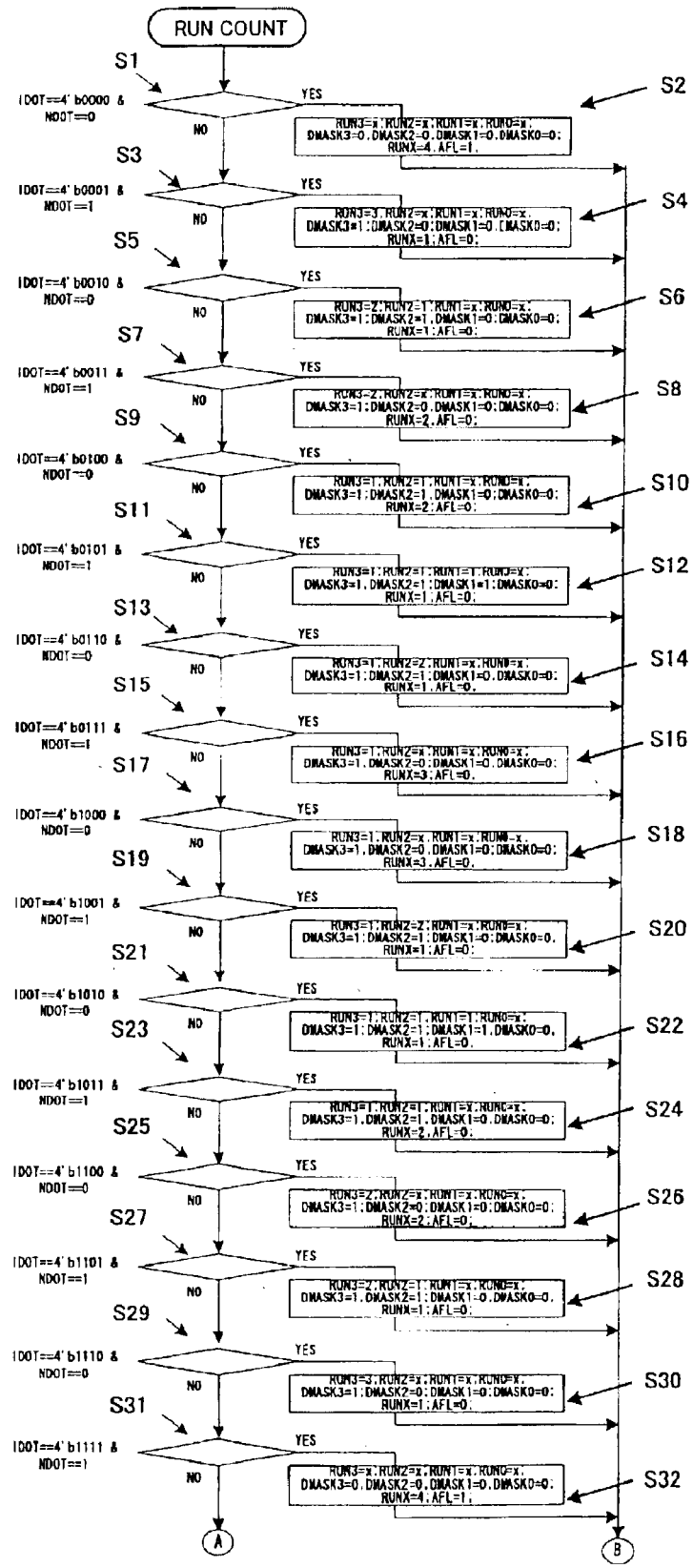
FIG. 15 is a flow chart for explaining processes of run counters.
Figure 16:
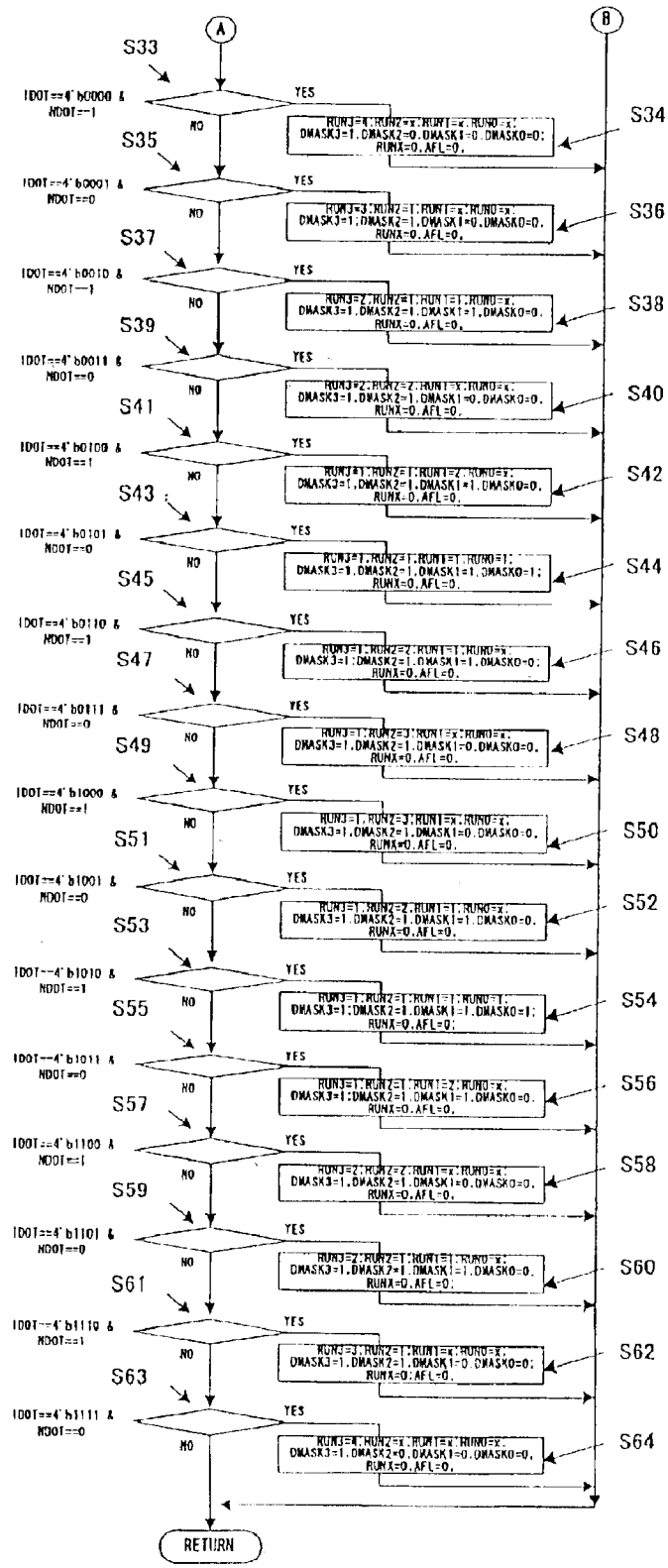
FIG. 16 is a flow chart for explaining the processes of the run counters.

FIGS. 15 and 16 are flow charts for explaining processes of the run counters 221 and 222. Since the processes are common to the run counters 221 and 222, the run lengths and the flags are shown in FIGS. 15 and 16 with the leading characters "L" and "R" omitted.

Each of the run counters 221 and 222 judges whether the 4 bits of IDOT are "0000" and the 1 bit of NDOT is "0" in a step S1. If the judgement result in the step S1 is YES, each of the run counters 221 and 222 outputs run lengths RUN3, . . . , RUN0=x (x indicates that a code is not output), mask values DMASK3, . . . , DMASK0=0 (invalid), a flag AFL=1, and a carrying-over run length RUNX=4 in a step S2, and the process with respect to the present 4 bits ends (process advances to "return").

On the other hand, if the judgement result in the step S1 is NO, a step S3 judges whether or not the 4 bits of IDOT are "0001" and the 1 bit of NDOT is "1". If the judgement result in the step S3 is YES, a step S4 sets run lengths RUN3=3 and RUN2, . . . , RUN0=x, mask values DMASK3=1 and DMASK2, . . . , DMASK0=0, a carrying-over run length RUNX=1, and a flag AFL=0, and the process ends. If the judgement result in the step S3 is NO, the process advances to a step S5.

Each of the steps S5, S7, S9, S11, S13, S15, S17, S19, S21, S23, S25, S27, S29 and S31 shown in FIG. 15 and steps S33, S35, S37, S39, S41, S43, S45, S47, S49, S51, S53, S55, S57, S59, S61 and S63 shown in FIG. 16 judges whether or not a corresponding condition is satisfied, similarly to the steps S1 and S3 shown in FIG. 15, and a corresponding one of steps S6, S8, S10, S12, S14, S16, S18, S20, S22, S24, S26, S28, S30 and S32 shown in FIG. 15 and steps S34, S36, S38, S40, S42, S44, S46, S48, S50, S52, S54, S56, S58, S60, S62 and S64 shown in FIG. 16 is carried out depending on the satisfied condition. Of course, the order in which the conditions are judged is not limited to the order shown in FIGS. 15 and 16.

Returning now to the description of FIG. 5, the LEFT run value generating unit 223 receives the run lengths LRUN3 through LRUN0, the mask values LDMASK3 through LDMASK0, the carrying-over run length LRUNX (not shown) and the flag LAFL (not shown) from the run counter 221, and the mask values RDMASK3 through RDMASK0 and the flag RAFL (not shown) from the run counter 222, and calculates the position for the case of a maximum of 8 run lengths with an 8-bit length, and obtains and outputs a maximum of 8 run lengths RUN7L through RUN0L and the carrying-over run length RUNLX (not shown).

Similarly, the RIGHT run value generating unit 224 receives the run lengths RRUN3 through RRUN0, the mask values RDMASK3 through RDMASK0, the carrying-over run length RRUNX (not shown) and the flag RAFL (not shown) from the run counter 222, and the mask values LDMASK3 through LDMASK0 and the flag LAFL (not shown) from the run counter 221, and calculates the position for the case of a maximum of 8 run lengths with an 8-bit length, and obtains and outputs a maximum of 8 run lengths RUN7R through RUN0R and the carrying-over run length RUNRX (not shown). In addition, the RIGHT run value generating unit 224 also outputs a flag AFL (not shown) which is "1" when both the flags LAFL and RAFL are "1" and is otherwise "0".

Figure 19:
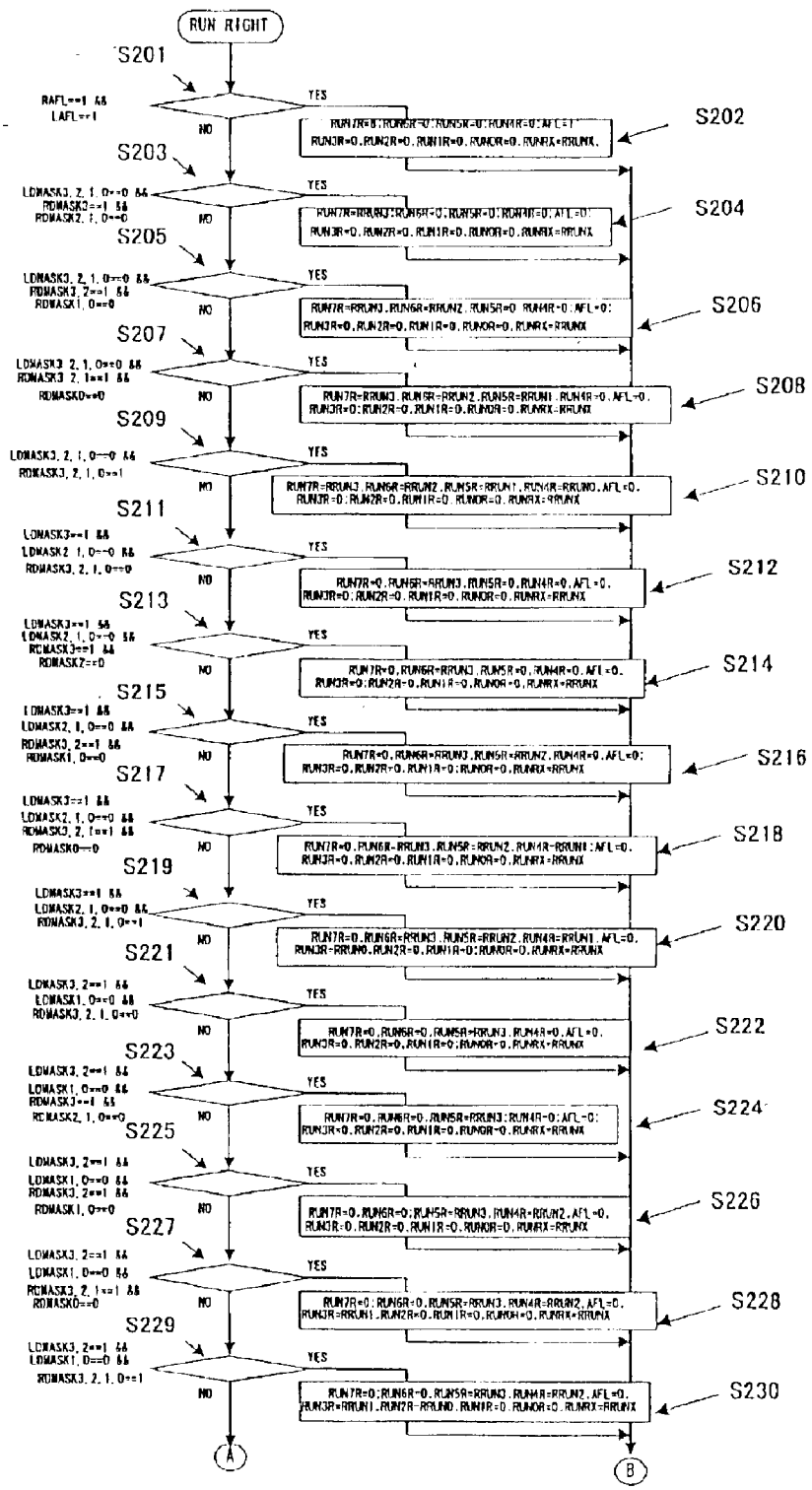
FIG. 19 is a flow chart for explaining a process of a RIGHT run value generating unit.
Figure 20:
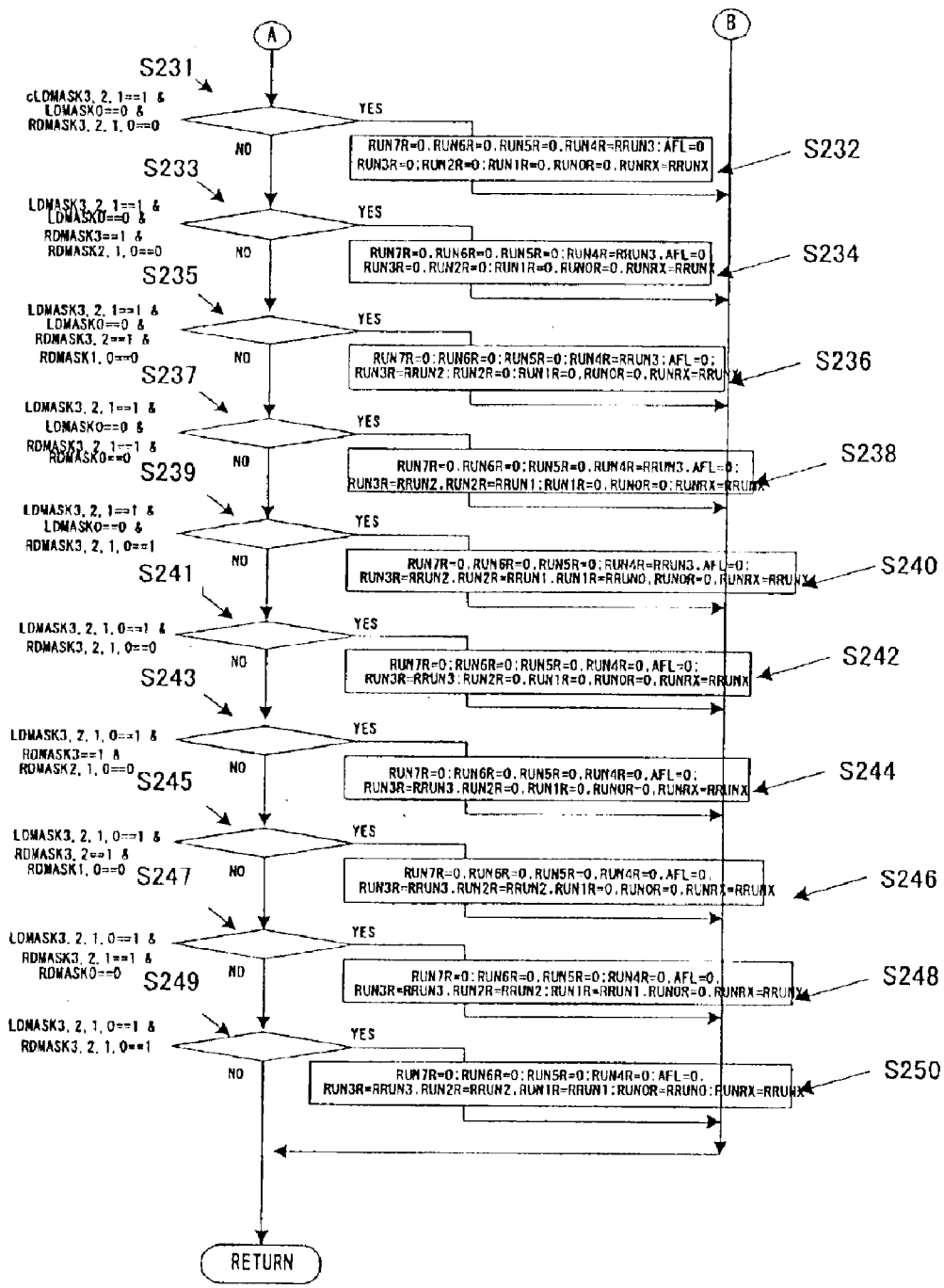
FIG. 20 is a flow chart for explaining the process of the RIGHT run value generating unit.

FIGS. 19 and 20 are flow charts for explaining a process of the RIGHT run value generating unit 224. In FIG. 19, a step S201 judges whether or not both the flags RAFL and LAFL are "1", that is, whether the 8-bit image pattern is made up of all "0"s or all "1"s.

In FIG. 19, if the judgement result in the step S201 is YES, a step S202 outputs run lengths RUN7R=8 and RUN6R, . . . , RUN0R=0, the carrying-over run length RUNRX=RRUNX, and the flag AFL=1, and the processing of the present image pattern ends (process advances to "return"). In other words, since the run length is not terminated, the run length (that is, all 8 bits) are set to RUNRX.

If the judgement result in the step S201 is NO, a step S203 judges whether the mask values are LDMASK3, . . . , LDMASK0=0 and RDMASK3=1 and RDMASK2, . . . , RDMASK0=0 for the run length. In other words, a judgement is made to determine whether no run length exists in the upper 4 bits (LEFT) and 1 run length exists in the lower 4 bits (RIGHT).

If the judgement result in the step S203 is YES, a step S204 outputs run lengths RUN7R=RRUN3 and RUN6R, . . . , RUN0R=0, carrying-over run length RUNRX=RRUNX, and flag AFL=0, and the processing of the present image pattern ends (process advances to "return"). In other words, 1 run length existing in RIGHT is set to RUN7R, and the value of the halfway run length which is not terminated is set to RUNRX.

If the judgement result in the step S203 is NO, a step S205 judges whether the run length does not exist in LEFT and 2 run lengths exist in RIGHT. If the judgement result in the step S205 is YES, a step S206 sets the 2 run lengths, and sets the value of the halfway run length which is not terminated to RUNRX.

If the judgement result in the step S205 is NO, a step S207 judges whether the run length does not exist in LEFT and 3 run lengths exist in RIGHT. If the judgement result in the step S207 is YES, a step S208 sets the 3 run lengths, and sets the value of the halfway run length which is not terminated to RUNRX.

If the judgement result in the step S207 is NO, a step S209 judges whether the run length does not exist in LEFT and 4 run lengths exist in RIGHT. If the judgement result in the step S209 is YES, a step S210 sets the 4 run lengths, and sets the value of the halfway run length which is not terminated to RUNRX.

If the judgement result in the step S209 is NO, a step S211 judges whether 1 run length exists in LEFT and the run length does not exist in RIGHT. If the judgement result in the step S211 is YES, a step S212 sets the 1 run length, and sets the value of the halfway run length which is not terminated to RUNRX.

If the judgement result in the step S211 is NO, a step S213 judges whether 1 run length exists in LEFT and 1 run length exists in RIGHT. If the judgement result in the step S213 is YES, a step S214 sets the 1 run length at an alternate position skipped by one, and sets the value of the halfway run length which is not terminated to RUNRX.

If the judgement result in the step S213 is NO, a step S215 judges whether 1 run length exists in LEFT and 2 run lengths exist in RIGHT. If the judgement result in the step S215 is YES, a step S216 sets the 2 run lengths at an alternate position skipped by one, and sets the value of the halfway run length which is not terminated to RUNRX.

If the judgement result in the step S215 is NO, a step S217 judges whether 1 run length exists in LEFT and 3 run lengths exist in RIGHT. If the judgement result in the step S217 is YES, a step S214 sets the 3 run lengths at an alternate position skipped by one, and sets the value of the halfway run length which is not terminated to RUNRX.

If the judgement result in the step S217 is NO, a step S219 judges whether 1 run length exists in LEFT and 4 run lengths exist in RIGHT. If the judgement result in the step S219 is YES, a step S220 sets the 4 run lengths at an alternate position skipped by one, and sets the value of the halfway run length which is not terminated to RUNRX.

If the judgement result in the step S219 is NO, a step S221 judges whether 2 run lengths exist in LEFT and the run length does not exist in RIGHT. If the judgement result in the step S221 is YES, a step S222 sets the value of the halfway run length which is not terminated to RUNRX.

If the judgement result in the step S221 is NO, a step S223 judges whether 2 run lengths exist in LEFT and 1 run length exists in RIGHT. If the judgement result in the step S223 is YES, a step S224 sets the 1 run length at an alternate position skipped by two, and sets the value of the halfway run length which is not terminated to RUNRX.

If the judgement result in the step S223 is NO, a step S225 judges whether 2 run lengths exist in LEFT and 2 run lengths exist in RIGHT. If the judgement result in the step S225 is YES, a step S226 sets the 2 run lengths at an alternate position skipped by two, and sets the value of the halfway run length which is not terminated to RUNRX.

If the judgement result in the step S225 is NO, a step S227 judges whether 2 run lengths exist in LEFT and 3 run lengths exist in RIGHT. If the judgement result in the step S227 is YES, a step S228 sets the 3 run lengths at an alternate position skipped by two, and sets the value of the halfway run length which is not terminated to RUNRX.

If the judgement result in the step S227 is NO, a step S229 judges whether 2 run lengths exist in LEFT and 4 run lengths exist in RIGHT. If the judgement result in the step S229 is YES, a step S230 sets the 4 run lengths at an alternate position skipped by two, and sets the value of the halfway run length which is not terminated to RUNRX.

If the judgement result in the step S229 is NO, a step S231 shown in FIG. 20 judges whether 3 run lengths exist in LEFT and the run length does not exist in RIGHT. If the judgement result in the step S231 is YES, a step S232 shown in FIG. 20 sets the value of the halfway run length which is not terminated to RUNRX.

If the judgement result in the step S231 is NO, a step S233 judges whether 3 run lengths exist in LEFT and 1 run length exists in RIGHT. If the judgement result in the step S233 is YES, a step S234 sets the 1 run length at an alternate position skipped by three, and sets the value of the halfway run length which is not terminated to RUNRX.

If the judgement result in the step S233 is NO, a step S235 judges whether 3 run lengths exist in LEFT and 2 run lengths exist in RIGHT. If the judgement result in the step S235 is YES, a step S236 sets the 2 run lengths at an alternate position skipped by three, and sets the value of the halfway run length which is not terminated to RUNRX.

If the judgement result in the step S235 is NO, a step S237 judges whether 3 run lengths exist in LEFT and 3 run lengths exist in RIGHT. If the judgement result in the step S237 is YES, a step S238 sets the 3 run lengths at an alternate position skipped by three, and sets the value of the halfway run length which is not terminated to RUNRX.

If the judgement result in the step S237 is NO, a step S239 judges whether 3 run lengths exist in LEFT and 4 run lengths exist in RIGHT. If the judgement result in the step S239 is YES, a step S240 sets the 4 run lengths at an alternate position skipped by three, and sets the value of the halfway run length which is not terminated to RUNRX.

If the judgement result in the step S239 is NO, a step S241 judges whether 4 run lengths exist in LEFT and the run length does not exist in RIGHT. If the judgement result in the step S241 is YES, a step S242 sets the value of the halfway run length which is not terminated to RUNRX.

If the judgement result in the step S241 is NO, a step S243 judges whether 4 run lengths exist in LEFT and 1 run length exists in RIGHT. If the judgement result in the step S243 is YES, a step S244 sets the 1 run length at an alternate position skipped by four, and sets the value of the halfway run length which is not terminated to RUNRX.

If the judgement result in the step S243 is NO, a step S245 judges whether 4 run lengths exist in LEFT and 2 run lengths exist in RIGHT. If the judgement result in the step S245 is YES, a step S246 sets the 2 run lengths at an alternate position skipped by four, and sets the value of the halfway run length which is not terminated to RUNRX.

If the judgement result in the step S245 is NO, a step S247 judges whether 4 run lengths exist in LEFT and 3 run lengths exist in RIGHT. If the judgement result in the step S247 is YES, a step S248 sets the 3 run lengths at an alternate position skipped by four, and sets the value of the halfway run length which is not terminated to RUNRX.

If the judgement result in the step S247 is NO, a step S249 judges whether 4 run lengths exist in LEFT and 4 run lengths exist in RIGHT. If the judgement result in the step S249 is YES, a step S250 sets the 4 run lengths at an alternate position skipped by four, and sets the value of the halfway run length which is not terminated to RUNRX.

Figure 21:
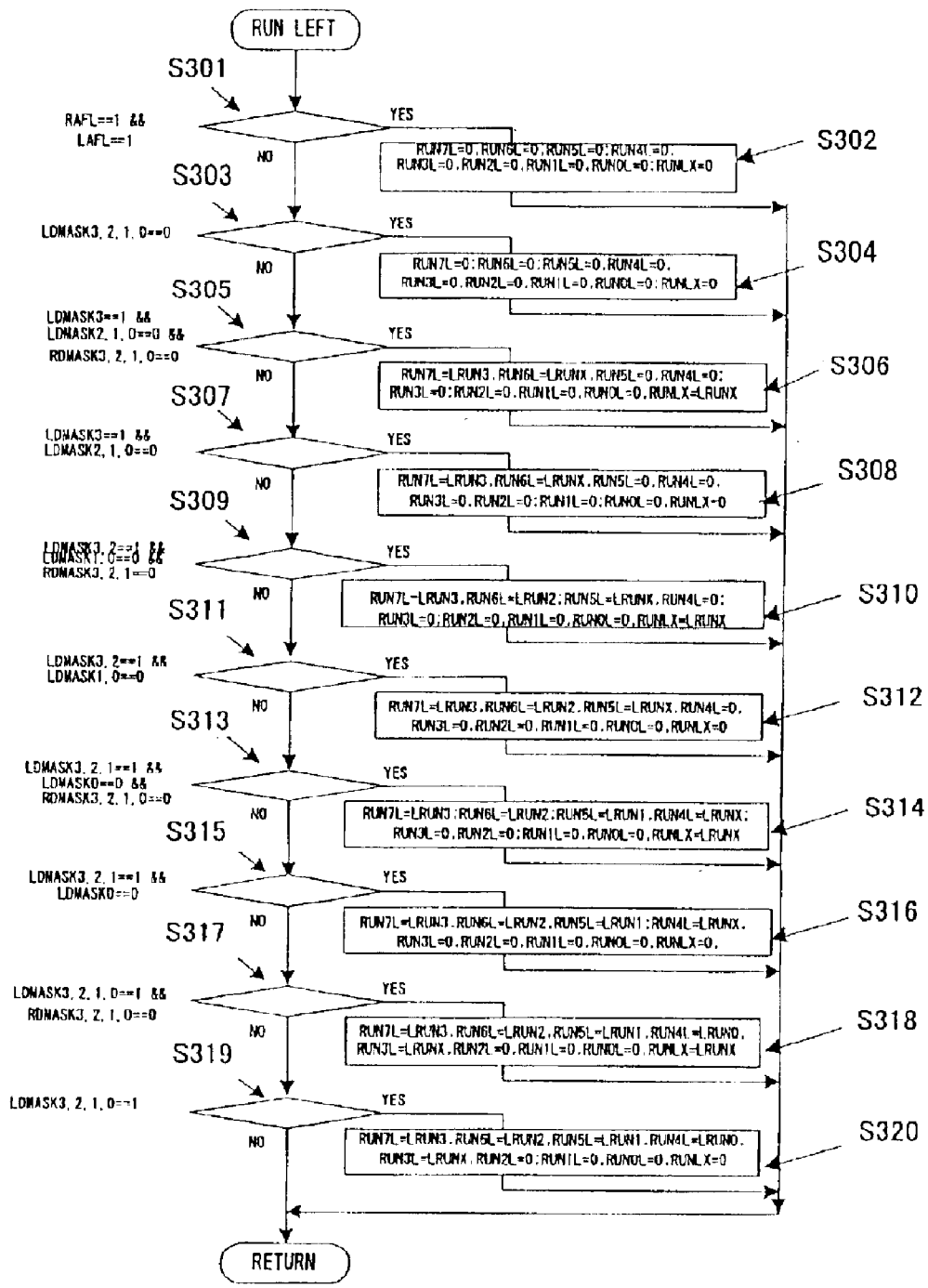
FIG. 21 is a flow chart for explaining a process of a LEFT run value generating unit.

FIG. 21 is a flow chart for explaining a process of the LEFT run value generating unit 223. In FIG. 21, a step S301 judges whether or not both the flags RAFL and LAFL are "1". In other words, a judgement is made to determine whether the 8-bit image pattern which is the present processing target is made up of all "0"s or all "1"s. If the judgement result in the step S301 is YES and no terminating run length exists in the upper 4 bits (LEFT), a step S302 outputs run lengths RUN7L, . . . , RUN0L=0 and carrying-over run length RUNLX=0, and the processing of the present image pattern ends (process advances to "return"). The run length 4 of these 4 bits is not set to RUNLX, because this run length is processed in the RIGHT run value generating unit 224.

If the judgement result in the step S301 is NO, a step S303 judges whether or not the mask values are LDMAX3, . . . , LDMAX0=0 for the run length. If the judgement result in the step S303 is YES, a step S304 outputs run lengths RUN7L, . . . , RUN0L=0 and carrying-over run length RUNLX=0 because no terminating run length exists in the upper 4 bits (LEFT), and the processing of the present image pattern ends (process advances to "return").

On the other hand, if the judgement result in the step S303 is NO, a step S305 judges whether or not the mask values are LDMAX3=1 and LDMASK2, . . . , LDMAX0=0 and RDMASK3, . . . , RDMASK0=0. In other words, a judgement is made to determine whether or not 1 run length exists in the upper 4 bits (LEFT) and no terminating run length exists in the lower 4 bits (RIGHT). If the judgement result in the step S305 is YES, a step S306 outputs the run lengths RUN7L=LRUN3, RUN6L=LRUNX and RUN5L, . . . , RUN0L=0 and carrying-over run length RUNLX=LRUNX, and the process ends.

If the judgement result in the step S305 is NO, a step S307 judges whether or not 1 run length exist in LEFT and 1 or more terminating run lengths exist in RIGHT. If the judgement result in the step S307 is YES, a step S308 sets the 1 run length, and sets the value of the halfway run length which is not terminated in LEFT to the second run length.

If the judgement result in the step S307 is NO, a step S309 judges whether or not 2 run lengths exist in LEFFT and a terminating run length does not exist in RIGHT. If the judgement result in the step S309 is YES, a step S310 sets the 2 run lengths, and sets the value of the succeeding run length to RUNLX.

If the judgement result in the step S309 is NO, a step S311 judges whether or not 2 run lengths exist in LEFT and 1 or more terminating run lengths exist in RIGHT. If the judgement result in the step S311 is YES, a step S312 sets the 2 run lengths, and sets the value of the halfway run length which is not terminated in LEFT to the third run length.

If the judgement result in the step S311 is NO, a step S313 judges whether or not 3 run lengths exist in LEFT and a terminating run length does not exist in RIGHT. If the judgement result in the step S313 is YES, a step S314 sets the 3 run lengths, and sets the succeeding run length to RUNLX.

If the judgement result in the step S313 is NO, a step S315 judges whether or not 3 run lengths exist in LEFT and 1 or more terminating run lengths exist in RIGHT. If the judgement result in the step S315 is YES, a step S316 sets the 3 run lengths, and sets the value of the halfway run length which is terminated in LEFT to the fourth run length.

If the judgement result in the step S315 is NO, a step S317 judges whether or not 1 run length exists in LEFT and a terminating run length does not exist in RIGHT. If the judgement result in the step S317 is YES, a step S318 sets the 1 run length, and sets the succeeding run length to RUNLX.

If the judgement result in the step S317 is NO, a step S319 judges whether or not 4 run lengths exist in LEFT and 1 or more terminating run lengths exist in RIGHT. If the judgement result in the step S319 is YES, a step S320 sets the 4 run lengths, and sets the value of the halfway run length which is not terminated in LEFT to the fifth run length, and the process ends.

Returning now to the description of FIG. 5, the mask value combining unit 225 combines the mask values LDMASK3 through LDMASK0 from the run counter 221 and the mask values RDMASK3 through RDMASK0 from the run counter 222, and obtains 8 mask values DMASK7 through DMASK0 with an 8-bit length. The mask value combining unit 225 also receives the flags LAFL and RAFL (not shown) which are output from the run counters 221 and 222.

Figure 17:
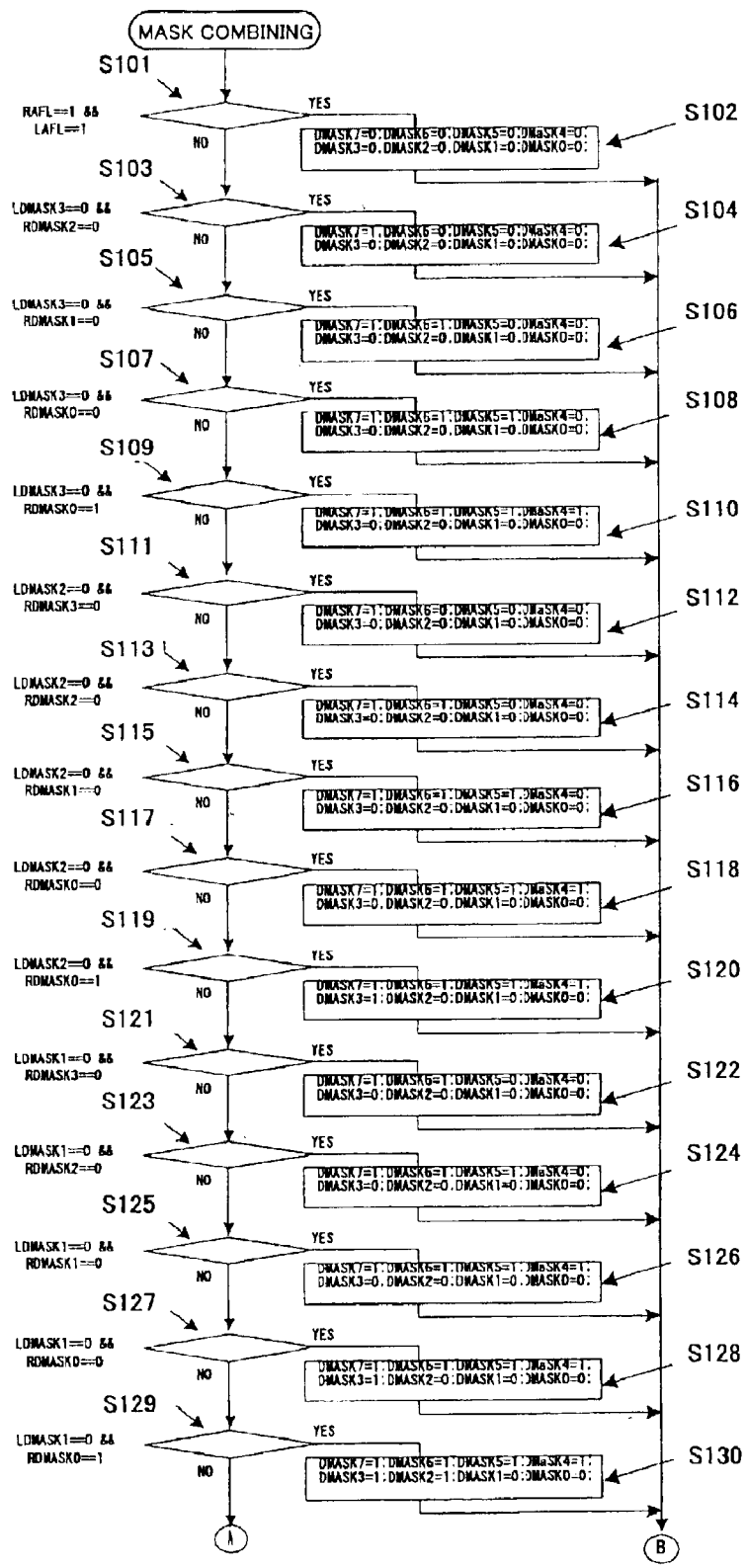
FIG. 17 is a flow chart for explaining a process of a mask value combining unit.
Figure 18:
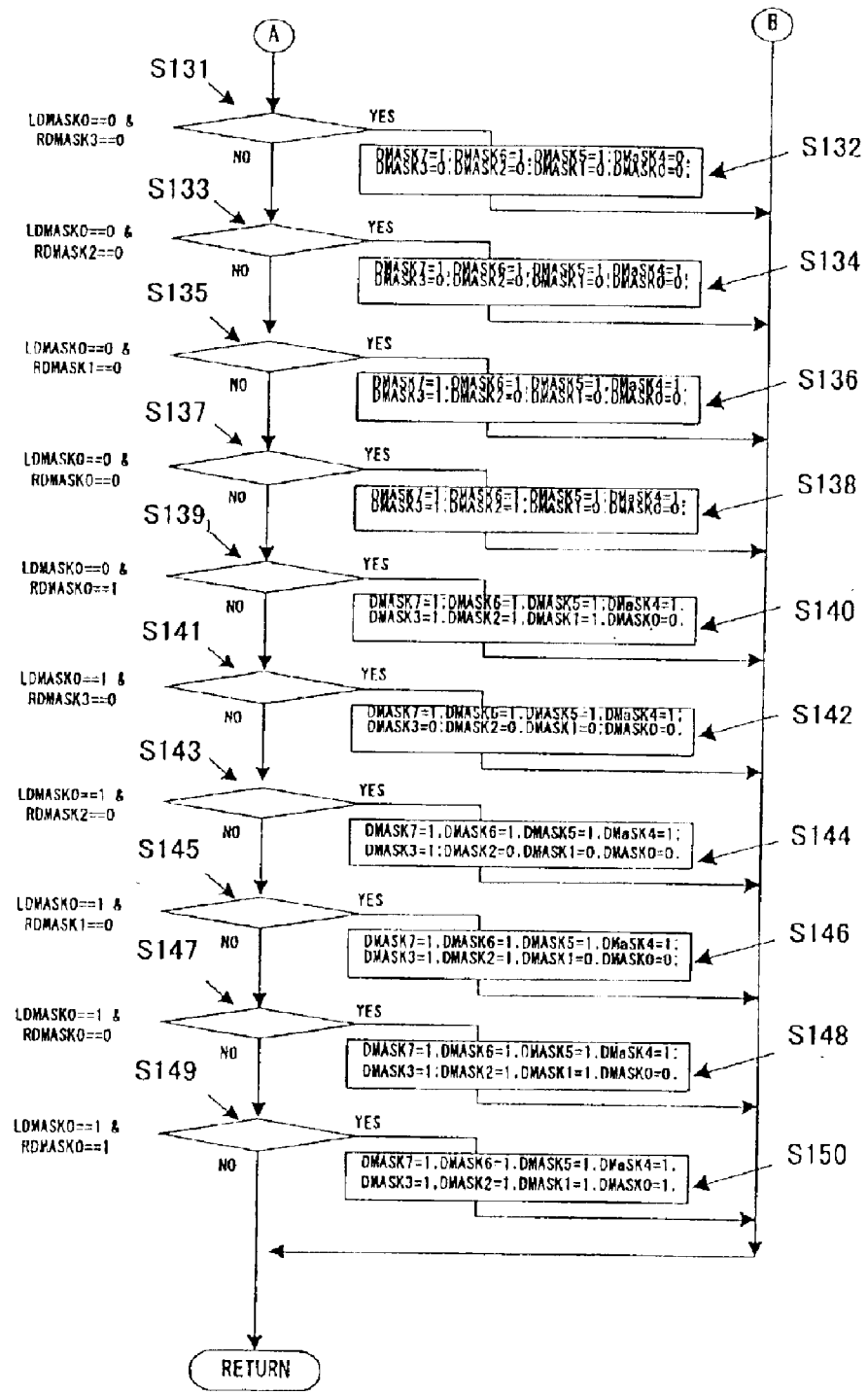
FIG. 18 is a flow chart for explaining the process of the mask value combining unit.

FIGS. 17 and 18 are flow charts for explaining a process of the mask value combining unit 225. In FIG. 17, a step S101 judges whether or not both the flags RAFL and LAFL are "1". If the judgement result in the step S101 is YES, a step S102 outputs mask values DMASK7, . . . , DMASK0=0, and the process ends. If the judgement result in the step S101 is NO, a step S103 judges whether or not LDMASK3=0 and RDMASK2=0. If the judgement result in the step S103 is YES, a step S104 outputs mask values DMASK7=1 and DMASK6, . . . , DMASK0=0, and the process ends. If the judgement result in the step S103 is NO, the process advances to a step S105.

Each of the steps S105, S107, S109, S111, S113, S115, S117, S119, S121, S123, S125, S127, S129 shown in FIG. 17 and steps S131, S133, S135, S137, S139, S141, S143, S145, S147 and S149 shown in FIG. 18 judges whether or not a corresponding condition is satisfied, similarly to the steps S101 and S103 shown in FIG. 17, and a corresponding one of steps S106, S108, S110, S112, S114, S116, S118, S120, S122, S124, S126, S128 and S130 shown in FIG. 15 and steps S132, S134, S136, S138, S140, S142, S144, S146, S148 and S150 shown in FIG. 18 is carried out depending on the satisfied condition. Of course, the order in which the conditions are judged is not limited to the order shown in FIGS. 17 and 18.

Returning again to the description of FIG. 5, the run value combining unit 226 generates a maximum of 8 run lengths RUN7 through RUN0 and carrying-over run length RUNX, from the maximum of 8 run lengths RUN7L through RUN0L and the carrying-over run length RUNXL (not shown) from the LEFT run value generating unit 223 and the maximum of 8 run lengths RUN7R through RUN0R and the carrying-over run length RUNXR (not shown) from the RIGHT run value generating unit 224.

Figure 22:
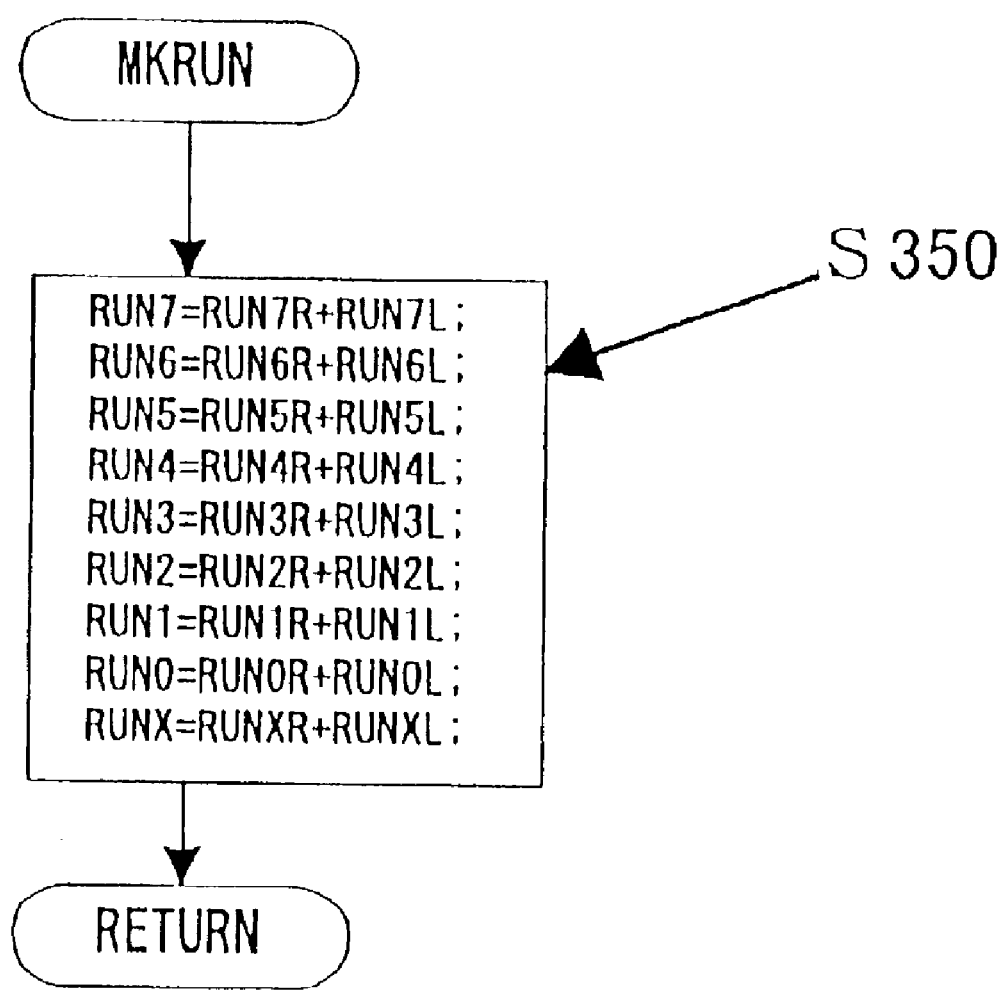
FIG. 22 is a flow chart for explaining a process of a run value combining unit.

FIG. 22 is a flow chart for explaining a process of the run value combining unit 226. In FIG. 22, a step S350 adds the corresponding run lengths, so as to obtain RUN7=RUN7R+RUN7L, . . . , RUN0=RUN0R+RUN0L, and RUNX=RUNXR+RUNXL.

The combined run lengths RUN6 through RUN0 are stored in the register 229 as RRUN6 through RRUN0, and also supplied to the next word check processing unit 204 as CRUN6 through CRUN0. The combined run length RUN7 and the carrying-over run length RUNX are supplied to the adders 227 and 228 of the cumulative addition processing unit. The flag AFL output from the RIGHT run value generating unit 224 is supplied to the adder 228 as a control input.

When the flag AFL is "1", the adder 228 adds the carrying-over run length RUNX and the total RBRUN7 of the carrying-over run lengths up to the present stored in the register 229, and stores the sum in the register 229 as a total carrying-over run length. On the other hand, when the flag AFL is "0", the carrying-over run length RUNX is stored in the register 229 via the adder 228, as a total RBRUN7 of the carrying-over run lengths up to the present.

The adder 227 adds the first run length RUN7 and the total RBRUN7 of the carrying-over run lengths up to the present, and obtains a run length which takes into consideration the carrying-over run lengths up to the present. A sum obtained by the adder 227 is stored in the register 229 as a run length RRUN7, and is also supplied to the next word check processing unit 204 as CRUN7. The 8-bit IDOT of the image pattern which is the present processing target and the mask values DMASK7 through DMASK0 output from the mask value combining unit 225 are also stored in the register 229 as ODOT and RDMASK7 through RDMASK0. Contents of the register 229 are supplied to the pass judging and repetition processing unit 205.

Figure 14:
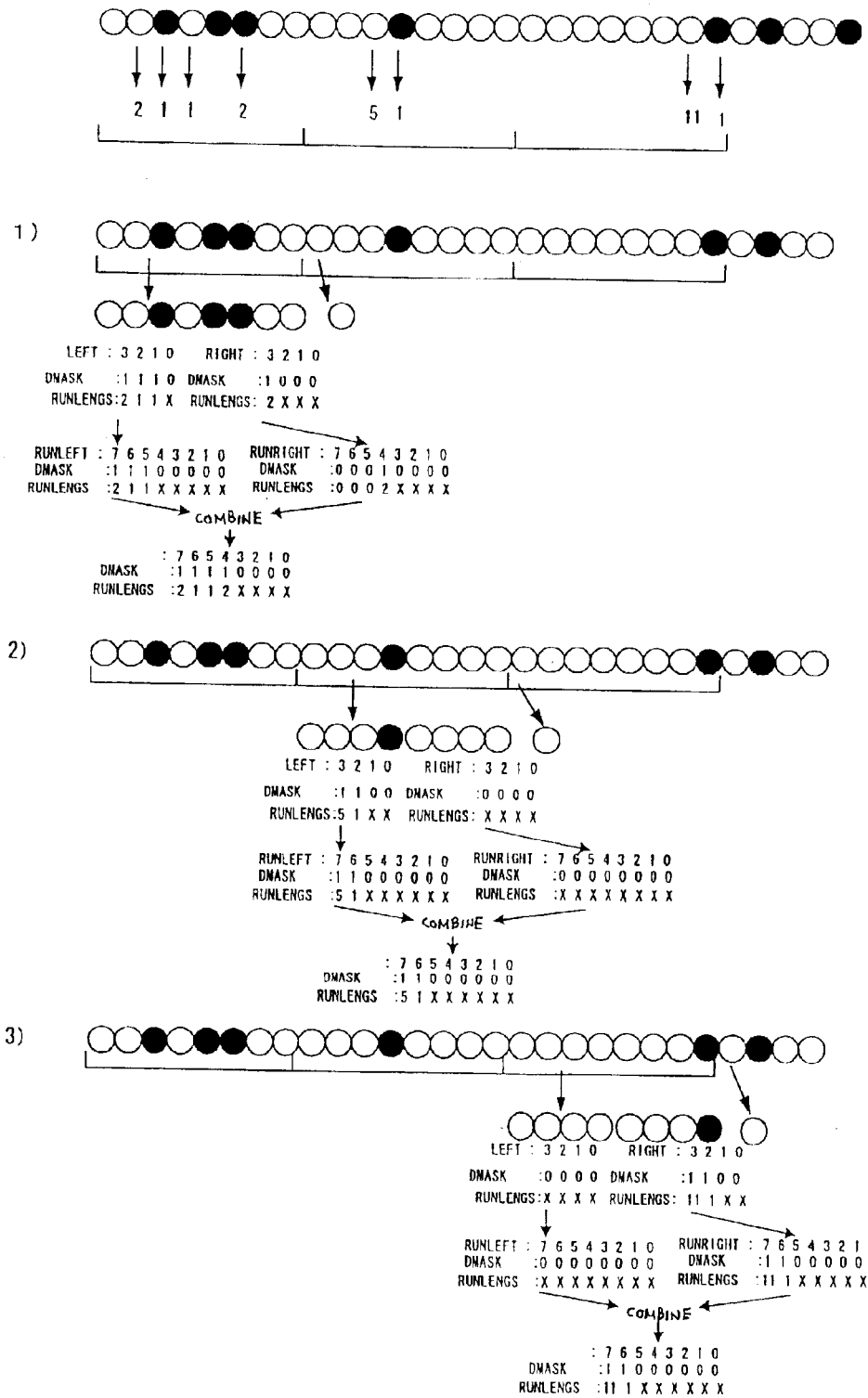
FIG. 14 is a diagram for explaining particular processing examples of the run length processing unit.

FIG. 14 is a diagram for explaining particular processing examples of the run length processing unit 203. The uppermost portion of FIG. 14 shows the image data to be processed, where "○" indicates "0" and "●" indicates "1". As shown, the binary image data is read by the run length processing unit 203 for every 8 bits and processed in parallel.

Processing Example 1) in FIG. 14 shows the processing of a first image pattern. The 8-bit image pattern is sectioned into upper 4 bits (LEFT) and lower 4 bits (RIGHT) and processed. For the 4 bits in LEFT, 3 run lengths "2", "1" and "1" are obtained by the run counter 221. For the 4 bits in RIGHT; 1 run length "2" is obtained by the run counter 222. The LEFT run lengths are developed into 8 run lengths by the LEFT run value generating unit 223, and the RIGHT run length is developed into 8 run lengths by the RIGHT run value generating unit 224. The RIGHT run lengths are created by shifting an amount corresponding to the LEFT run length. The LEFT and RIGHT run lengths are added by the run value combining unit 226, and 8 run lengths (RUNLENMGS) are generated.

Processing Example 2) in FIG. 14 shows the processing of a second image pattern. 1 run length "5" is obtained for LEFT, and 0 run length is obtained for RIGHT. The LEFT run length "5" is developed into 8 run lengths by the LEFT run value generating unit 223, and the 0 RIGHT run length is developed into 8 run lengths by the RIGHT run value generating unit 224. The RIGHT run lengths are created by shifting an amount corresponding to the LEFT run length. The LEFT and RIGHT run lengths are added by the run value combining unit 226, and 8 run lengths are generated. In this case, a remaining run length obtained in one previous RIGHT closes in the present LEFT.

Processing Example 3) in FIG. 14 shows the processing of a third image pattern. 0 run length is obtained for LEFT, and 1 run length "11" is obtained for RIGHT. The 0 LEFT run length is developed into 8 run lengths by the LEFT run value generating unit 223, and the 1 RIGHT run length "11" is developed into 8 run lengths by the RIGHT run value generating unit 224. The RIGHT run lengths are created by shifting an amount corresponding to the LEFT run length. The LEFT and RIGHT run lengths are added by the run value combining unit 226, and 8 run lengths are generated. In this case, a remaining run length obtained in one previous RIGHT closes in RIGHT via the present LEFT.

[Next Word Check Processing Unit 204]

Figure 6:
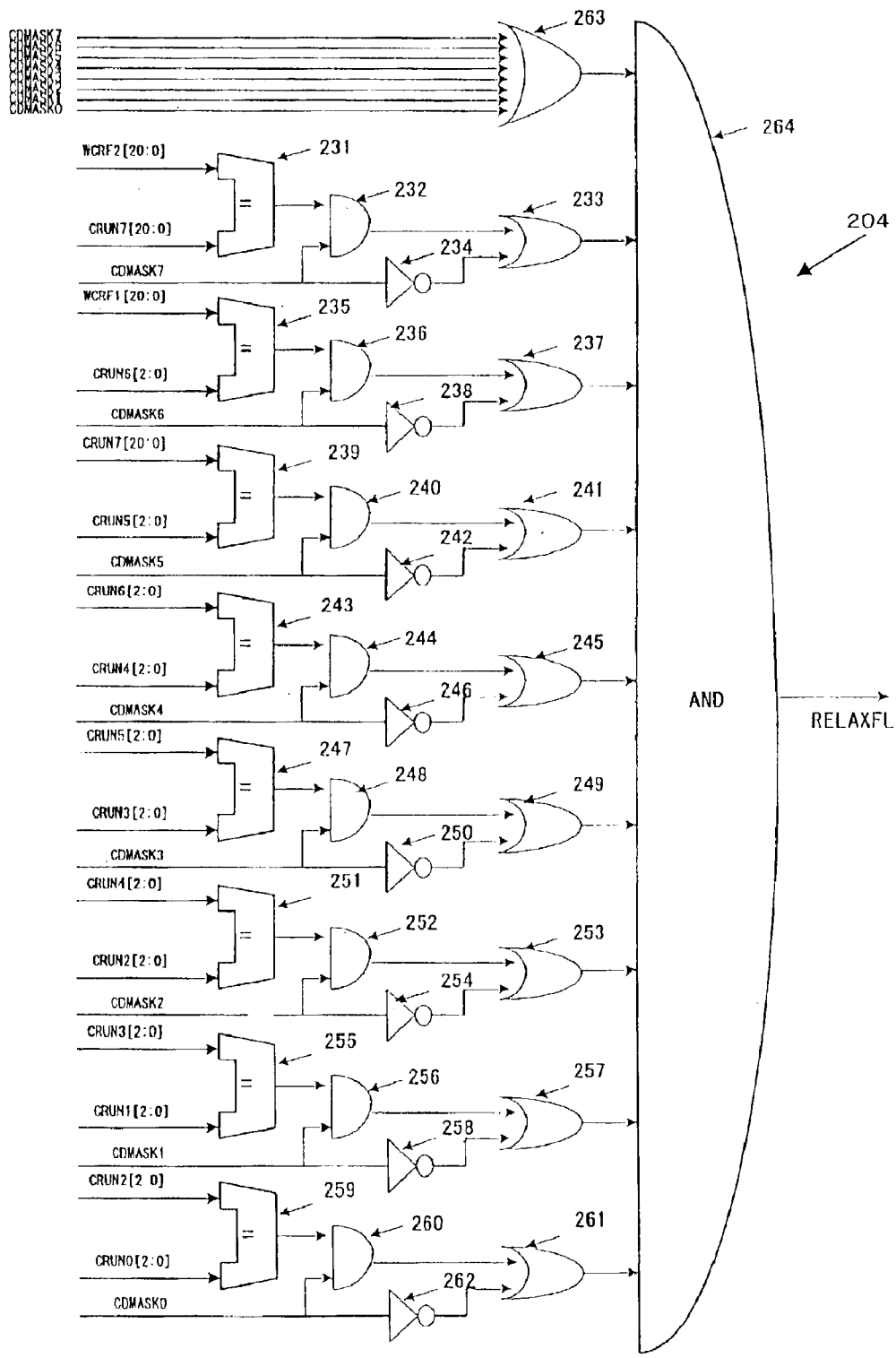
FIG. 6 is a system block diagram showing a structure of a next word check processing unit.

FIG. 6 is a system block diagram showing a structure of the next word check processing unit 204. The next word check processing unit 204 judges whether or not the word next to the word which is presently being coded is all repetition. In order to make this judgement, the next word check processing unit 204 receives a maximum of 8 run lengths, and sets an output RELAXFL to "1" when each valid run length matches the run length of two run lengths before, so as to control the relaxation of the pass judging of a pass judging unit within the pass judging and repetition processing unit 205. A description will now be given of the various parts of the next word check processing unit 204.

In FIG. 6, a comparator 231 compares a second run length WCRF2 from last of the word which is to be coded and a first run length CRUN7 of the next word, so as to judge whether or not the two run lengths match. By the operation of an AND circuit 232, an OR circuit 233 and an inverter 234, a judgement output of the comparator 231 is supplied to an AND circuit 264 when the value of CDMASK7 is "1", and a value "1" is supplied to the AND circuit 264 when the value of CDMASK7 is "0".

A comparator 235 compares a first run length WCRF1 from last of the word which is to be coded and a second run length CRUN6 of the next word, so as to judge whether or not the two run lengths match. By the operation of an AND circuit 236, an OR circuit 237 and an inverter 238, a judgement output of the comparator 235 is supplied to the AND circuit 264 when the value of CDMASK6 is "1", and a value "1" is supplied to the AND circuit 264 when the value of CDMASK6 is "0".

A comparator 239 compares a third run length CRUN5 and a first run length CRUM7 of the word which is next to the word which is to be coded, so as to judge whether or not the two run lengths match. By the operation of an AND circuit 240, an OR circuit 241 and an inverter 242, a judgement output of the comparator 239 is supplied to an AND circuit 264 when the value of CDMASK5 is "1", and a value "1" is supplied to the AND circuit 264 when the value of CDMASK5 is "0".

Similarly, comparison of a fourth run length CRUN4, a fifth run length CRUM3, a sixth run length CRUM2, a seventh run length CRUN1 and an eighth run length CRUM0 are made in corresponding comparators 243, 247, 251, 255 and 259. Judgement outputs of the comparators 243, 247, 251, 255 and 259 are supplied to the AND circuit 264 when the values of corresponding CDMASK4, CDMASK3, CDMASK2, CDMASK1 and CDMASK0 are "1", and a value "1" is supplied to the AND circuit 264 when the values of corresponding CDMASK4, CDMASK3, CDMASK2, CDMASK1 and CDMASK0 are "0". In FIG. 6, the next word check processing unit 204 further includes AND circuits 244, 248, 252, 256 and 260, OR circuits 245, 249, 253, 257 and 261, and inverters 246, 250, 254, 258 and 262.

An OR circuit 263 obtains a logical sum of the mask values CDMASK7 through CDMASK0 of the 8 run lengths. The OR circuit 263 supplies a value "0" to the AND circuit 264 if none of the 8 run lengths are valid. In addition, the AND circuit 264 outputs RELAXFL which is "1" when all inputs thereto are "1". The output RELAXFL is supplied to the pass judging unit within the pass judging and repetition processing unit 205, which will be described later.

[Pass Judging and Repetition Processing Unit 205 of Image Compression Apparatus 106e]

Figure 7:
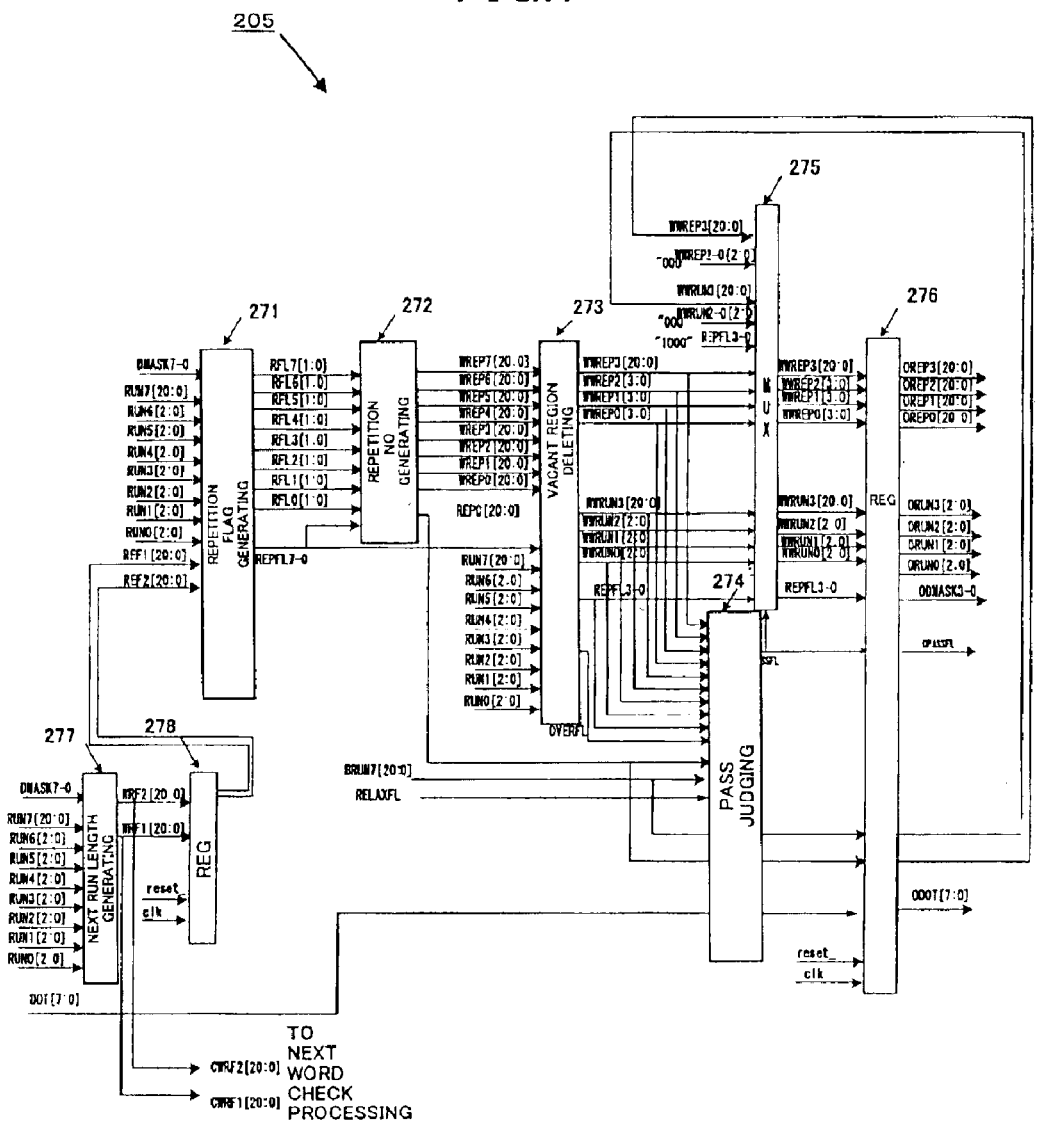
FIG. 7 is a system block diagram showing a structure of a pass judging and repetition processing unit.

FIG. 7 is a system block diagram showing a structure of the pass judging and repetition processing unit 205. The pass judging and repetition processing unit 205 obtains the repetition number of a plurality of run lengths, from the second and first run lengths from last of the previous pattern and the plurality of run lengths obtained by the run length processing unit 203. A repetition flag generating unit 271 compares each run length from the second and first run lengths from last of the previous pattern and the plurality of run lengths obtained by the run length processing unit 203, and generates repetition flags RFL7 through RFL0 by judging whether or not each of the plurality of run lengths obtained by the run length processing unit 203 is equal to the run length of two run lengths before. A repetition number generating unit 272 judges how to continue the repetition number up to the present, from the pattern of the repetition flags RFL7 through RFL0 and a repetition number REP up to the present. In addition, the repetition number generating unit 272 calculates a new repetition number, and obtains a plurality of repetition numbers WREP7 through WREP0 and a repetition number WREP to the next pattern.

A description will be given of the various parts of the pass judging and repetition processing unit 205.

The repetition flag generating unit 271 receives from the run length processing unit 203 the plurality of run lengths, the mask values of the run lengths, and the run lengths of two run lengths before and one length before of the previous pattern, and generates repetition flags RFL7 through RFL0 by comparing and judging whether or not each run length from the run length processing unit 203 matches the run length of two run lengths before. The details of this process will be described later in conjunction with FIG. 25.

The repetition number generating unit 272 receives from the repetition flag generating unit 271 the repetition flags RFL7 through RFL0 and the repetition number (REP) up to the present, and generates a plurality of repetition numbers. The details of this process will be described later in conjunction with FIG. 24 and FIGS. 30 through 32.

A vacant region deleting unit 273 shifts a portion (repetition number is 0) which has no information and is judged as being a repetition by the repetition number generating unit 272, with respect to the plurality of repetition numbers received from the repetition number generating unit 272 and the plurality of run lengths, so as to adjust the repetition number and the run length towards WREP7 and WWRUN7.

A pass judging unit 274 receives a maximum of 4 run lengths and a maximum of 4 repetition numbers from the vacant region deleting unit 273, and calculates the code length. In addition, the pass judging unit 274 receives a run length BRUN7 which is presently being counted halfway, a repetition number REP0 which is presently being counted halfway, and a pass judging relaxation signal RELAXFL from the next word check processing unit 204, and carries out a code length correction process. The code length correction process compares the obtained code length and a pass coding threshold value, and sets a pass coding flag PASSFL to "1" when the obtained code length is larger than the pass coding threshold value. This process and an internal structure of the pass judging unit 274 will be described later in conjunction with FIG. 8 and FIGS. 33 through 35.

When the pass coding flag PASSFL is "1", a multiplexer (MUX) 275 supplies the halfway run length and the halfway repetition number of one run length before the word which is presently being coded to a register 276, and thus to the coding processing unit 206. In addition, when the pass coding flag PASSFL is "0", the multiplexer 275 supplies a maximum of 4 run lengths and a maximum of 4 repetition numbers of the present word to the register 276, and thus to the coding processing unit 206.

A next run length generating unit 277 obtains a second run length and a first run length from last of the present input pattern, so as to generate a repetition flag for the next input pattern. This process will be described later in conjunction with FIG. 27 The run lengths are stored in a register 278, and are used by the repetition flag generating unit 271 when the next pattern is input.

Figure 23:
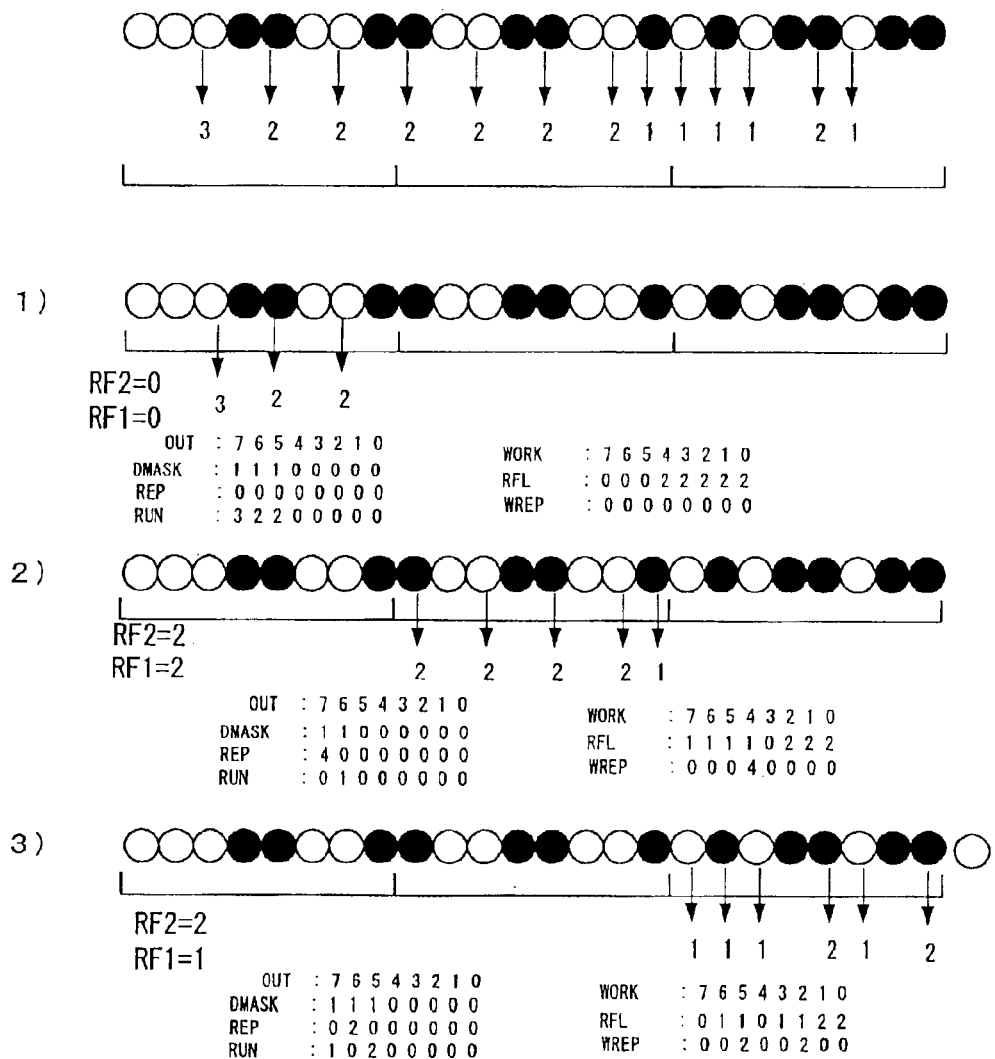
FIG. 23 is a diagram for explaining particular processing examples of the pass judging and repetition processing unit.

FIG. 23 is a diagram for explaining particular processing examples of the pass judging and repetition processing unit 205. The uppermost portion of FIG. 23 shows the image data to be processed, where "○" indicates "0" and "●" indicates "1". As shown, the binary image data is processed in parallel in units of 8 bits.

Processing Example 1) in FIG. 23 shows a case where the first 8 bits are processed in parallel to obtain the repetition. OUT indicates an item number of DMASK, REP and RUN which are output from the pass judging and repetition processing unit 205. DMASK denotes the mask value which functions as a valid flag for the 8 runs, and valid is indicated when "1". The item of the mask value DMASK includes the run length or the repetition number. REP denotes the repetition number, and when "0", indicates that the item number thereof indicates the run length and not the repetition. RUN denotes the run length. WORK indicates an item number of main signals RFL and WREP within the pass judging and repetition processing unit 205. RFL denotes a repetition flag which is output from the repetition flag generating unit 271, and indicates 0 when the item thereof is the run length, 1 when the item thereof is the repetition and 2 when the item thereof is blank. WREP denotes the repetition number output from the repetition number generating unit 272. RF1 denotes the last run length, and RF2 denotes the run length preceding RF1. Since this case corresponds to the first process, RF2 and RF1 are set to an initial value 0 (run length 0 is a normally impossible numeric value). As shown, 3 run lengths "3", "2" and "2" exist, but there is no repetition.

Processing Example 2) in FIG. 23 shows a case where the second 8 bits are processed in parallel, and 5 run lengths "2", "2", "2", "2" and "1" are input. The first run length "2" matches the numeric value of RF2 and is recognized as the repetition number. The second run length "2" matches the numeric value of RF1 and is recognized as the repetition number. The third run length "2" matches the numeric value of the run length "2" of two run lengths before and is recognized as the repetition number. The fourth run length. "2" matches the numeric value of the run length "2" of two run lengths before and is recognized as the repetition number. The repetition flag RFL is "1" for the item numbers 3 and 2, but is "2" for the item number 1, indicating that this repetition is still continuing. For this reason, the continuing repetition number "2" is stored in REP. Accordingly, the repetition number is not output in WREP. The fifth run length "1" is compared with the run length "2" of two run lengths before, and is not recognized as a repetition since the compared numeric values do not match. Hence, the repetition flag RFL is "1" for the item numbers 7, 6, 5 and 4, but is "0" for the item number 3, indicating that this repetition is terminated. For this reason, in WREP, the repetition number "4" is indicated for the item number 4 at the terminated position. Next, since blanks exist in item numbers 7, 6 and 5 of WREP, the blanks of the item numbers 7, 6 and 5 are deleted and a shift of 3 is made by the vacant region deleting unit 273, so that the shifted portion becomes like REP and RUN of OUT. When the blanks exist, this vacant region deleting process deletes the blanks and makes the adjustment to fill the deleted portion, so as to conform to a format rule when making the transfer to the next processing unit. Accordingly, the processing unit at the next stage can receive the data in a simple format, to thereby enable reduction of the number of gates of the hardware and to improve the processing speed.

Processing Example 3) in FIG. 23 shows a case where the third 8 bits are processed in parallel, and 6 run lengths "1", "1", "1", "2", "1" and "2" are input. The first run length "1" does not match the numeric value of RF2 and is recognized as the run length. The second run length "1" matches the numeric value of RF1 and is recognized as the repetition number. The third run length "1" matches the numeric value of the run length "1" of two run lengths before and is recognized as the repetition number. The fourth run length "2" does not match the numeric value of the run length "1" of two run lengths before and is not recognized as the repetition number. Hence, the repetition flag RFL is "1" for the item numbers 6 and 5, but is "0" for the item number 4, indicating that this repetition is terminated. For this reason, in WREP, the repetition number "2" is indicated for the item number 5 at the terminated position. The fifth run length "1" matches the run length "1" of two run lengths before, and is recognized as the repetition number. The sixth run length "2" matches the run length "2" of two run lengths before, and is recognized as the repetition number. Hence, the repetition flag RFL is "1" for the item numbers 3 and 2, but is "2" for the item number 1, indicating that this repetition is still continuing. Therefore, the repetition number is not output in WREP.

Figure 25:
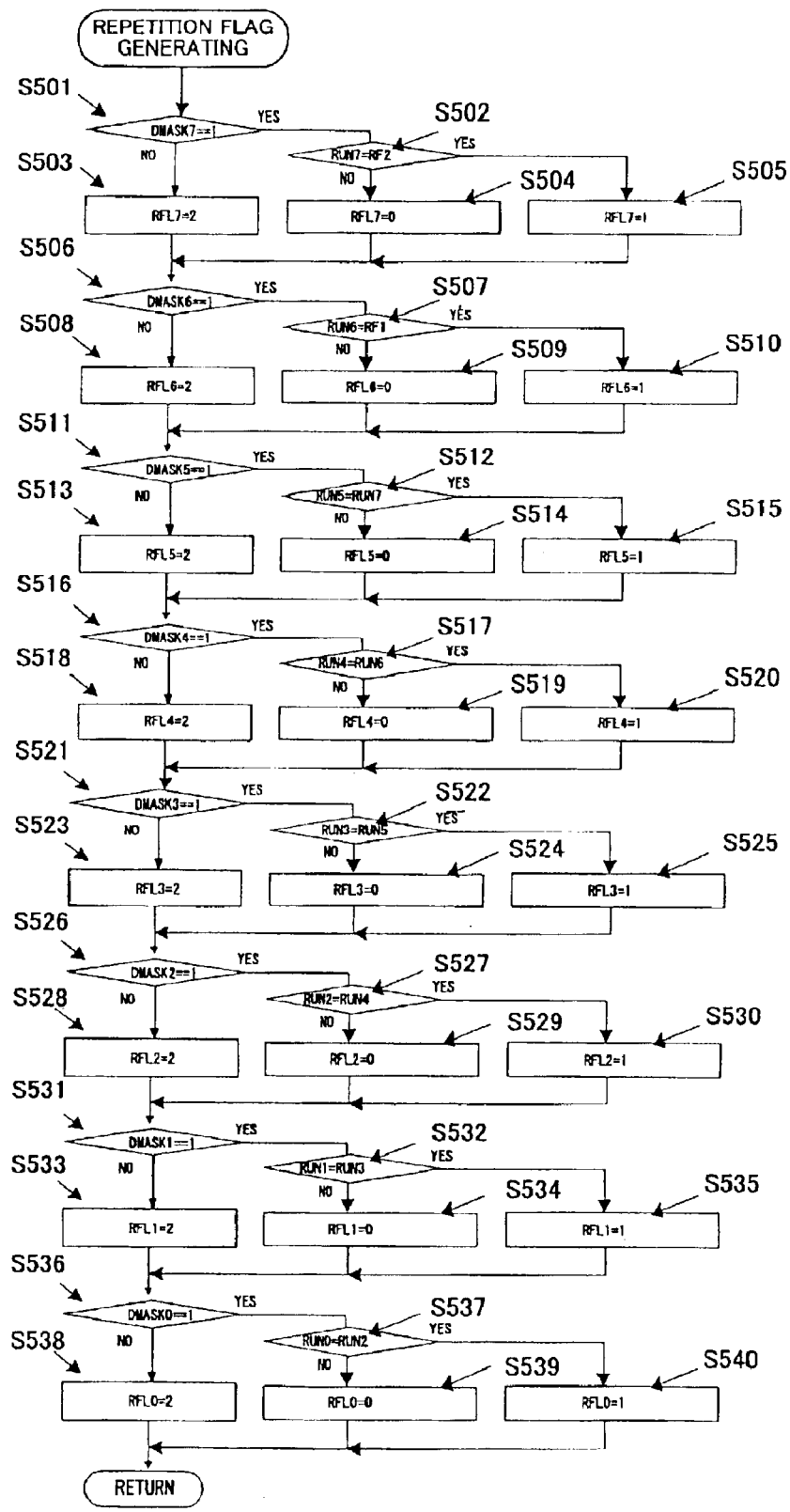
FIG. 25 is a flow chart for explaining a process of a repetition flag generating unit.

FIG. 25 is a flow chart for explaining a process of the repetition flag generating unit 271. In FIG. 25, a step S501 judges whether or not the mask value DMASK7 is 1. If DMASK7 is 0 and the judgement result in the step S501 is NO, no corresponding run length exists, and a step S503 sets 2 to the repetition flag RFL7. If the judgement result in the step S501 is YES, a corresponding run length exists, and a step S502 judges whether or not the run length RUN7 matches the second run length RF2 from the last of the previous pattern. If the judgement result in the step S502 is YES, a step S504 sets 0 to the repetition flag RFL7. If the judgement result in the step S502 is NO, a step S505 sets 1 to the repetition flag RFL7. The process advances to a step S506 after the step S503 or S504 or S505.

Similarly thereafter, steps S506 through S540 are carried out with respect to the mask values DMASK6 through DMASK0, the run lengths RUN6 through RUN0, and the repetition flags RFL6 through RFL0, by carrying out the judgements and the setting of the repetition flags shown in FIG. 25.

Figure 24:
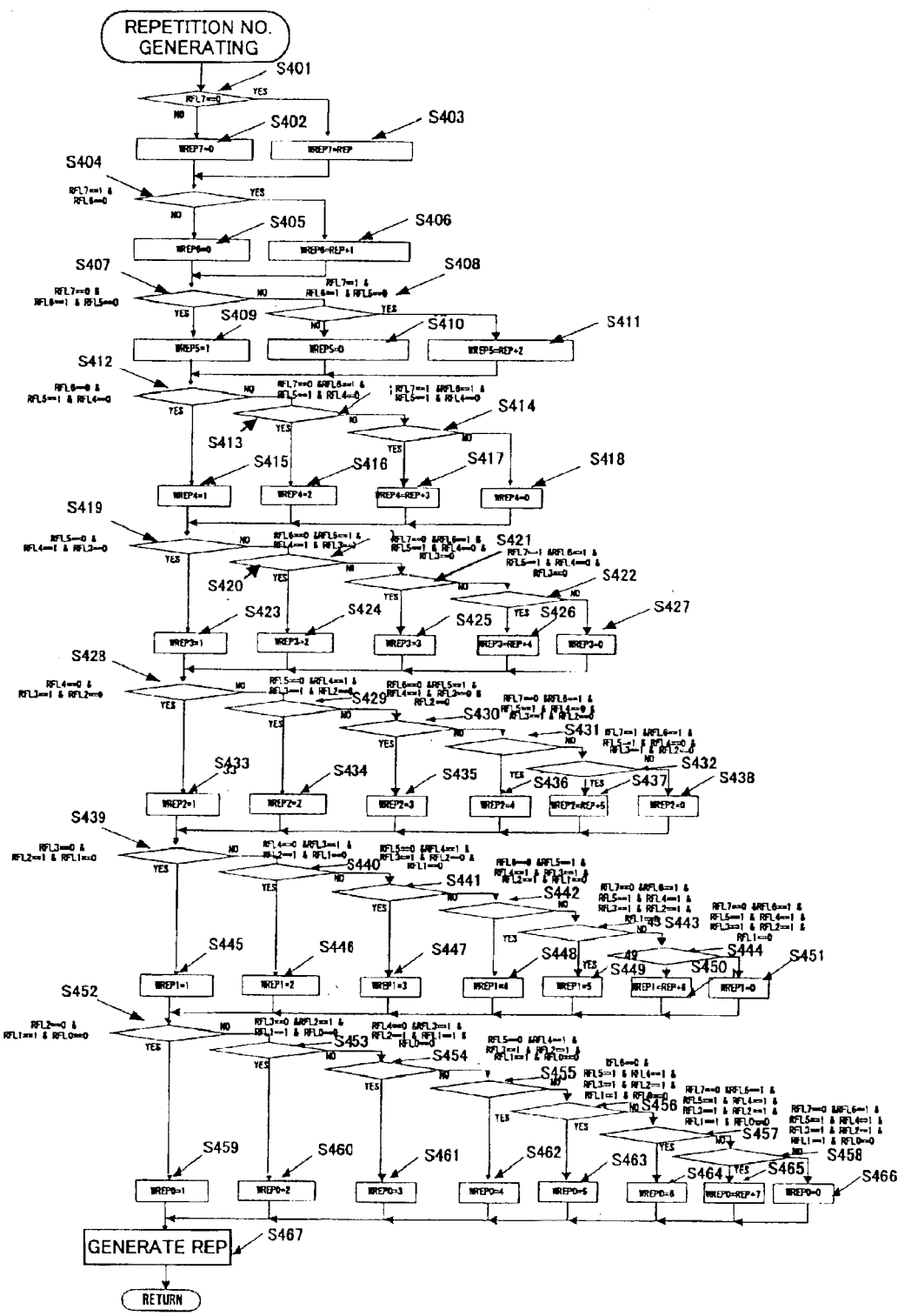
FIG. 24 is a flow chart for explaining a process of a repetition number generating unit.
Figure 30:
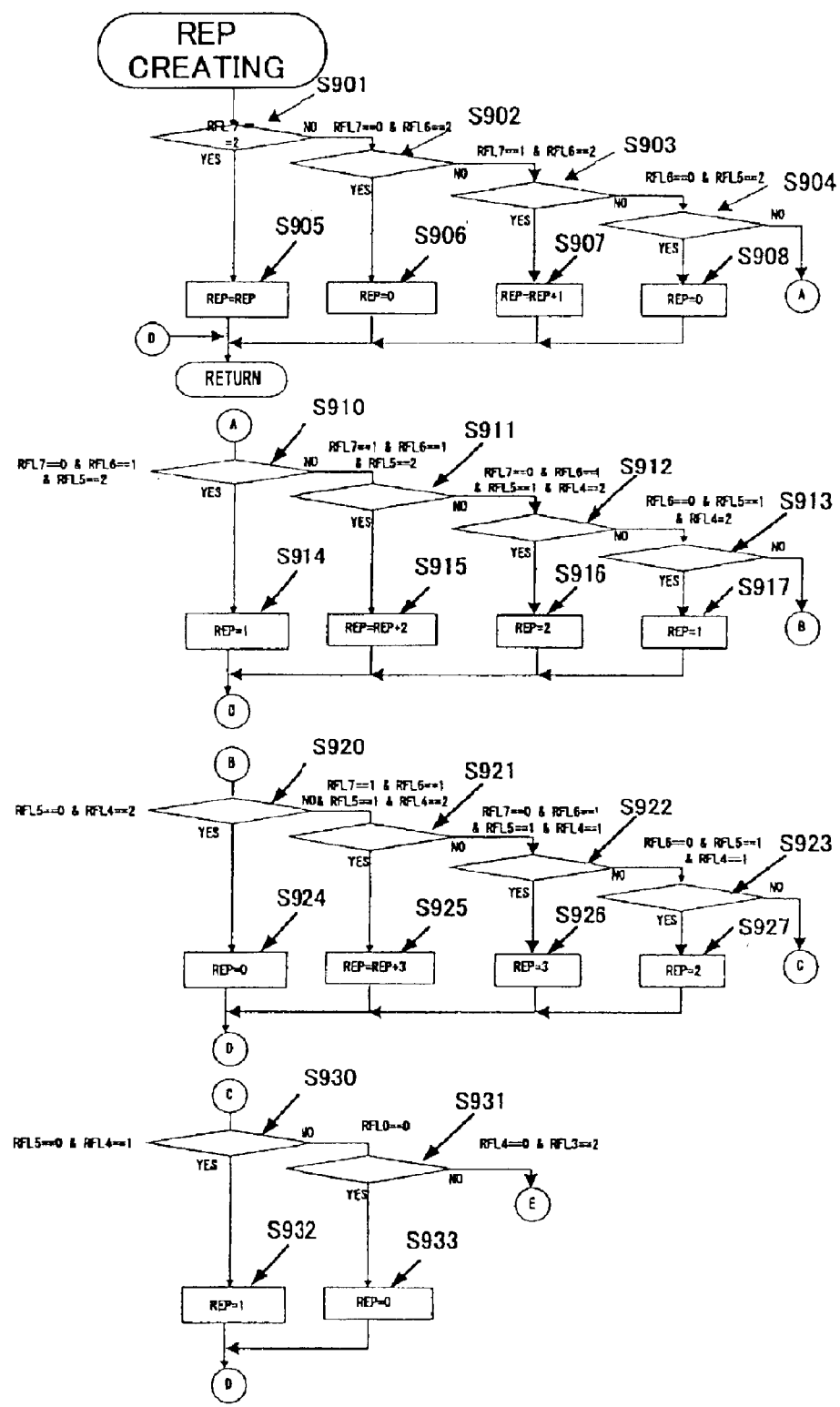
FIG. 30 is a flow chart for explaining a process of a step S467 shown in FIG. 24.
Figure 31:
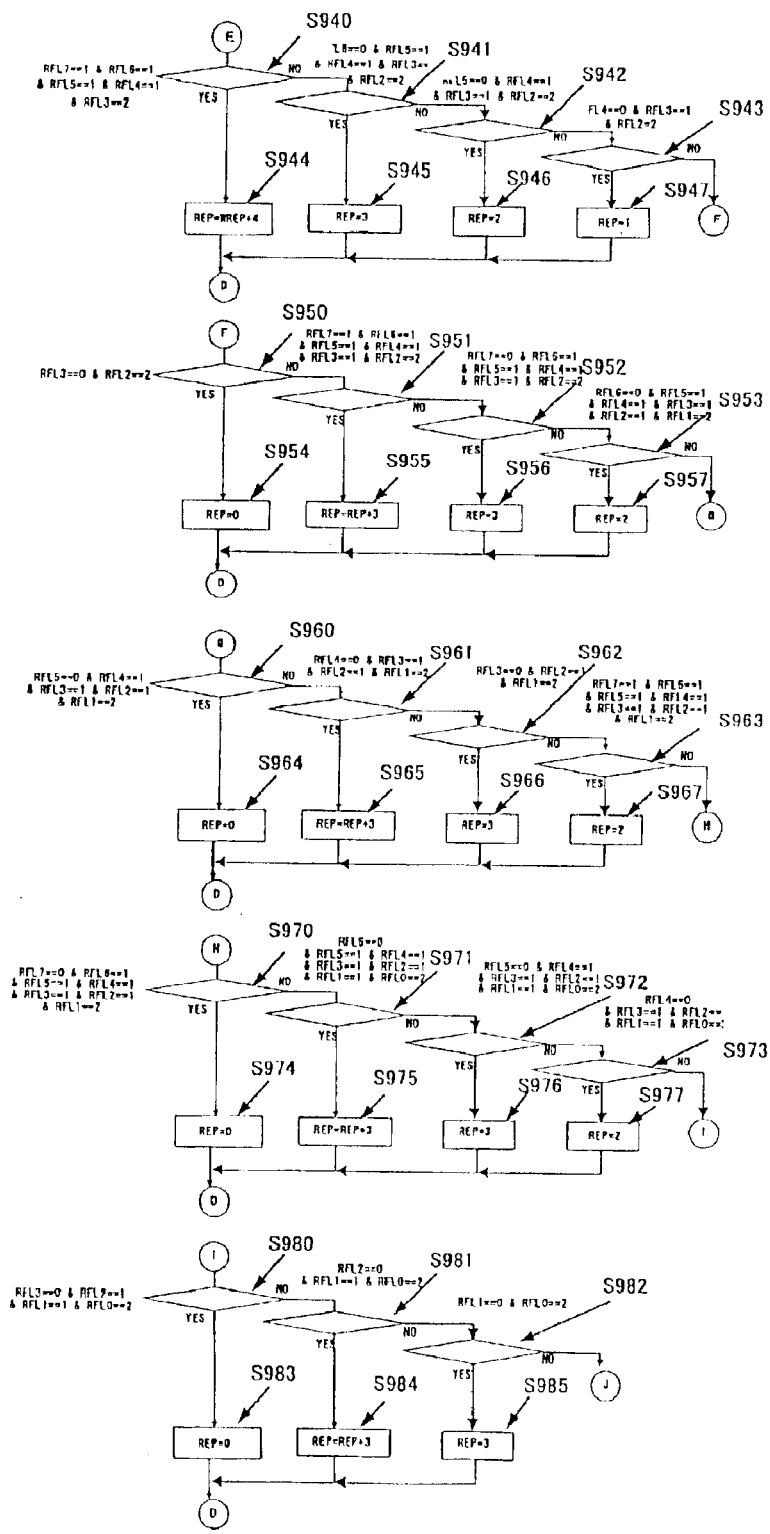
FIG. 31 is a flow chart for explaining the process of the step S467 shown in FIG. 24.
Figure 32:
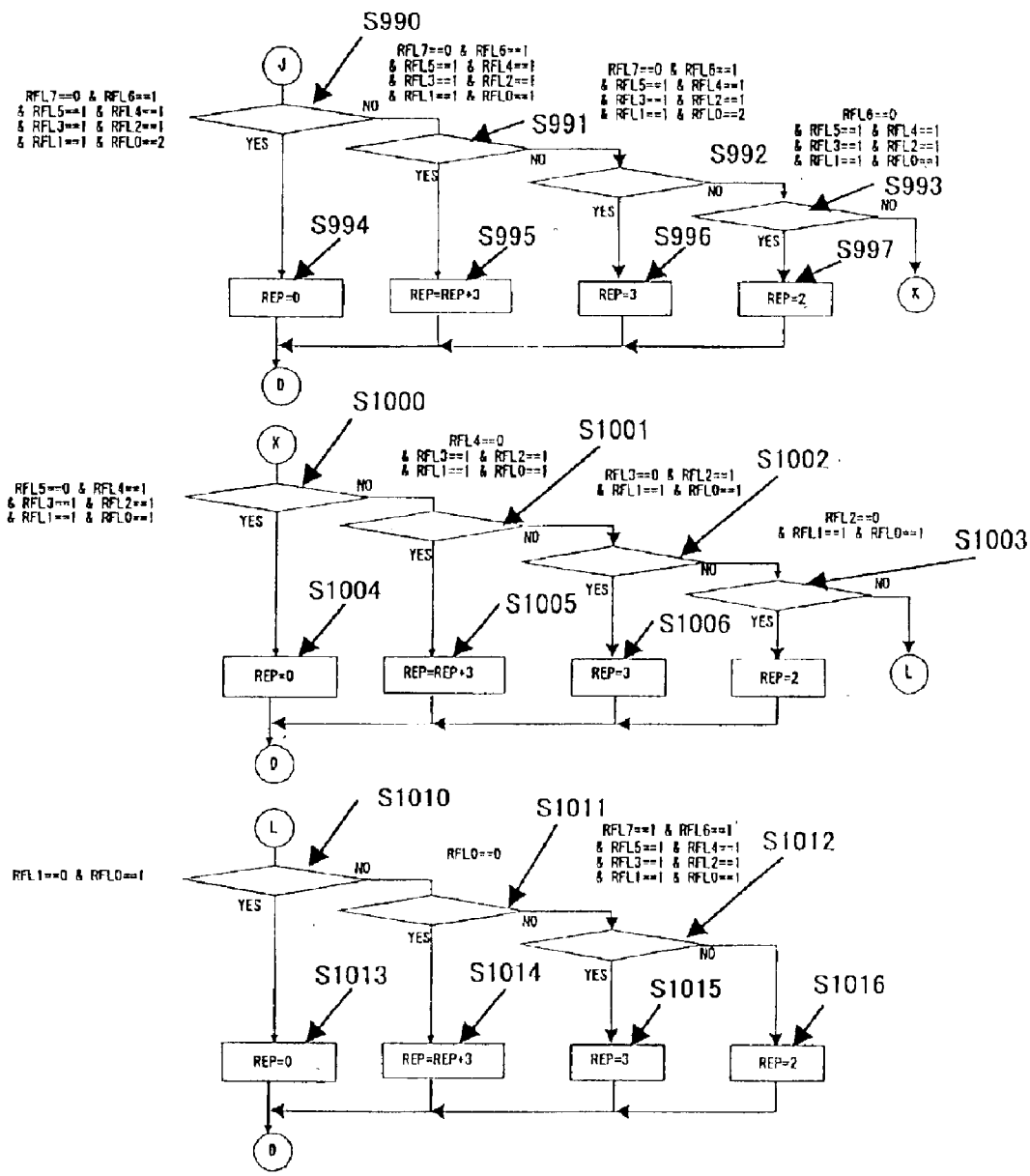
FIG. 32 is a flow chart for explaining the process of the step S467 shown in FIG. 24.

FIG. 24 is a flow chart for explaining a process of the repetition number generating unit 272. In addition, FIGS. 30 through 32 are flow charts for explaining a process of a step S467 shown in FIG. 24 which generates the repetition number REP.

First, a description will be given of the process shown in FIG. 24. The process shown in FIG. 24 obtains a plurality of repetition numbers from the repetition flags. The repetition number is obtained at each position where the repetition ends.

Steps S401, S402 and S403 shown in FIG. 24 obtain the repetition number of the $8^{th}$ bit. If the repetition flag RF7 is 0, the comparison result in the repetition flag generating unit 271 indicates no match. Hence, the repetition number up to the present is calculated, and the step S403 substitute the repetition number REP up to the present into WREP7. If the repetition flag RF7 is 1, the repetition is continuing, and thus, the step S402 sets the repetition number WREP7 to 0.

Steps S404, S405 and S406 obtain the repetition number of the $7^{th}$ bit. If the step S404 judges that the repetition flag RF7 is 1 and the repetition flag RF6 is 0, the step S406 sets in the repetition number WREP6 a sum of the repetition number REP up to the present and the present repetition number 1 (since RFL7=1). If the judgement result in the step S404 is NO, the step S405 sets the repetition number WREP6 to 0.

Steps S407 through S411 similarly obtain the repetition number of the $6^{th}$ bit, and steps S412 through S418 similarly obtain the repetition number for the $5^{th}$ bit. Steps S419 through S427 similarly obtain the repetition number for the $4^{th}$ bit, and steps S428 through S438 similarly obtain the repetition number for the $3^{rd}$ bit. Steps S439 through S451 similarly obtain the repetition number for the $2^{nd}$ bit, and steps S452 through S466 similarly obtain the repetition number for the $1^{st}$ bit. Furthermore, a step S467 carries out a process of obtaining the repetition number REP which is to be carried over to the next word. The processing contents of this step S467 are shown in FIGS. 30 through 32.

In FIG. 30, a step S901 judges whether or not the repetition flag RFL7 is 2. If the judgement result in the step S901 is YES, the value of the run length having the highest (first) priority order cannot be determined, and thus, a step S905 holds the repetition number REP up to the present.

If the judgement result in the step S901 is NO, a step S902 judges whether or not the repetition flag RFL7 is 0 and the repetition flag RFL6 is 2. If the judgement result in the step S902 is YES, the run length having the highest priority order is not a repetition and no run length exists thereafter, so a step S906 sets the repetition number REP to 0.

If the judgement result in the step S902 is NO, a step S903 judges whether or not the repetition flag RFL7 is 1 and the repetition flag RFL6 is 2. If the judgement result in the step S903 is YES, the run length having the highest priority order is a repetition, and no run length exists thereafter, so a step S907 sets a sum of the repetition number REP up to the present and the present repetition number 1 to the repetition number REP.

If the judgement result in the step S903 is NO, a step S904 judges whether or not the repetition flag RFL6 is 0 and the repetition flag RFL5 is 2. If the judgement result in the step S904 is YES, the repetition number carried over to the next pattern is 0 if a valid termination is 0 (RFL6 is the termination in this case since RFL5 is 2), regardless of the value of the repetition flag RFL7. Hence, if the judgement result in the step S904 is YES, a step S908 sets 0 to the repetition number REP.

Steps S910 through S917, S920 through S927 and S930 through S933 shown in FIG. 30, steps S940 through S947, S950 through S957, S960 through S967, S970 through S977 and S980 through S985 shown in FIG. 31, and steps 990 through S997, S1000 through S1006 and S1010 through S1016 shown in FIG. 32 are carried out to make judgements and setting of the repetition number based on the judgements, similarly to the steps S901 through S908, for all combinations.

Figure 27:
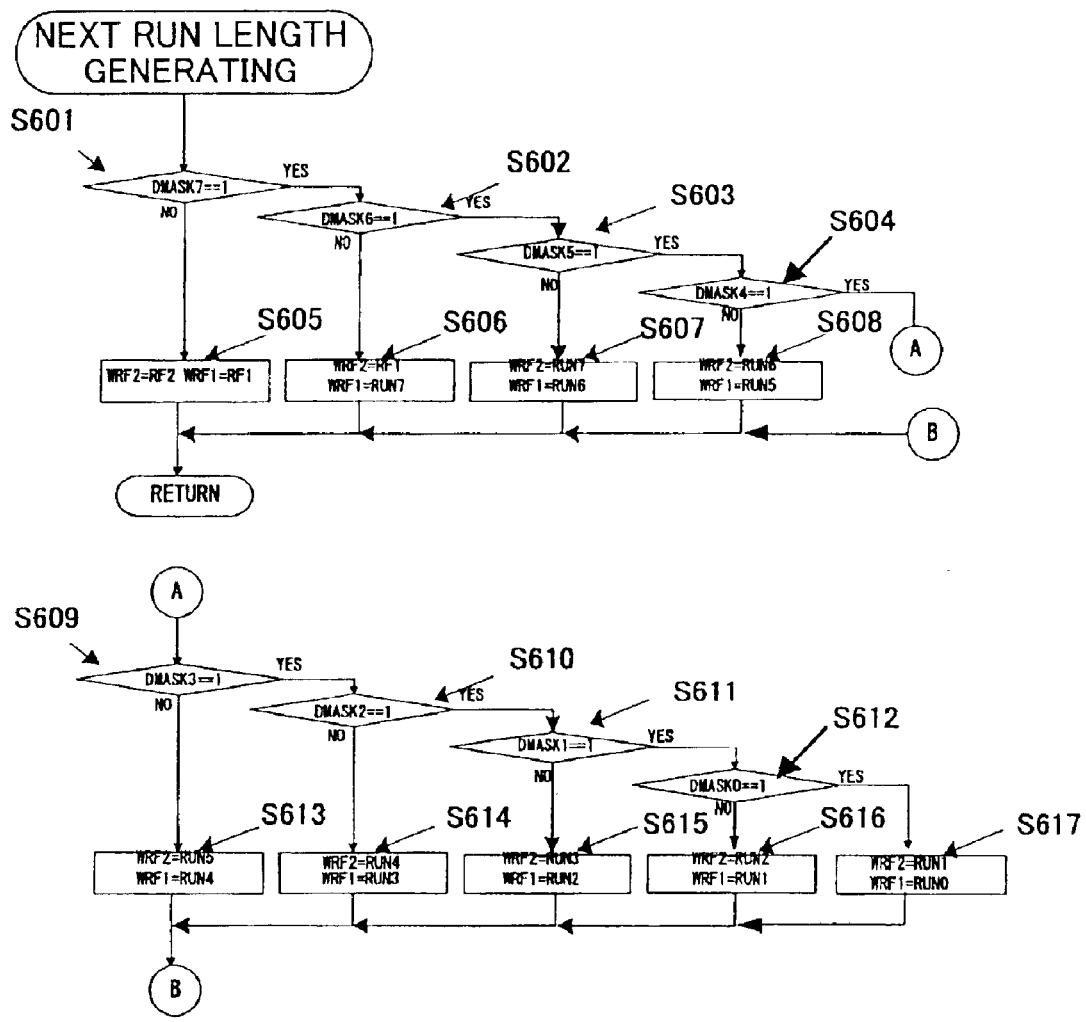
FIG. 27 is a flow chart for explaining a process of a next run length generating unit.

FIG. 27 is a flow chart for explaining a process of the next run length generating unit 277.In FIG. 27, a step S601 judges whether or not the mask value DMASK7 having the highest priority order is 1. If DMASK7 is 0 and the judgement result in the step S601 is NO, no closed run length exists in this pattern, and thus, a step S605 continues the second and first from the last of the previous pattern. In other words, the value of RF2 is substituted into WRF2, and the value of RF1 is substituted into WRF1.

If DMASK7 is 1 and the judgement result in the step S601 is YES, a step S602 judges whether or not the mask value DMASK6 is 1. If the judgement result in the step S602 is NO, only 1 run length exists, and thus, a step S606 substitutes the value of RUN7 into the run length WRF1 of two run lengths before the last, and substitutes the value of the first RF1 from the last of the previous pattern into the run length WRF2 which is one run length before the last.

If DMASK6 is 1 and the judgement result in the step S602 is YES, a step S603 judges whether or not the mask value DMASK5 is 1. If the judgement result in the step S603 is NO, only 2 run lengths exist, and thus, a step S607 substitutes the value of RUN6 into the run length WRF1 of two run lengths before the last, and substitutes the value of RUN7 into the run length WRF2 which is one run length before the last.

If DMASK5 is 1 and the judgement result in the step S603 is YES, a step S604 judges whether or not the mask value DMASK4 is 1. If the judgement result in the step S604 is NO, only 3 run lengths exist, and thus, a step S608 substitutes the value of RUN5 into the run length WRF1 of two run lengths before the last, and substitutes the value of RUN6 into the run length WRF2 which is one run length before the last.

If DMASK4 is 1 and the judgement result in the step S604 is YES, a step S609 judges whether or not the mask value DMASK3 is 1. If the judgement result in the step S609 is NO, only 4 run lengths exist, and thus, a step S613 substitutes the value of RUN4 into the run length WRF1 of two run lengths before the last, and substitutes the value of RUN5 into the run length WRF2 which is one run length before the last.

If DMASK3 is 1 and the judgement result in the step S609 is YES, a step S610 judges whether or not the mask value DMASK2 is 1. If the judgement result in the step S610 is NO, only 5 run lengths exist, and thus, a step S614 substitutes the value of RUN3 into the run length WRF1 of two run lengths before the last, and substitutes the value of RUN4 into the run length WRF2 which is one run length before the last.

If DMASK2 is 1 and the judgement result in the step S610 is YES, a step S611 judges whether or not the mask value DMASK1 is 1. If the judgement result in the step S611 is NO, only 6 run lengths exist, and thus, a step S615 substitutes the value of RUN2 into the run length WRF1 of two run lengths before the last, and substitutes the value of RUN3 into the run length WRF2 which is one run length before the last.

If DMASK1 is 1 and the judgement result in the step S611 is YES, a step S612 judges whether or not the mask value DMASK0 is 1. If the judgement result in the step S612 is NO, only 7 run lengths exist, and thus, a step S616 substitutes the value of RUN1 into the run length WRF1 of two run lengths before the last, and substitutes the value of RUN2 into the run length WRF2 which is one run length before the last.

If DMASK0 is 1 and the judgement result in the step S603 is YES, only 8 run lengths exist, and thus, a step S617 substitutes the value of RUN0 into the run length WRF1 of two run lengths before the last, and substitutes the value of RUN1 into the run length WRF2 which is one run length before the last.

Figure 8:
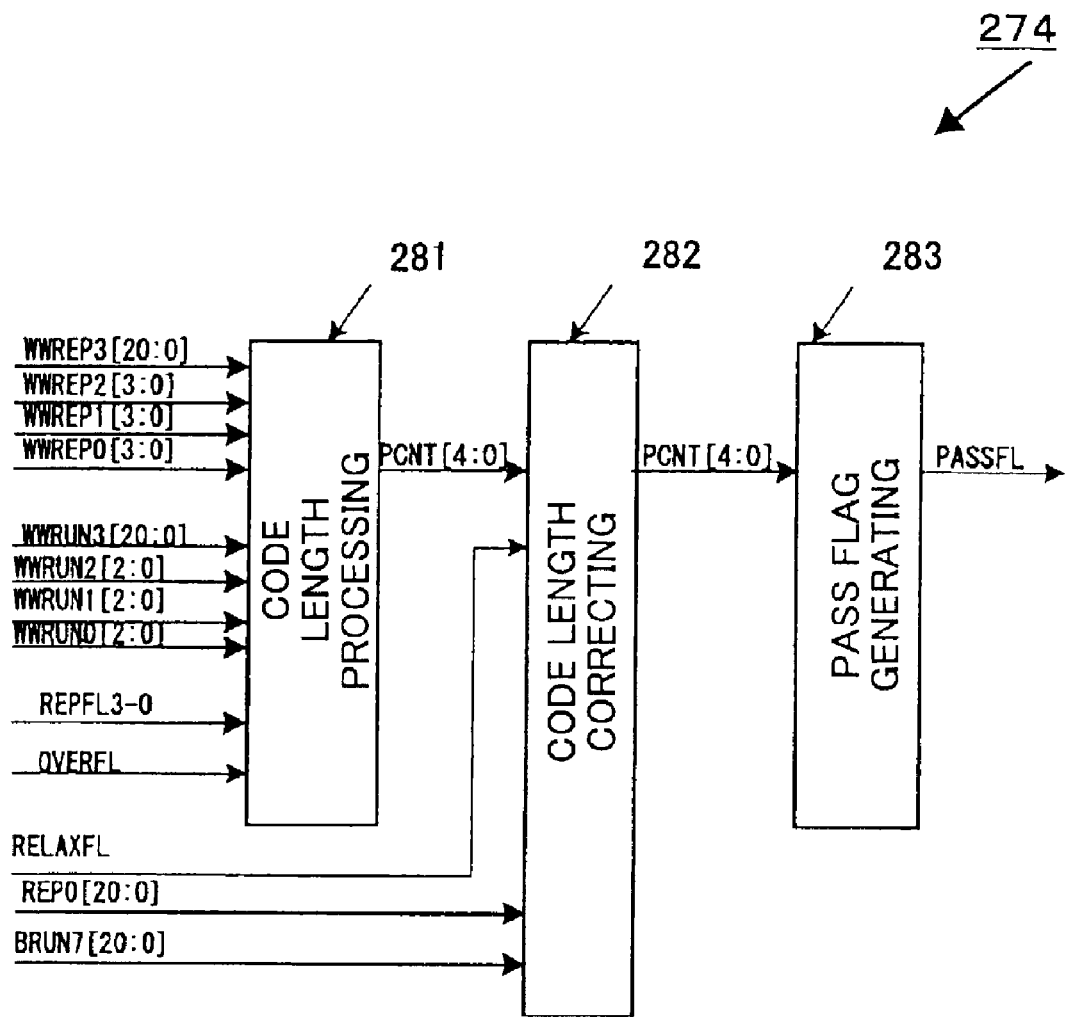
FIG. 8 is a system block diagram showing a structure of a pass judging unit.

FIG. 8 is a system block diagram showing a structure of the pass judging unit 274. In FIG. 8, a code length processing unit 281 receives a maximum of 4 run lengths WWRUN3 through WWRUN0, a maximum of 4 repetition numbers WWREP3 through WWREP0, the valid flags REPFL3 through REPFL0 of these run lengths and repetition numbers, and the over flag OVERFL, and calculates the code length. The over flag OVERFL indicates that the code length is over when the run length and the repetition number exceed 4, without having the check the run length.

A code length correcting unit 282 receives the halfway run length BRUN7 and the halfway repetition number REP0 which are not closed, and a suppression relaxation flag RELAXFL from the next word check processing unit 204, and corrects the code length. By this code length correcting process, in the word (8 bits in this case) which is presently being coded, the halfway run length which is not closed and the halfway repetition number which is not closed are sectioned at the word boundary (refer to Particular Example 2) in FIG. 12 and Particular Examples 3) and 4) in FIG. 13) if the next word is to be subjected to pass coding, and the halfway run length and the halfway repetition number are changed into the run length which is closed and the repetition number which is closed. For this reason, it is necessary to check the code length of the next word and judge whether or not the pass coding is to be made. But this in turn necessitates judging whether or not the pass coding is to be made for each of the subsequent words, thereby making the judgement limitless. Accordingly, it is basically considered that the pass coding is to be made for the next word, and the code length correcting process adds the halfway run length which is not closed and the halfway repetition number which is not closed to the code length. However, the next word check processing unit 204 can check that the next word is not to be subjected to the pass coding within a portion sectioned by the word boundary thereof, so as to generate the suppression relaxation flag RELAXFL, and the code length correcting process of the code length correcting unit 282 can be relaxed based on the suppression relaxation flag RELAXFL. In this particular case, the next word check processing unit 204 checks whether or not the next word is all repetitions, and if so, it is judged that the pass coding is not to be carried out for the next word, and the suppression relaxation flag RELAXFL is generated.

A pass flag generating unit 283 compares the obtained code length and a predetermined threshold value which is used to judge whether or not the conversion to the pass code is to be made. The pass flag generating unit 283 sets a pass coding flag PASSFL to "1" if the code length is greater than or equal to the predetermined threshold value.

Figure 33:
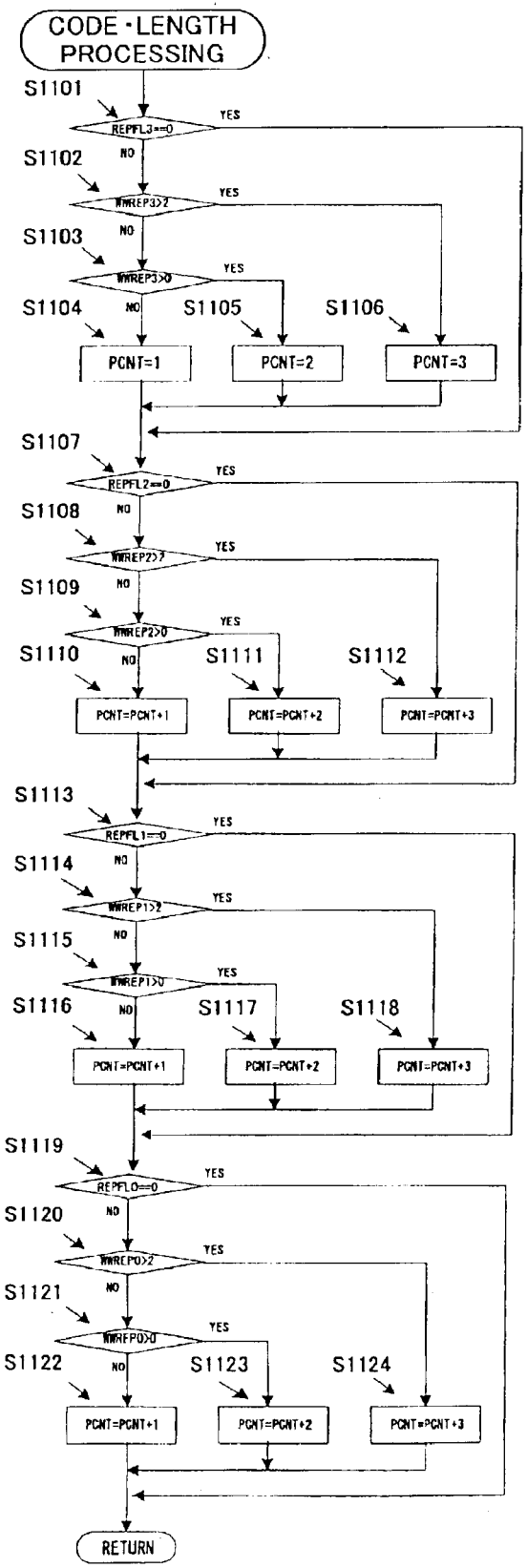
FIG. 33 is a flow chart for explaining a process of a code length processing unit.

FIG. 33 is a flow chart for explaining a process of the code length processing unit 281. In FIG. 33, a step S1101 judges whether or not the valid flag REPFL3 is 0, so as to judge whether or not the first run length WWRUN3 and the repetition number WWREP3 are valid. If the first run length WWRUN3 and the repetition number WWREP3 are valid and the judgement result in the step S1101 is NO, steps S1102 through S1106 are carried out.

The step S1102 judges whether or not the first repetition number WWREP3 is 2 or greater. If the judgement result in the step S1102 is YES, a step S1106 sets 3, which is a sum of the code length 2 of the repetition number and the code length 1 of the run length, into a code length PCNT, based on the code format shown in FIG. 11. In this case, the run length and the repetition number are considered with reference to the 8 bits which are simultaneously processed in parallel, so that a run length of 8 or more and a run length of a numerical value 8 regarded as having the same code length.

If the judgement result in the step S1102 is NO, the step S1103 judges whether or not the repetition number WWREP3 is 1. If the judgement result in the step S1103 is YES, the step S1105 sets 2, which is a sum of the code length 1 of the repetition number and the code length 1 of the run length, into the code length PCNT, based on the code format shown in FIG. 11.

If the repetition number WWREP3 is 0 and the judgement result in the step S1103 is NO, the step S1104 sets the code length 1 of the run length into the code length PCNT.

Next, a step S1107 judges whether or not the valid flag REPFL2 is 0, so as to judge whether or not the next run length WWRUN2 and the repetition number WWREP2 are valid. If the next run length WWRUN2 and the repetition number WWREP2 are valid and the judgement result in the step S1107 is NO, steps S1108 through S1112 are carried out.

The step S1108 judges whether or not the repetition number WWREP2 is 2 or greater. If the judgement result in the step S1108 is YES, a step S1112 adds 3, which is a sum of the code length 2 of the repetition number and the code length 1 of the run length, to the code length PCNT, based on the code format shown in FIG. 11.

If the judgement result in the step S1108 is NO, the step S1109 judges whether or not the repetition number WWREP2 is 1. If the judgement result in the step S1109 is YES, the step S111 adds 2, which is a sum of the code length 1 of the repetition number and the code length 1 of the run length, to the code length PCNT, based on the code format shown in FIG. 11.

If the repetition number WWREP2 is 0 and the judgement result in the step S1109 is NO, the step S1110 adds the code length 1 of the run length to the code length PCNT.

Next, a step S1113 judges whether or not the valid flag REPFL1 is 0, so as to judge whether or not the next run length WWRUN1 and the repetition number WWREP1 are valid. If the next run length WWRUN1 and the repetition number WWREP1 are valid and the judgement result in the step S1113 is NO, steps S1114 through S1118 are carried out.

The step S1114 judges whether or not the repetition number WWREP1 is 2 or greater. If the judgement result in the step S1114 is YES, a step S1118 adds 3, which is a sum of the code length 2 of the repetition number and the code length 1 of the run length, to the code length PCNT, based on the code format shown in FIG. 11.

If the judgement result in the step S1114 is NO, the step S1115 judges whether or not the repetition number WWREP1 is 1. If the judgement result in the step S1115 is YES, the step S1117 adds 2, which is a sum of the code length 1 of the repetition number and the code length 1 of the run length, to the code length PCNT, based on the code format shown in FIG. 11.

If the repetition number WWREP1 is 0 and the judgement result in the step S1115 is NO, the step S1116 adds the code length 1 of the run length to the code length PCNT.

Next, a step S1119 judges whether or not the valid flag REPFL0 is 0, so as to judge whether or not the next run length WWRUN0 and the repetition number WWREP0 are valid. If the next run length WWRUN0 and the repetition number WWREP0 are valid and the judgement result in the step S1119 is NO, steps S1120 through S1114 are carried out.

The step S1120 judges whether or not the repetition number WWREP0 is 2 or greater. If the judgement result in the step S1120 is YES, a step S1124 adds 3, which is a sum of the code length 2 of the repetition number and the code length 1 of the run length, to the code length PCNT, based on the code format shown in FIG. 11.

If the judgement result in the step S1120 is NO, the step S1121 judges whether or not the repetition number WWREP0 is 1. If the judgement result in the step S1121 is YES, the step S1123 adds 2, which is a sum of the code length 1 of the repetition number and the code length 1 of the run length, to the code length PCNT, based on the code format shown in FIG. 11.

If the repetition number WWREP0 is 0 and the judgement result in the step S1121 is NO, the step S1122 adds the code length 1 of the run length to the code length PCNT.

Figure 34:
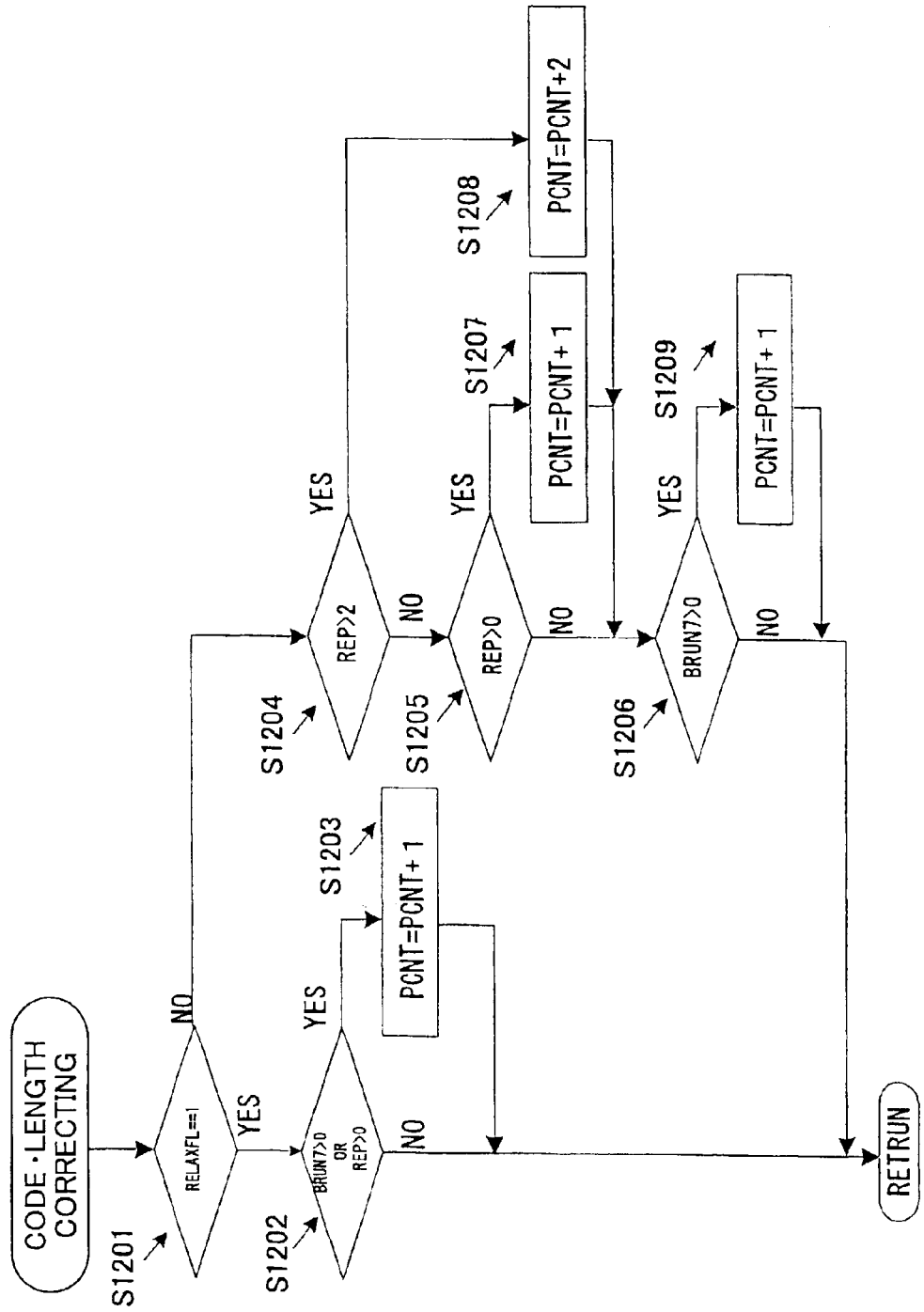
FIG. 34 is a flow chart for explaining a process of a code length correcting unit.

FIG. 34 is a flow chart for explaining a process of the code length correcting unit 282. In FIG. 34, a step S1201 judges whether or not the suppression relaxation flag RELAXFL is "1", and the process advances to a step S1204 if the judgement result is NO. The step S1204 judges whether or not the halfway repetition number REP is 2 or greater. If the judgement result in the step S1204 is YES, a step S1208 adds 3, which is a sum of the code length 2 of the repetition number and the code length 1 of the run length, to the code length PCNT, based on the code format shown in FIG. 11. In this case, the run length and the repetition number are considered with reference to the 8 bits which are simultaneously processed in parallel, so that a run length of 8 or more and a run length of a numerical value 8 regarded as having the same code length.

If the judgement result in the step S1204 is NO, the step S1205 judges whether or not the repetition number REP is greater than 0. If the repetition number REP is 1 and the judgement result in the step S1205 is YES, the step S1207 adds 2, which is a sum of the code length 1 of the repetition number and the code length 1 of the run length, to the code length PCNT, based on the code format shown in FIG. 11. If the judgement result in the step S1205 is NO, a step S1206 judges whether or not the halfway run length BRUN7 is greater than 0. If the halfway run length BRUN7 is greater than 0 and the judgement result in the step S1206 is YES. A step S1209 adds the code length 1 of the run length to the code length PCNT. The process ends after the step S1209 or if the judgement result in the step S1206 is NO.

On the other hand, if the judgement result in the step S1201 is YES, a step S1202 judges whether or not the halfway run length BRUN7 is greater than 0 or the repetition number REP is greater than 0. If the judgement result in the step S1202 is YES, a step S1203 adds the code length 1 of the run length to the code length PCNT. The process ends after the step S1203 or if the judgement result in the step S1202 is NO.

Figure 35:
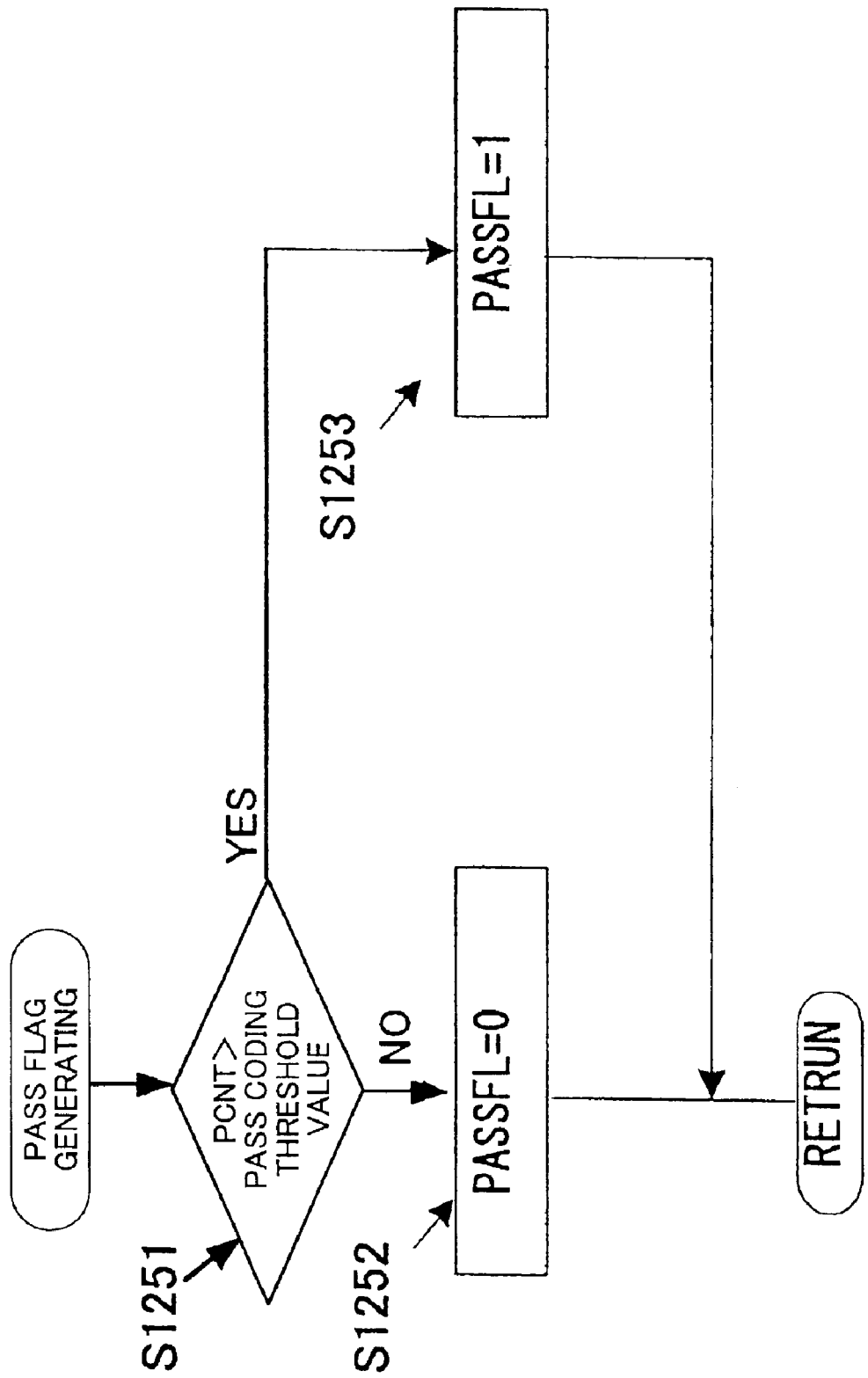
FIG. 35 is a flow chart for explaining a process of a pass flag generating unit.

FIG. 35 is a flow chart for explaining a process of the pass flag generating unit 283. In FIG. 35, a step S1251 judges whether or not the code length PCNT is greater than the pass coding threshold value. If the judgement result in the step S1251 is YES, a step S1253 sets the pass coding flag PASSFL to "1", and the process ends. On the other hand, if the judgement result in the step S1251 is NO, a step S1252 sets the pass coding flag PASSFL to "0", and the process end.

[Coding Processing Unit 206 of Image Compression Apparatus 106e]

Figure 9:
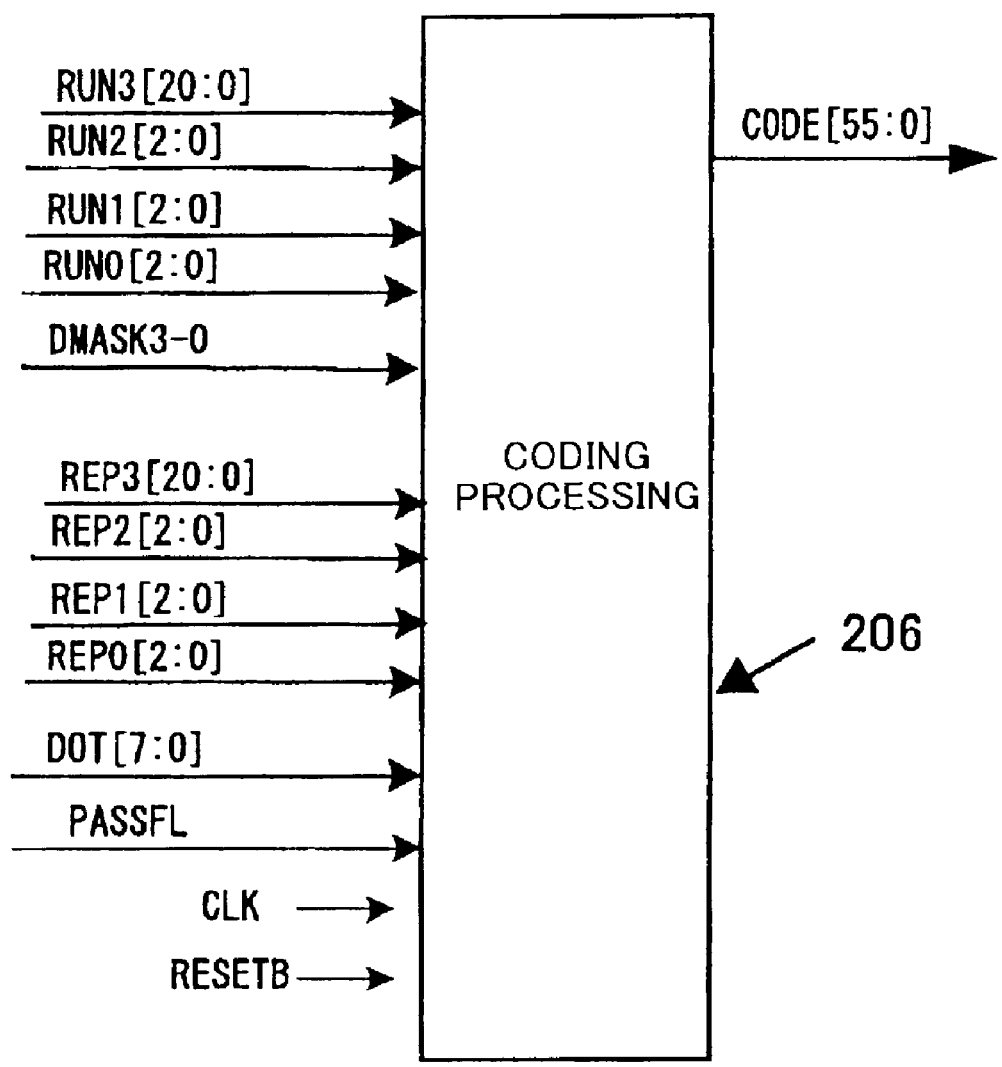
FIG. 9 is a system block diagram showing input and output signals of a coding processing unit.

FIG. 9 is a system block diagram showing input and output signals of the coding processing unit 206. The coding processing unit 206 shown in FIG. 9 receives a maximum of 4 run lengths RUN3 through RUN0, repetition numbers REP3 through REP0 and mask values DMASK3 through DMASK0 thereof, and outputs a code CODE having a format for every 4 bits as described above in conjunction with FIG. 11. Of course, the code format is not limited to that shown in FIG. 11, and the code may have a format for every predetermined number of bits other than 4 bits.

Figure 26:
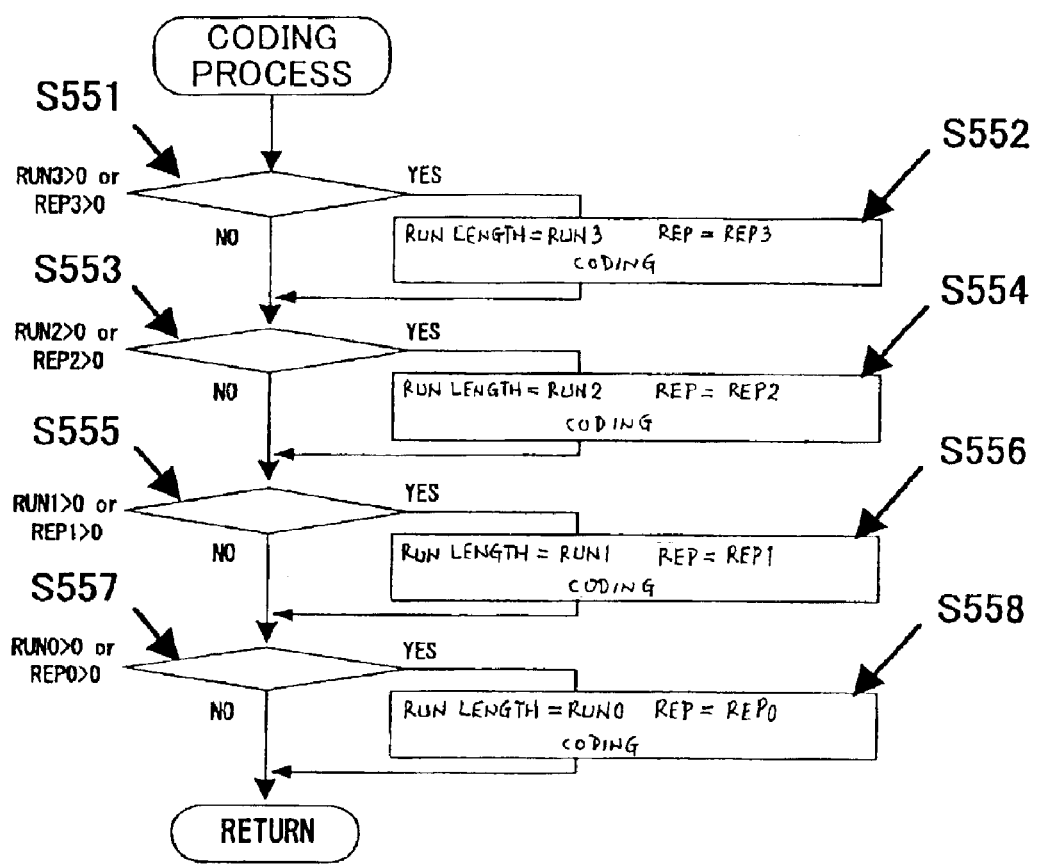
FIG. 26 is a flow chart for explaining a general process of the coding processing unit.

FIG. 26 is a flow chart for explaining a general process of the coding processing unit 206. As shown in FIG. 26, steps S551, S553, S555 and S557 check whether or not the 4 run lengths and repetition numbers are greater than 0, and steps S552, S554, S556 and S558 codes the run lengths and repetition numbers greater than 0.

Figure 10:
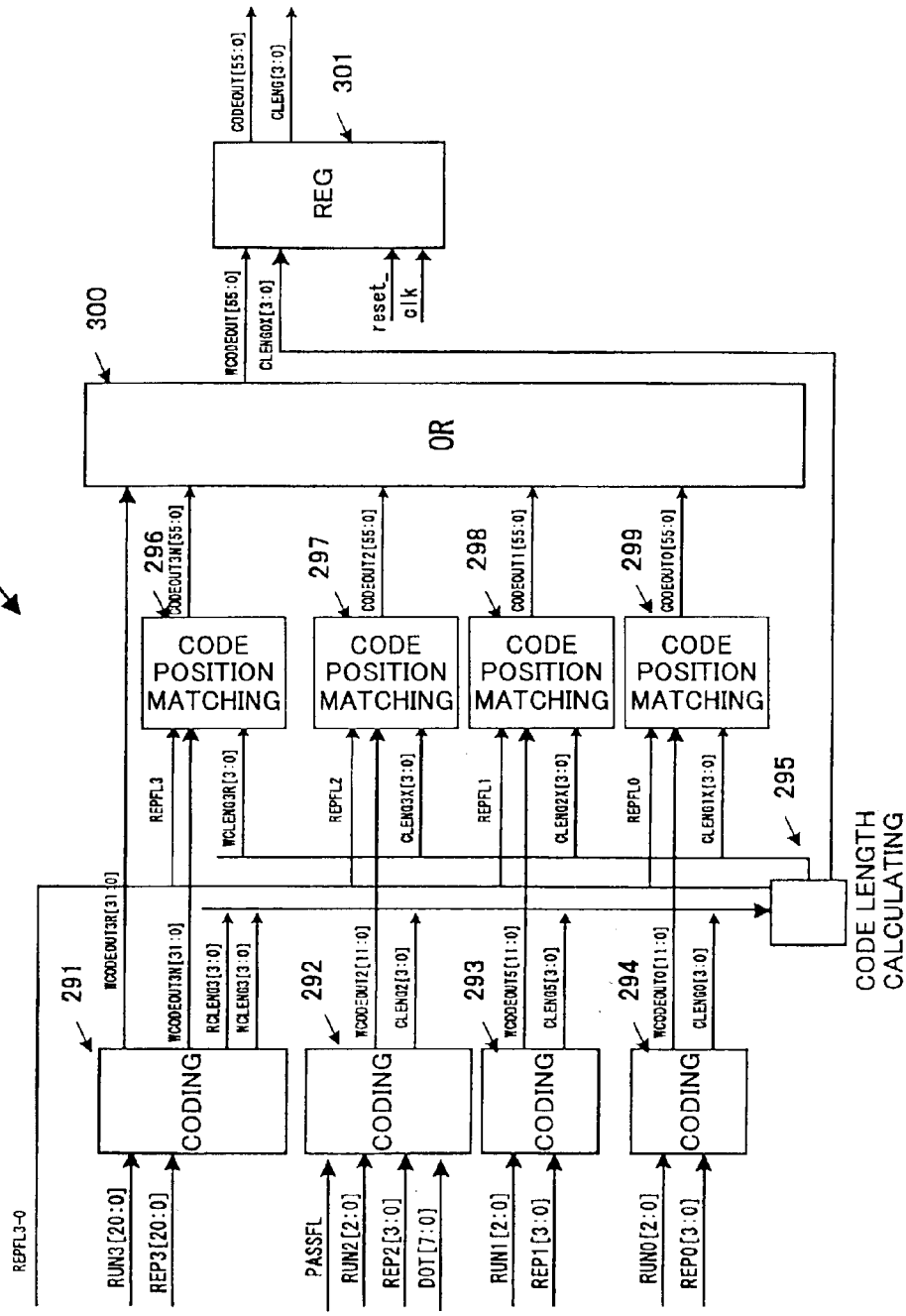
FIG. 10 is a system block diagram showing an internal structure of the coding processing unit.

FIG. 10 is a system block diagram showing an internal structure of the coding processing unit 206. In FIG. 10, a coding unit 291 codes the run length RUN3 and the repetition number REP3. The details of this coding unit 291 will be described later in conjunction with FIG. 28. The coding unit 291 codes the halfway run length and the halfway repetition number of the previous word when carrying out the pass coding, and outputs a code WCODEOUT3R and a code length RCLENG3 of the repetition number, and a code WCODEOUT3N and a code length NCLENG3 of the run length.

A coding unit 292 codes the run length RUN2 and the repetition number REP2. The details of this coding unit 292 will be described later in conjunction with FIG. 29. The coding unit 292 codes a DOT value of the present word as the pass code, when carrying out the pass coding, and outputs a code WCODEOUT2 and a code length CLENG2 of the repetition number and run length. The coding unit 292 also receives the pass coding flag PASSFL and the DOT value in addition to the run length RUN2 and the repetition number REP2.

A coding unit 293 codes the run length RUN1 and the repetition number REP1, and outputs a code WCODEOUT1 and a code length CLENG1 of the repetition number and run code. This coding unit 293 carries out the process shown in FIG. 28.

A coding unit 294 codes the run length RUN0 and the repetition number REP0, and outputs a code WCODEOUT0 and a code length CLENG0 of the repetition number and run code. This coding unit 294 carries out the process shown in FIG. 28.

A code length calculating unit 295 calculates code lengths WCLENG3R, WCLENG3X, WCLENG2X and CLENGLX at each position, and supplies the code lengths WCLENG3R, WCLENG3X, WCLENG2X and CLENG1X to code position matching units 296, 297, 298 and 299, respectively. In addition, the code length calculating unit 295 supplies a total code length CLENG0X to a register 301.

The code position matching unit 296 shifts the code WCODEOUT2N output from the coding unit 291 by WCLENG3X (=RCLENG3) and transfers the shifted result to an OR unit 300. The code position matching unit 297 shifts the code WCODEOUT2 output from the coding unit 292 by CLENG3X (=RCLENG3+NCLENG3), and transfers the shifted result to the OR unit 300. The code position matching unit 298 shifts the code WCODEOUT1 output from the coding unit 293 by CLENG2X (=RCLENG3+NCLENG3+CLENG2), and transfers the shifted result to the OR unit 300. The code position matching unit 299 shifts the code WCODEOUT0 output from the coding unit 294 by CLENG1X (=RCLENG3+NCLENG3+CLENG2+CLENG1), and transfers the shifted result to the OR unit 300.

The OR unit 300 carries out an OR operation with respect to the code WCODEOUT3R of the repetition number output from the coding unit 291 and the position matched codes output from the code position matching units 296, 297, 298 and 299, and transfers an operation result to the register 301. The register 301 stores a code which is converted from a maximum of 4 codes and the valid length of the code. The contents of the register 301 are transferred to the code writing unit 207.

Figure 28:
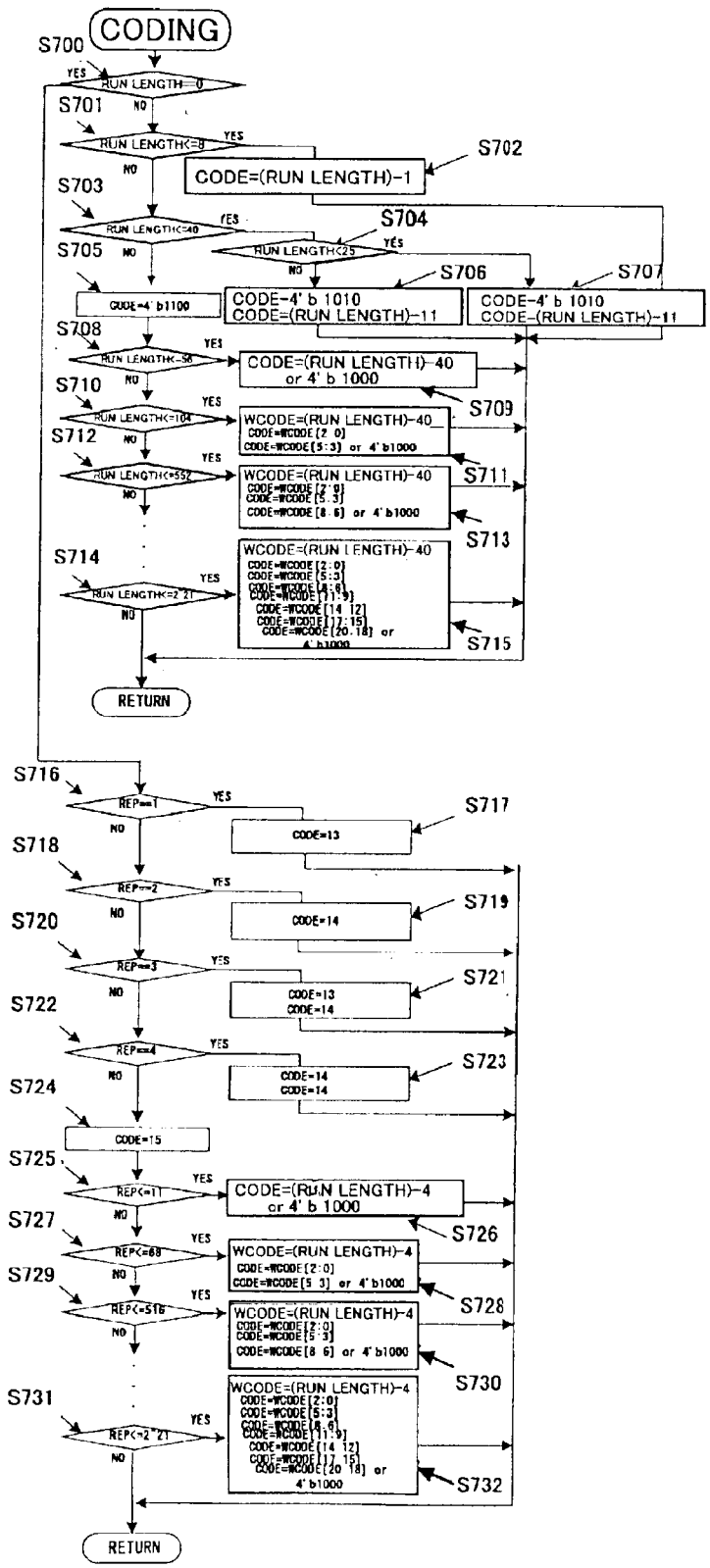
FIG. 28 is a flow chart for explaining processes of coding units within the coding processing unit.

A description will now be given of the processes of the coding units 291, 292 and 294, by referring to FIG. 28. FIG. 28 is a flow chart for explaining processes of coding units 291, 292 and 294 within the coding processing unit 206. In FIG. 28, "CODE=" indicates a DMA transfer of the code or a writing of the code to a memory unit such as the memory 110.

In FIG. 28, a step S700 judges whether or not the run length is 0. If the judgement result in the step S700 is NO, a step S701 judges whether or not the run length is 8 or less. If the judgement result in the step S701 is YES, a step S702 sets as the code a value which is obtained by subtracting 1 from the run length.

If the judgement result in the step S701 is NO, a step S703 judges whether or not the run length is 9 or greater but 40 or less. If the judgement result in the step S703 is YES, a step S704 judges whether or not the run length is 24 or less. If the judgement result in the step S704 is YES, a step S707 adds a 4-bit header "1010", and sets as the code a value which is obtained by subtracting 11 from the next run length. If the judgement result in the step S704 is NO, a step S706 adds a 4-bit header "1011", and sets as the code a value which is obtained by subtracting 11 from the next run length.

If the judgement result in the step S703 is NO, a step S705 adds a 4-bit header "1100", and steps S708 through S715 are carried out to make a smaller representation of the code length, by employing a numeric representation which uses the $4^{th}$ bit of the 4-bit data as a termination flag.

If the run length is 0 and the judgement result in the step S700 is YES, a step S716 judges whether or not the repetition number REP is 1. If the judgement result in the step S716 is YES, a step S717 sets the code CODE to 13. If the judgement result in the step S716 is NO, a step S718 judges whether or not the repetition number REP is 2. If the judgement result in the step S718 is YES, a step S719 sets the code CODE to 14. If the judgement result in the step S718 is NO, a step S720 judges whether or not the repetition number REP is 3. If the judgement result in the step S720 is YES, a step S721 sets the code CODE to 13 and 14. If the judgement result in the step S720 is NO, a step S722 judges whether or not the repetition number REP is 4. If the judgement result in the step S722 is YES, a step S723 sets the code CODE to 14 and 14. If the judgement result in the step S722 is NO, a step S724 sets the code CODE is 15 and adds a 4-bit header "1111". Then, steps S725 through S732 are carried out to make a smaller representation of the code length, by employing a numeric representation which uses the $4^{th}$ bit of the 4-bit data as a termination flag, similarly to the steps S708 through S715.

Figure 29:
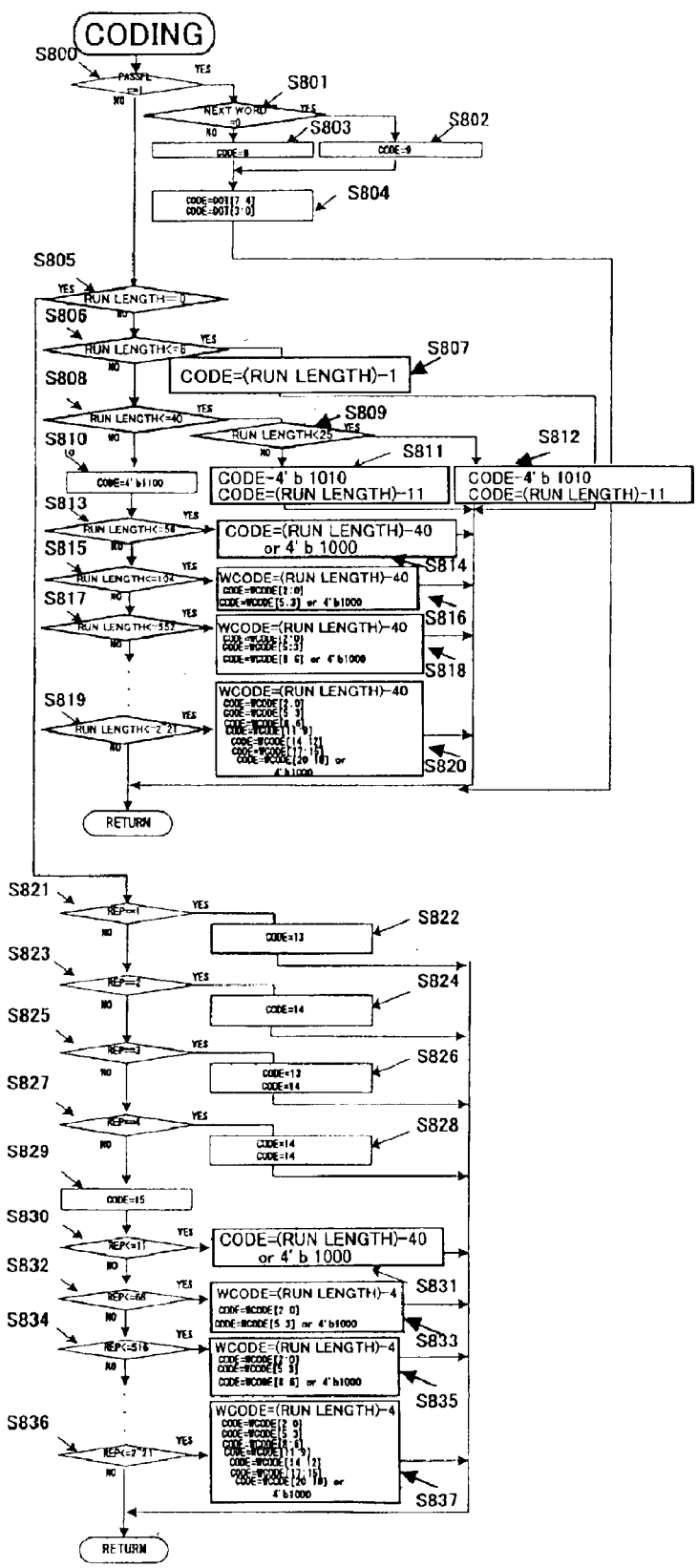
FIG. 29 is a flow chart for explaining a process of a coding unit within the coding processing unit.

FIG. 29 is a flow chart for explaining a process of the coding unit 292 within the coding processing unit 206. In FIG. 29, "CODE=" indicates a DMA transfer of the code or a writing of the code to a memory unit such as the memory 110.

In FIG. 29, a step S800 judges whether or not the pass coding flag PASSFL is "1". Steps S801 through S804 are carried out if the judgement result in the step S800 is YES. In other words, the header is obtained from the MSB of the next word, and the header is set to 9 if the MSB is "1", and the header is set to 8 if the MSB is "0". The step S804 adds the word which is to be coded, as it is, as the code.

If the pass coding flag PASSFL is "0" and the judgement result in the step S800 is NO, a step S805 judges whether or not the run length is 0. If the judgement result in the step S805 is NO, a step S806 judges whether or not the run length is 8 or less. If the judgement result in the step S806 is YES, a step S807 sets as the code a value which is obtained by subtracting 1 from the run length.

If the judgement result in the step S806 is NO, a step S808 judges whether or not the run length is 9 or greater but 40 or less. If the judgement result in the step S808 is YES, a step S809 judges whether or not the run length is 24 or less. If the judgement result in the step S809 is YES, a step S812 adds a 4-bit header "1010", and sets as the code a value which is obtained by next subtracting 11 from the run length. On the other hand, if the judgement result in the step S809 is NO, a step S811 adds a 4-bit header "1011", and sets as the code a value which is obtained by next subtracting 11 from the run length.

If the judgement result in the step S808 is NO, a step S810 adds a 4-bit header "1100", and steps S813 through S820 are carried out to make a smaller representation of the code length, by employing a numeric representation which uses the $4^{th}$ bit of the 4-bit data as a termination flag.

On the other hand, if the judgement result in the step S805 is YES, a step S821 judges whether or not the repetition number REP is 1. If the judgement result in the step S821 is YES, a step S822 sets the code CODE to 13. If the judgement result in the step S821 is NO, a step S823 judges whether or not the repetition number REP is 2. If the judgement result in the step S823 is YES, a step S824 sets the code CODE to 14. If the judgement result in the step S823 is NO, a step S825 judges whether or not the repetition number REP is 3. If the judgement result in the step S825 is YES, a step S826 sets the code CODE to 13 and 14. If the judgement result in the step S825 is NO, a step S827 judges whether or not the repetition number REP is 4. If the judgement result in the step S827 is YES, a step S828 sets the code CODE to 14 and 14. If the judgement result in the step S827 is NO, a step S829 sets the code CODE is 15 and adds a 4-bit header "1111". Then, steps S830 through S837 are carried out to make a smaller representation of the code length, by employing a numeric representation which uses the $4^{th}$ bit of the 4-bit data as a termination flag, similarly to the steps S813 through S820.

Therefore, portions of the run length processing unit 203 and the pass judging and repetition processing unit 205 form a first processing means (or first processing step) of the image compression apparatus (or method), and the coding processing unit 206 forms a second processing means (or second processing step) of the image compression apparatus (or method). In addition, the pass judging unit 274 of the pass judging and repetition processing unit 205 forms a third processing means (or third processing step) of the image compression apparatus (or method). The next word check processing unit 204 forms a fourth processing means (or fourth processing step) of the image compression apparatus (or method). The first through fourth processing means (or first through fourth processing steps) of the image compression apparatus (or method) are referred to in the Summary of the Invention section of this specification.

In the embodiment described above, the processing is carried out in units of 8 bits, but the processing unit is of course not limited to 8 bits. For example, the processing may be made in units of 16 bits, and in this case, 4 run counters may be provided to process the data for every 4 bits or, 2 run counters may be provided to process the data for every 8 bits or, 1 run counter may be provided to process the data for every 16 bits.

[Image Expansion Apparatus 106d]

A description will now be given of the embodiment of the image expansion apparatus 106d according to the present invention. This image expansion apparatus 106d carries out a process to restore the original image data from the coded data which is obtained by compressing the image data by the image compression apparatus 106e described above.

Figure 36:
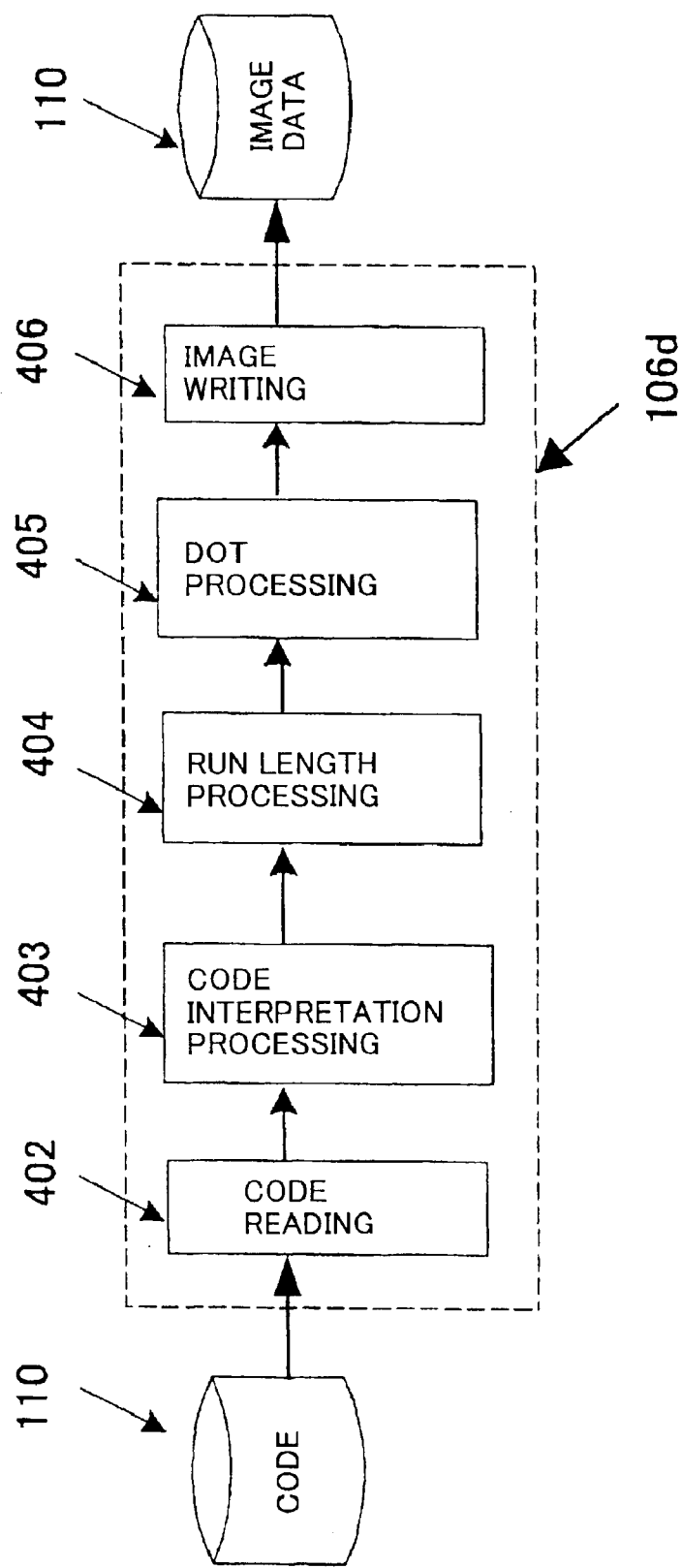
FIG. 36 is a system block diagram showing an entire structure of an image expansion apparatus.

FIG. 36 is a system block diagram showing an entire structure of the image expansion apparatus 106d. In FIG. 36, a code reading unit 402 reads the coded data from the memory 110. A code interpretation processing unit 403 interprets the coded data read by the code reading unit 402, and converts the coded data into the run length (length of 0-value and length of 1-value) or the repetition number. A run length processing unit 404 receives the run length and the repetition number from the code interpretation processing unit 403, and develops the run length into an amount corresponding to the repetition number, so as to transfer the necessary run length to a DOT processing unit 405. The DOT processing unit 405 subjects the received run length to DOT (development into image data), and supplies the image data to an image writing unit 406. The image writing unit 406 writes the decoded image data into the memory 110.

A description will now be given of the various parts forming the image expansion apparatus 106d. In this embodiment, it is assumed that the image data is processed in parallel for every 8 bits.

[Code Reading Unit 402 of Image Expansion Apparatus 106d]

Figure 37:
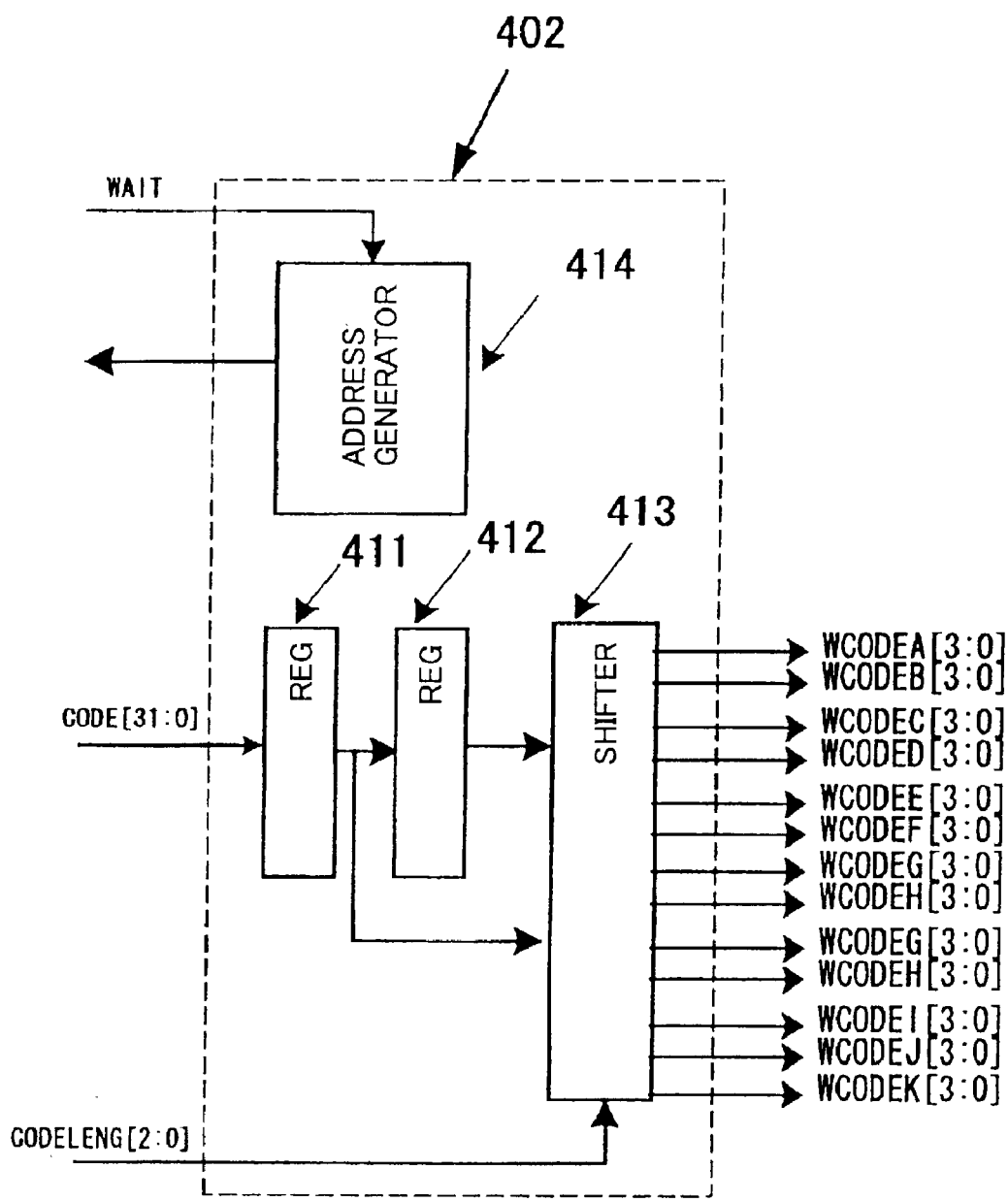
FIG. 37 is a system block diagram showing a structure of a code reading unit.

FIG. 37 is a system block diagram showing a structure of the code reading unit 402. In FIG. 37, registers 411 and 412 temporarily store the read coded data, and an address generator 414 generates a read address from which the coded data is to be read from the memory 110. The read coded data has a code format shown in FIG. 11. A shifter 413 transfers to the code interpretation processing unit 403 the 4-bit code while successively shifting according to a consumed code length (CODELENG) which is notified from the code interpretation processing unit 403. In addition, the code reading unit 402 interrupts the reading of the code in response to a wait signal WAIT from a FIFO within the run length processing unit 404 or the DOT processing unit 405 when the FIFO becomes full.

[Code Interpretation Processing Unit 403 of Image Expansion Apparatus 106d]

Figure 38:
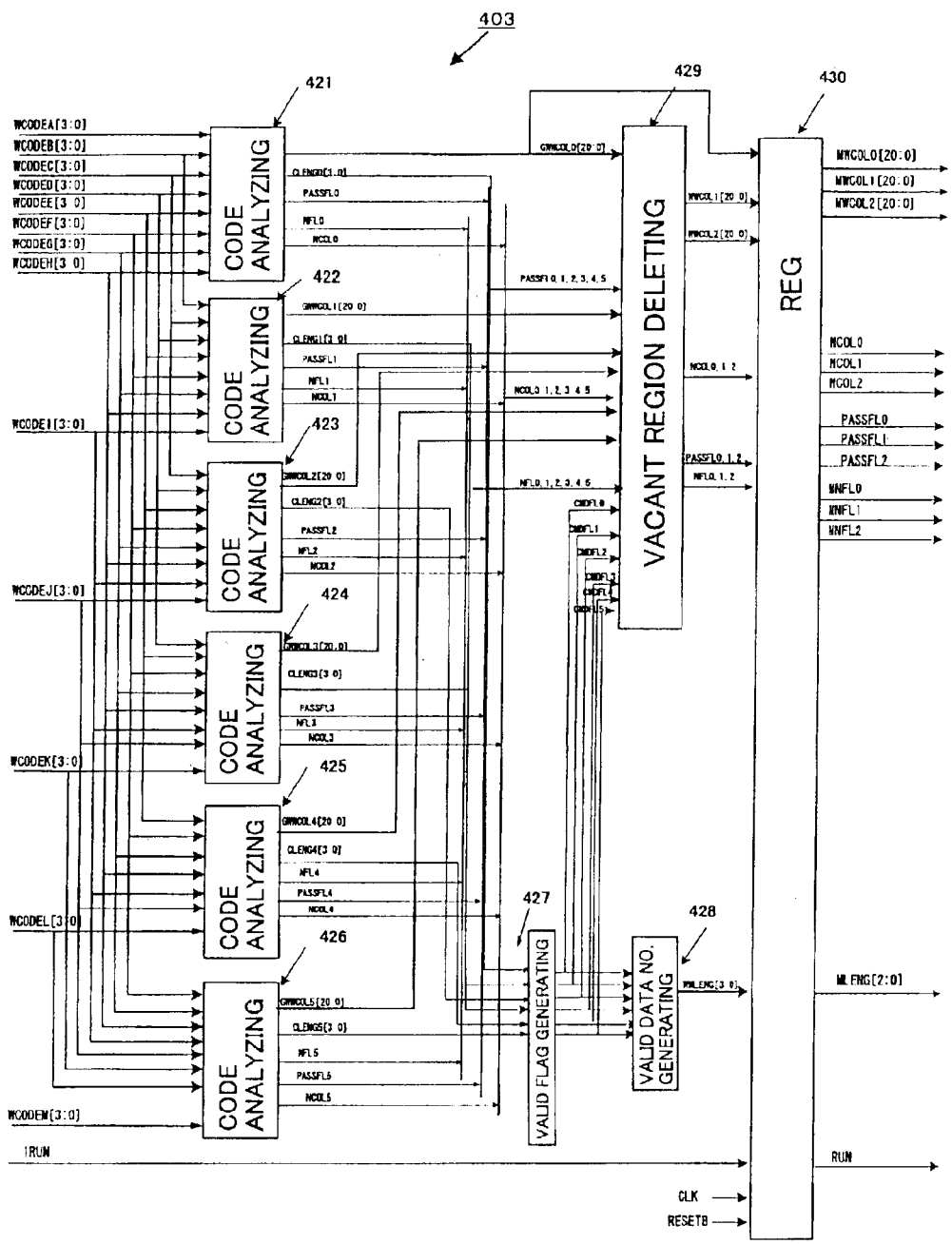
FIG. 38 is a system block diagram showing a structure of a code interpretation processing unit.

FIG. 38 is a system block diagram showing a structure of the code interpretation processing unit 403. The code interpretation processing unit 403 shown in FIG. 38 receives a plurality of codes in 4-bit units from the code reading unit 402, and obtains 4 run lengths or repetition numbers and a plurality of flags indicating whether the numeric value is the run length or the repetition number.

The code interpretation processing unit 403 operates as follows. That is, 6 code analyzing units 421 through 426 analyze the code having the code format shown in FIG. 11, so that one code analyzing unit can read a code having a maximum code length. The maximum code length in the code format shown in FIG. 11 is 8 4-bit codes. Each of the code analyzing units 421 through 426 analyzes the code by shifting for every one 4-bit code, and outputs a run length or repetition number (GWWCOL), a flag (NFL) indicating a run length or repetition number, a flag (CMDFL) indicating valid or invalid, a pass coding flag (PASSFL) indicating a pass code or not, and color information (NCOL) of the next run length in the case of the pass code. Of course, there are code analyzing units which are matched to the boundary of the code and those which are not. Hence, a valid flag generating unit 427 is used to judge whether or not the code analyzing unit is matched to the boundary of the code.

The valid flag generating unit 427 judges whether or not the analysis result from each code analyzing unit is valid, based on the value of the code length (CLEN) output from each of the 6 code analyzing units 421 through 426, and generates flags (CMDFL) indicating valid or invalid, and these flags (CMDFL) are supplied to a vacant region deleting unit 429 and a valid data number generating unit 428. The valid data number generating unit 428 converts the flags (CMDFL) into a length (WMLENG). The vacant region deleting unit 429 receives the run length or repetition number (GWWCOL), the flag (NFL) indicating the run length or repetition number, the flag (CMDFL) indicating valid or invalid, the pass coding flag (PASSFL) indicating the pass code or not, and the color information (NCOL) of the next run length in the case of the pass code, from each of the code analyzing units 421 through 426, and deletes the invalid data based on the flag (CMDFL) indicating valid in each GWWCOL, so that a latter processing can be carried out using a hardware having a small scale. In other words, the vacant region deleting unit 429 carries out a vacant region deleting process which obtains a maximum of 3 run length or repetition numbers. The run length or repetition number (WWCOL) after the vacant region deleting process, the flag (NFL) indicating the run length or repetition number, the pass coding flag (PASSFL) indicating pass code or not, the color information (NCOL) of the next run length in the case of the pass code, and the valid data number (MLENG) are transferred to the run length processing unit 404 via a register 430. In addition, although not shown in FIG. 38, the total analyzed code length, that is, the consumed code length (CODELENG), is obtained by the valid flag generating unit 427 and is transferred to a shifter 413 of the code reading unit 402.

In other words, each of the code analyzing units 421 through 426 analyzes the code having the code format shown in FIG. 11, and outputs the run length or the repetition number and the run length (GWWCOL), the flag (NFL) indicating the repetition number or not, the processed code length (CLENG), the pass coding flag (PASSFL), and the color information (NCOL) of the next run length in the case of the pass code. One of the code analyzing units 421 through 426 can read the code having the maximum code length. The maximum code length in the code format shown in FIG. 11 is 8 4-bit codes. Each of the code analyzing units 421 through 426 analyzes the code by shifting for every one 4-bit code.

The valid flag generating unit 427 receives the code lengths (CLENG) processed by the code analyzing units 421 through 426, and judges whether the analyzed results are valid or invalid. When the code analyzing unit 421 analyzes the correct code at the correct position the code analyzing unit 422 is valid if the processed code length is 1 but is invalid if greater than 1. If a sum of the code length processed by the code analyzing unit 421 and the code length (0 if invalid) processed by the code analyzing unit 422 is 1 or 2, the code analyzing unit 423 is valid and is otherwise invalid. If a sum of the code length processed by the code analyzing unit 421, the code length (0 if invalid) processed by the code analyzing unit 422 and the code length (0 if invalid) processed by the code analyzing unit 423 is 1, 2 or 3, the code analyzing unit 424 is valid and is otherwise invalid. The valid or invalid analyzed results of the other code analyzing units 245 and 246 are judged similarly to the above.

Figure 43:
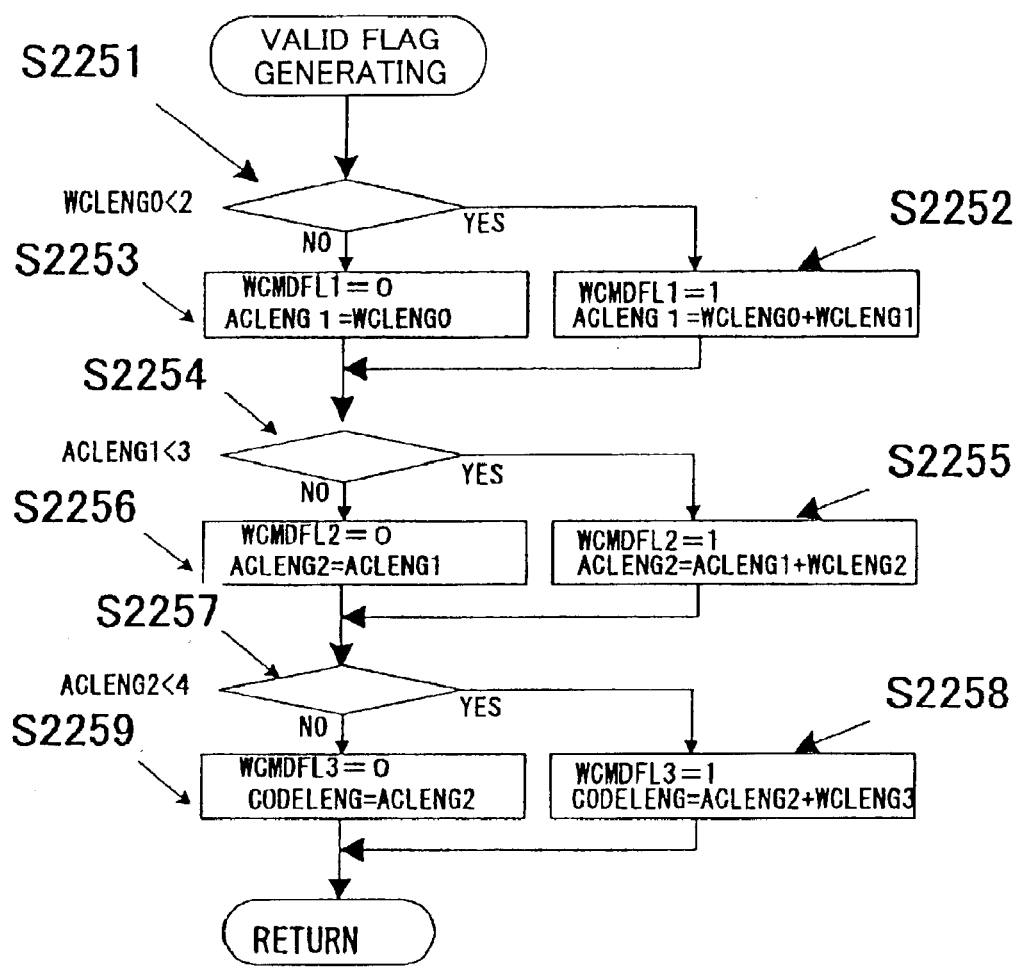
FIG. 43 is a flow chart for explaining a process of a valid flag generating unit.

FIG. 43 is a flow chart for explaining a process of the valid flag generating unit 427. In FIG. 43, a step S2251 judges whether or not a code length WCLENG0 is smaller than 2. If the judgement result in the step S2251 is YES, a step S2252 sets a flag WCMDFL1 to 1 and sets a code length ACLENG1 to ACLENG1=WCLENG0+WCLENG1. On the other hand, if the judgement result in the step S2251 is NO, a step S2253 sets a flag WCMDFL1 to 0 and sets ACLENG1 to ACLENG1=WCLENG0. The process advances to a step S2254 after the step S2252 or S2253. Steps S2254 through S2256 and steps S2257 through S2259 are carried out similarly to the steps S2251 through S2253, and the process ends.

The valid data number generating unit 428 converts the valid flag from the valid flag generating unit 427 into the length (MLENG).

Figure 44:
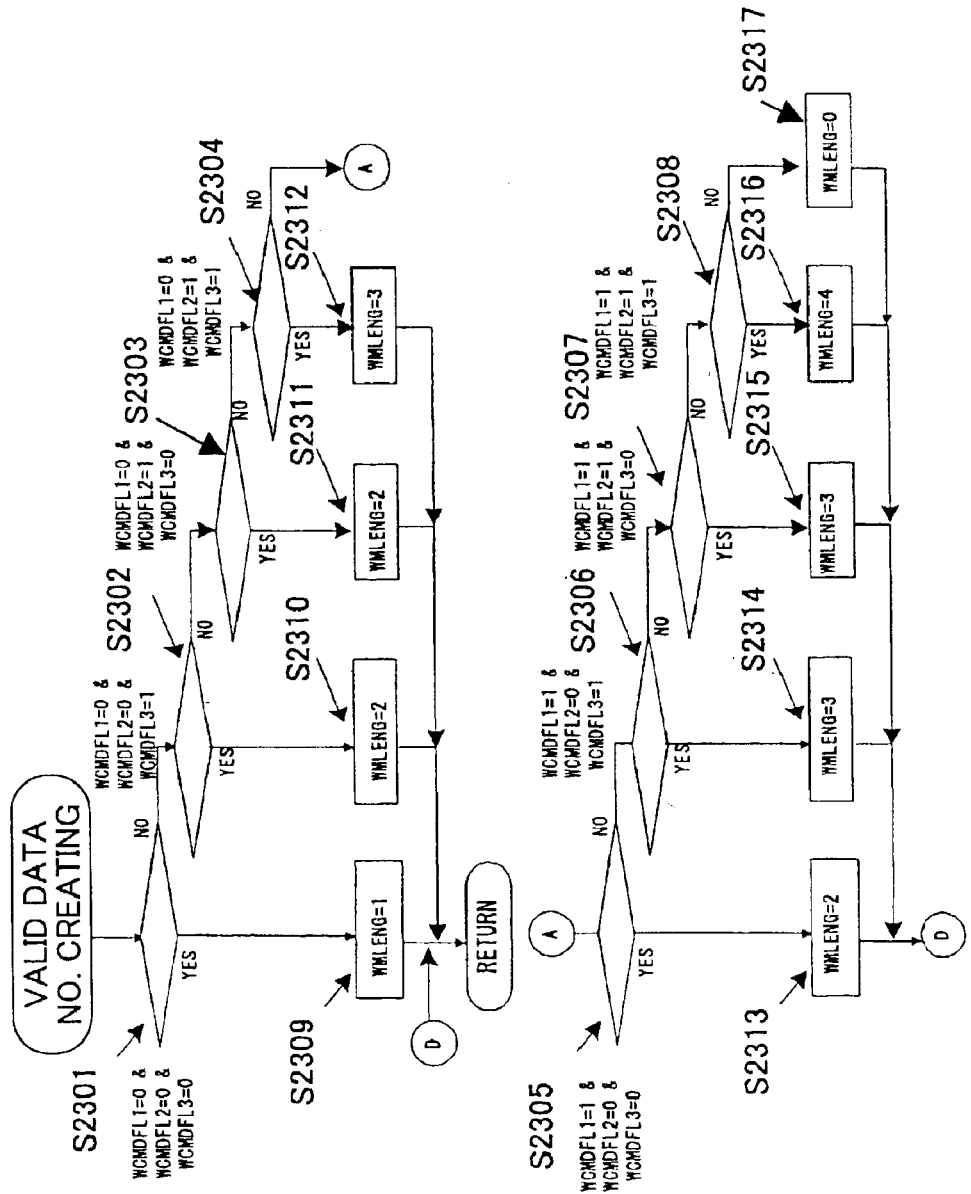
FIG. 44 is a flow chart for explaining a process of a valid data number generating unit.

FIG. 44 is a flow chart for explaining a process of the valid data number generating unit 428. In FIG. 44, a step S2301 judges whether or not the flags WCMDFL1, WCMDFL2 and WCMDFL3 are 0. If the judgement result in the step S2301 is YES, a step S2309 sets the length WWLENG to 1 and the process ends. The process advances to a step S2302 if the judgement result in the step S2301 is NO. Judgements of steps S2302 through S2308 and setting of the lengths in steps S2310 through S2317 are made similarly to the steps S2301 and S2309, respectively.

The vacant region deleting unit 429 shifts the portion having no information so as to adjust the repetition number or run length, based on the plurality of repetition numbers or run lengths (GWWCOL) received from the code analyzing units 421 through 426 and the flag (CMDFL) indicating valid or invalid received from the valid flag generating unit 427.

Figure 45:
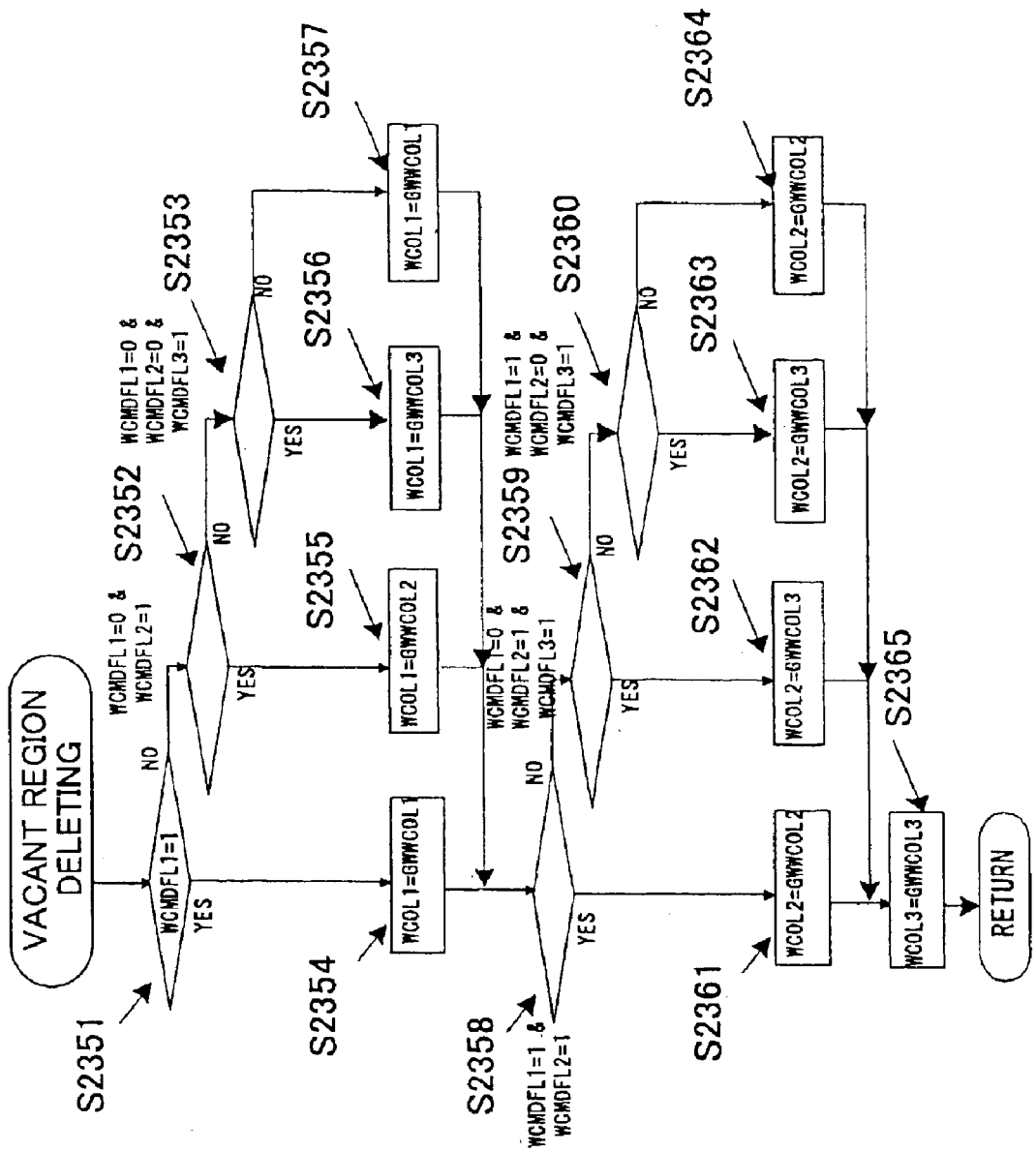
FIG. 45 is a flow chart for explaining a process of a vacant region deleting unit.

FIG. 45 is a flow chart for explaining a process of the vacant region deleting unit 429. In FIG. 45, a step S2351 judges whether or not the flag WCMDFL1 is 1. If the judgement result in the step S2351 is YES, a step S2354 sets the repetition number of run length WCOL to GWWCOL1. Steps S2355 through S2357 are carried out depending on judgements made in steps S2352 and S2353, similarly to the step S2351. The process advances to a step S2358 after one of the steps S2354 through S2357. The step S2358 judges whether or not the flags WCMDFL1 and WCMDFL2 are 1. If the judgement result in the step S2358 is YES, a step S2361 sets the repetition number or run length WCOL2 to GWWCOL2. Steps S2362 through S2364 are carried out depending on judgements made in steps S2359 and S2360, similarly to the step S2358. The process advances to a step S2365 after one of the steps S2361 through S2364. The step S2365 sets the repetition number or run length WCOL3 to GWWCOL3 and the process ends.

Figure 39:
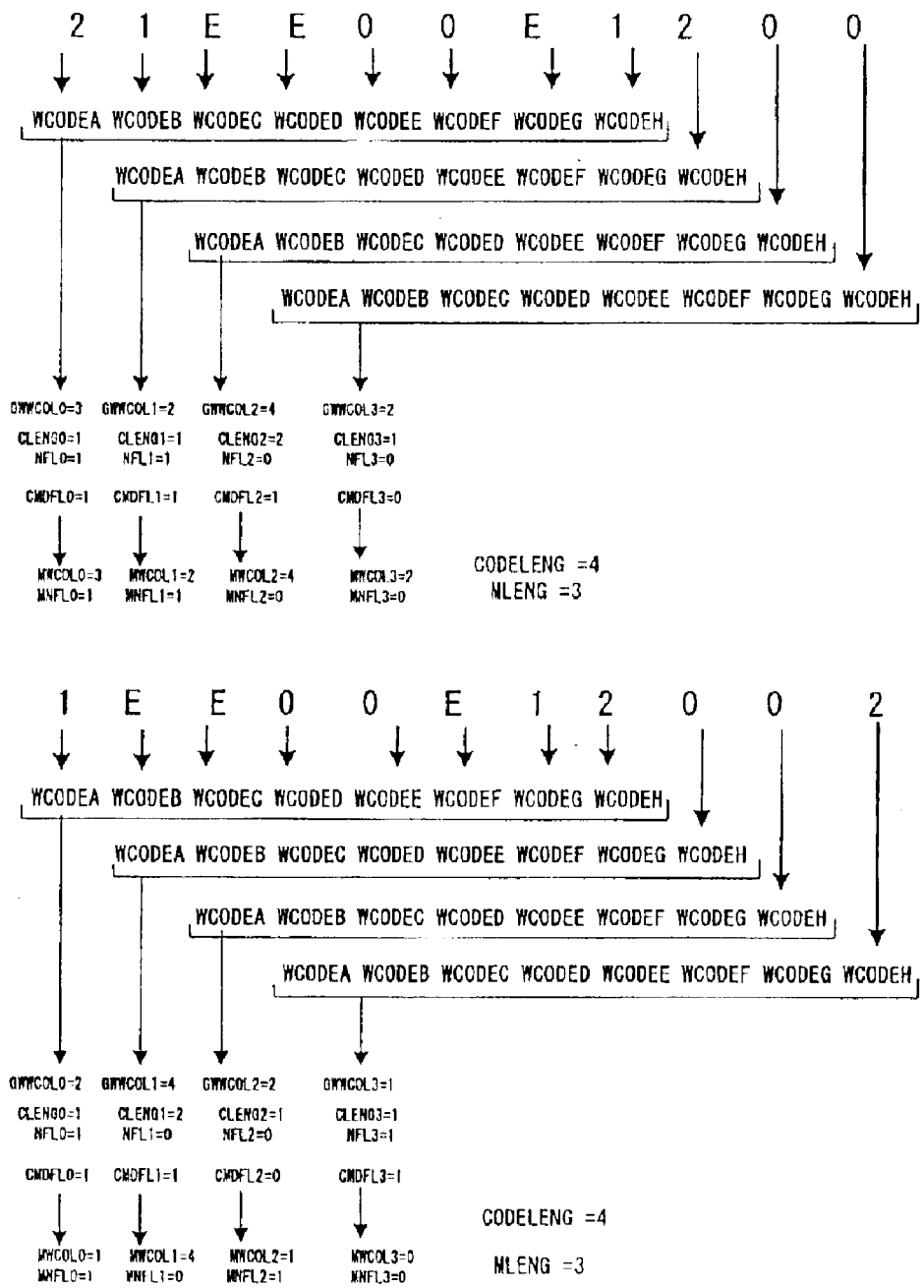
FIG. 39 is a diagram for explaining particular processing examples of the code interpretation processing unit.

Next, a description will be given of particular processing examples of the code interpretation processing unit 403, by referring to FIG. 39. FIG. 39 is a diagram for explaining particular processing examples of the code interpretation processing unit 403. In FIG. 39, GWWCOL indicates the run length or repetition number of the code analyzed by the code analyzing units 421 through 426, CLENG indicates the length of the analyzed code, and NFL indicates the flag indicating whether the numeric value of GWWCOL is a run length or repetition number. CMDFL indicates the flag indicating valid or invalid analyzed result of each code analyzing unit obtained by the valid flag generating unit 427. MNFL indicates the flag indicating the run length or repetition number. CODELENG is obtained by the valid flag generating unit 427 and indicates the number of analyzed codes. MLENG indicates the number of run lengths or repetition numbers.

A first process shown in FIG. 39 receives and analyzes codes "2", "1", "E", "E", "0", "0", "E", "1", "2", "0" and "0". In this process, the first code analyzing unit 421 receives the codes "2", "1", "E", "E", "0", "0", "E", "1", "2", "0" and "0", and analyzes them together with the run length 3. The code number (number of codes) is 1.

The second code analyzing unit 422 receives the codes "1", "E", "E", "0", "0", "E", "1" and "2", and analyzes them together with the run length 2. The code number is 1.

The third code analyzing unit 423 receives the codes "E", "E", "0", "0", "E", "1", "2" and "0", and analyzes them together with the repetition number 4. The code number is 2.

The fourth code analyzing unit 424 receives the codes "E", "0", "0", "1", "2", "0" and "0", and analyzes them together with the repetition number 2. The code number is 1. The fifth and sixth code analyzing units 425 and 426 operate similarly to the first through fourth code analyzing units 421 through 424, but illustration thereof is omitted in FIG. 39.

Next, the valid flag generating unit 427 judges the validity of the run length or repetition number analyzed by each of the code analyzing units 421 through 426, based on the code numbers obtained from the code analyzing units 421 through 426. In this particular case, the code number of the run length or repetition number obtained by the third code analyzing unit 423 is 2, and thus, it can be judged that the code analyzed by the fourth code analyzing unit 424 is not the leading code. Accordingly, the flag CMDFL3 of the fourth code analyzing unit 424 is invalidated. The code number consumed in this case is 4.

A next process receives and analyzes the codes "1", "E", "E", "0", "0", "E", "1", "2", "0", "0" and "2". In this process, the first code analyzing unit 421 receives the codes "1", "E", "E", "0", "0", "E", "1" and "2", and analyzes them together with the run length 2. The code number is 1.

The second analyzing unit 422 receives the codes "E", "E", "0", "0", "E", "1", "2" and "0", and analyzes them together with the repetition number 4. The code number is 2.

The third code analyzing unit 423 receives the codes "E", "0", "0", "E", "1", "2", "0" and "0", and analyzes them together with the repetition number 2. The code number is 1.

The fourth code analyzing unit 424 receives the codes "0", "0", "E", "1", "2", "0", "0" and "2", and analyzes them together with the run length 1. The code number is 1.

Next, the valid flag generating unit 427 judges the validity of the run length or repetition number analyzed by each of the code analyzing units 421 through 426, based on the code numbers obtained from the code analyzing units 421 through 426. In this particular case, the code number of the run length or repetition number obtained by the second code analyzing unit 422 is 2, and thus, it can be judged that the code analyzed by the third code analyzing unit 423 is not the leading code. Accordingly, the flag CMDFL2 of the third code analyzing unit 423 is invalidated.

Since a blank exists in the run length or repetition number that is obtained, the vacant region deleting unit 429 deletes the blank, and simplifies the data format to be transferred to the next processing unit. The code number consumed in this case is 4.

Figure 42:
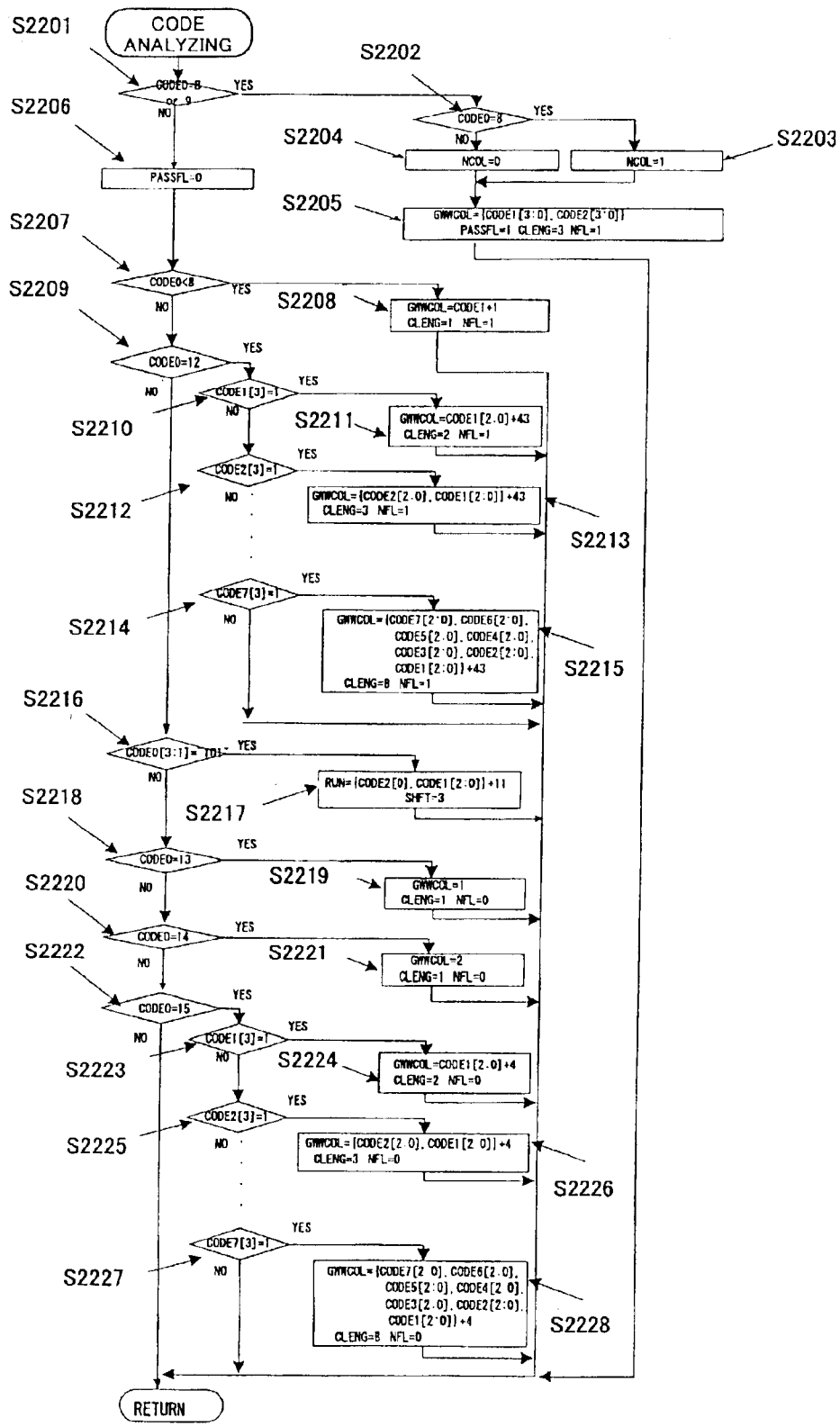
FIG. 42 is a flow chart for explaining a process of each of code analyzing units within the code interpretation processing unit.

FIG. 42 is a flow chart for explaining a process of each of the code analyzing units 421 through 426. The process shown in FIG. 42 decodes the code having the code format shown in FIG. 11. Each of the code analyzing units 421 through 426 interprets the codes based on the order of the input codes.

In FIG. 42, a step S2201 judges whether or not the first code (CODE0) is "8" (1000) or "9" (1001) of the pass code. If the judgement result in the step S2201 is YES, a step S2202 judges whether or not the pass code is "8". If the judgement result in the step S2202 is YES, the next run length of this pass code starts from "0", and thus, a step S2203 sets the color information NCOL of the next run length in the case of the pass code to "0". If the pass code is "9" and the judgement result in the step S2202 is NO, the next run length starts from "1", and hence, a step S2204 sets the color information NCOL to "1". After the step S2203 or W2204, a step S2205 stores the next codes COD1 and CODE2 as the image data into GWWCOL which stores the obtained run length or repetition number. In addition, the step S2205 sets the flag PASSFL which indicates that GWWCOL is the pass code image data to "1", and stores the consumed code length "3" into CLENG.

If the code is not a pass code and the judgement result in the step S2201 is NO, a step S2206 sets the flag PASFL to "0".

Next, a step S2207 judges whether or not the code CODE0 is less than 8. If the judgement result in the step S2207 is YES, the code has a short run length. Hence, a step S2208 stores a value CODE1+1 in GWWCOL, sets the consumed code length CLENG to "1", and sets the flag NFL which indicates the run length or repetition number to "1" which indicates the run length.

If the judgement result in the step S2207 is NO, a step S2209 judges whether or not the code CODE0 is "12" (1100). If the judgement result in the step S2209 is YES, the code has a long run length. Accordingly, steps S2210 through S2215 obtain the run length based on the code format shown in FIG. 11.

If the judgement result in the step S2209 is NO, a step S221 judges whether or not the code CODE0 is "6" (101). If the judgement result in the step S221 is YES, the code has an intermediate run length. Hence, a step S2217 obtains the run length.

If a step S2218 judges that the code CODE0 is "13" (1101) or a step S2220 judges that the code CODE0 is "14" (1110) and the judgement result is YES, the code is an iterative code having a small repetition number. Hence, a corresponding step S2219 or S2221 obtains the repetition number, and sets the flag NFL which indicates the run length or repetition number to "0" which indicates the repetition number.

If a step S2222 judges whether or not the code CODE0 is "15" (1111) and the judgement result is YES, the code is an iterative code having a large repetition number. Thus, steps S2223 through S2228 obtain the repetition number, and sets the flag NFL.

[Run Length Processing Unit 404 of Image Expansion Apparatus 106d]

Figure 40:
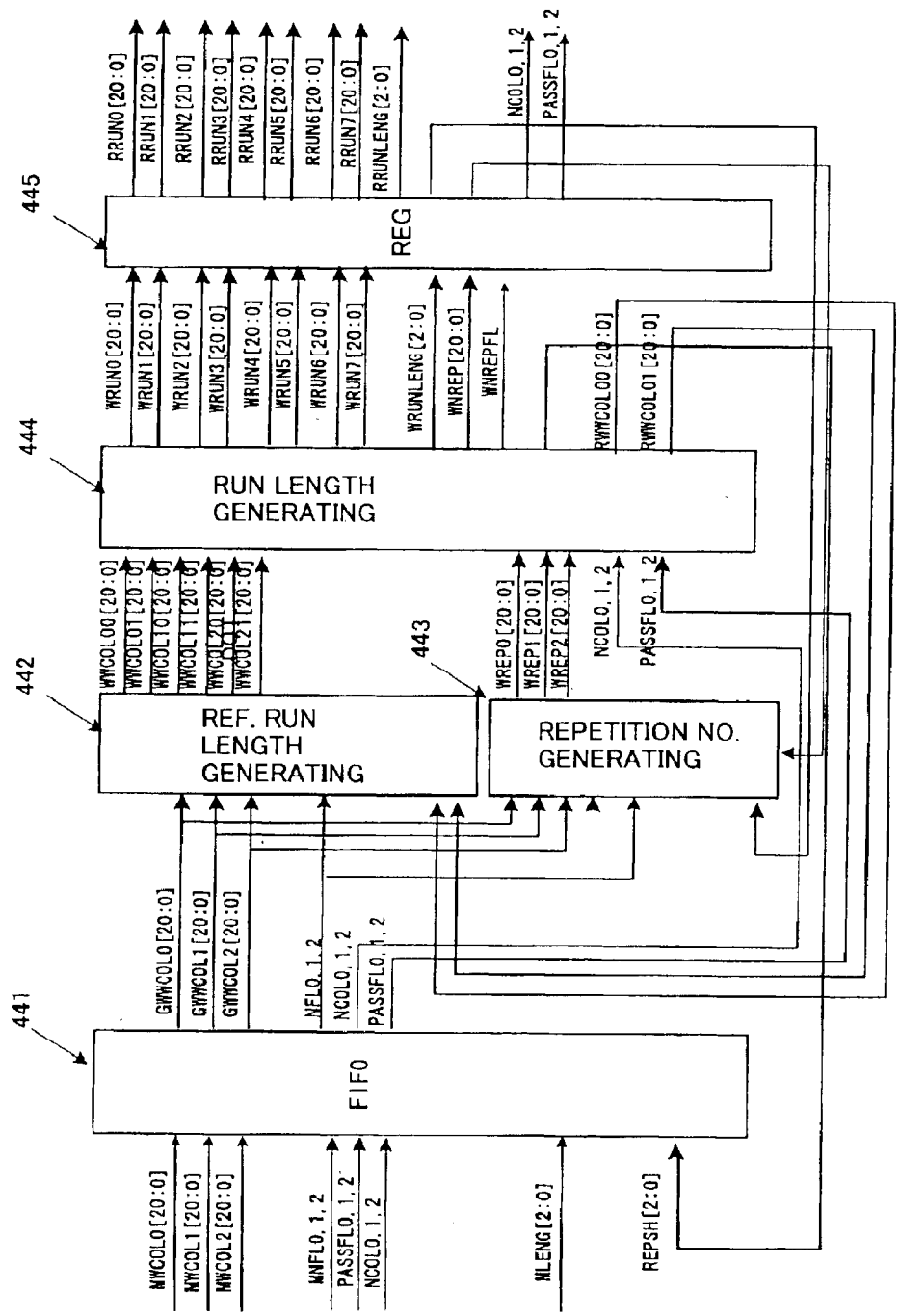
FIG. 40 is a system block diagram showing a structure of a run length processing unit.

FIG. 40 is a system block diagram showing a structure of the run length processing unit 404 of the image expansion apparatus 106d. The run length processing unit 404 shown in FIG. 40 receives from the code interpretation processing unit 403 the plurality of run lengths or repetition numbers WWCOL, the number MLENG of the run lengths or repetition numbers, the plurality of flags WNFL indicating the run length or repetition number, the pass coding flag PASSFL, and the color information NCOL of the next run length in the case of the pass code, and generates for every clock a maximum of 8 run lengths (RRUN7 through RRUN0) which are required to generate an 8-bit decoding pattern and supplies the run lengths to the DOT processing unit 405. A description will be given of the various parts forming the run length processing unit 404.

In FIG. 40, a FIFO 441 successively stores the plurality of run lengths or repetition numbers, the number of the run lengths or repetition numbers, and the plurality of flags indicating the run length or repetition number received from the code interpretation processing unit 403. The FIFO 441 shifts the stored data by a consumed data number REPSH received from a run length generating unit 444, and outputs to a reference run length generating unit 442 and a repetition number generating unit 443 3 run lengths or repetition numbers GWWcol and a plurality of flags NFL indicating the run length or repetition number.

The reference run length generating unit 442 receives from the FIFO 441 the plurality of run lengths or repetition number and the plurality of flags indicating the run length or repetition number, and receives from the run length generating unit 444 previous last run lengths RWWCOL00 and RWWCOL01. The reference run length generating unit 442 makes a conversion into a format which facilitates a repetition process as described in the following.

For example, in a case where the previous last run length received from the run length generating unit 444 is 5, the 3 run lengths received from the FIFO 441 are 3, 2 and 7, and the repetition or run length flags are 0, 0 and 1 ($3^{rd}$ is a repetition), the output of the reference run length generating unit 442 becomes as follows.

| WWCOL | | 0 1 2 |
|---|---|---|
| Color | 0: | 3 3 3 |
| | 1: | 5 2 2 |

The run length generating unit 444 carries out the following repetition process.

| WWCOL | | 0 1 2 3 4 5 6 7 8 |
|---|---|---|
| Color | 0: | 3 3 3 3 3 3 3 3 3 |
| | 1: | 5 2 2 2 2 2 2 2 2 |

The image is a repetition of black and white run lengths, and the run length may be black or white. In a case where the next color of the run length starts from "0", for example, it is possible to make a conversion to solely the run length by making a zigzag search in an order of the color 0, WWCOL0=3, color 1, WWCOL1=2, color 0, WWCOL2=3, color 1, WWCOL3=2, color 0, WWCOL4=3, In this particular case, the conversion from the repetition information to the information solely of the run length is carried out to the following level.

| WWCOL | | 0 1 2 |
|---|---|---|
| Color | 0: | 3 3 3 |
| | 1: | 5 2 2 |

Figure 47:
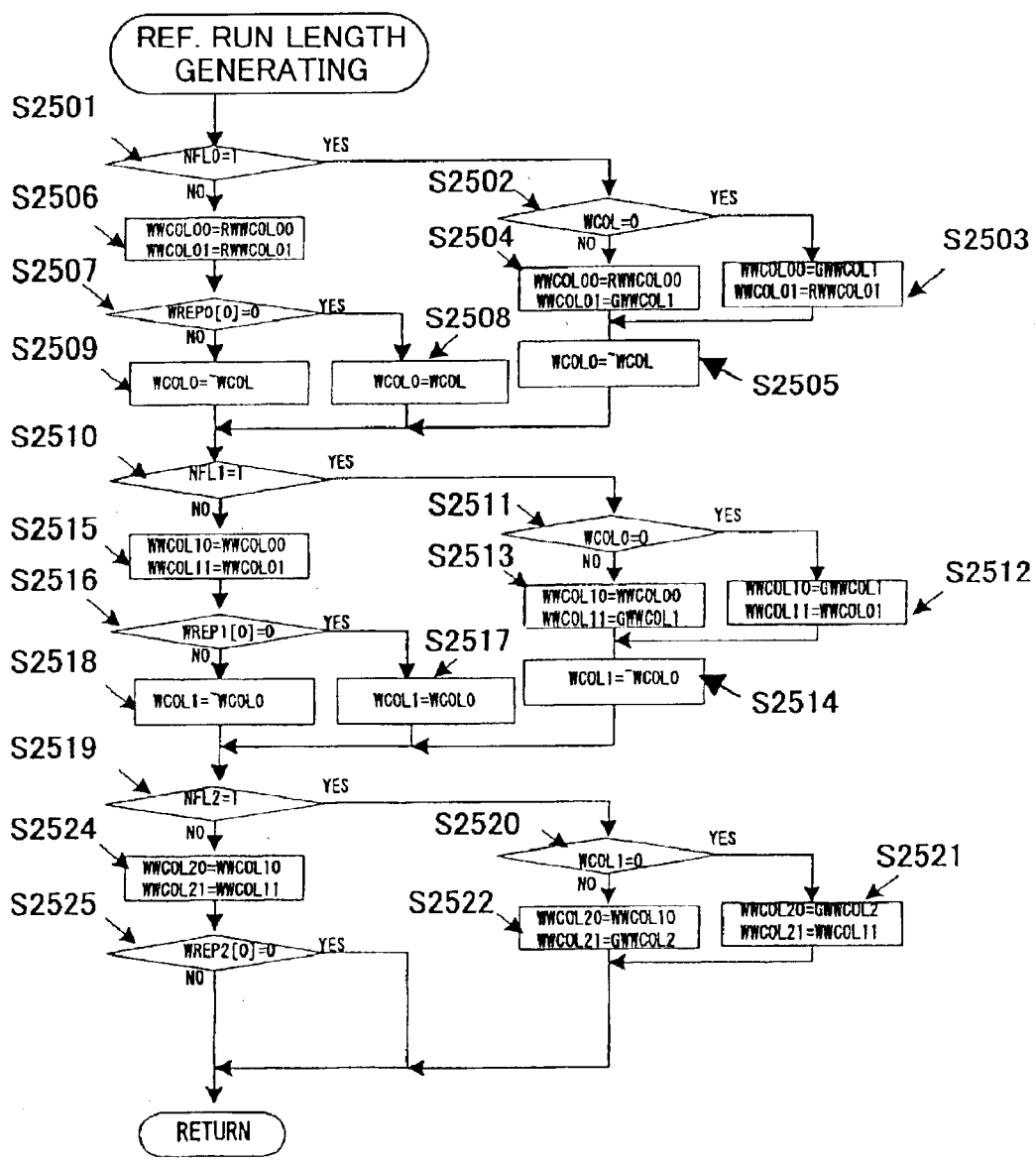
FIG. 47 is a flow chart for explaining a process of a reference run length generating unit.

FIG. 47 is a flow chart for explaining a process of the reference run length generating unit 442. In FIG. 47, a step S2501 judges whether or not NFL0=1. If the judgement result in the step S2501 is YES, a step S2502 judges whether or not WCOL=0. If the judgement result in the step S2502 is YES, a step S2503 sets WWCOL00=GWWCOL1 and WWCOL01=RWWCOL01. On the other hand, if the judgement result in the step S2502 is NO, a step S2504 sets WWCOL00=RWWCOL00 and WWCOL01=GWWCOL1. After the step S2503 or S2504, a step S2505 sets WCOL0=WCOL.

On the other hand, if the judgement result in the step S2501 is NO, a step S2506 sets WWCOL00=RWWCOL00 and WWCOL01=RWWCOL01, and a step S2507 judges whether or not WREP0[0]=0. If the judgement result in the step S2507 is YES, a step S2508 sets WCOL0=WCOL. If the judgement result in the step S2507 is NO, a step S2509 sets WCOL0=WCOL. The process advances to a step S2510 after the step S2505, S2508 or S2509. Steps S2510 through S2525 are carried out similar to the steps S2501 through S2509 described above.

The repetition number generating unit 443 receives from the FIFO 441 the plurality of run lengths or repetition numbers and the plurality of flags indicating the run length or repetition number, and creates repetition information WREP.

Figure 48:
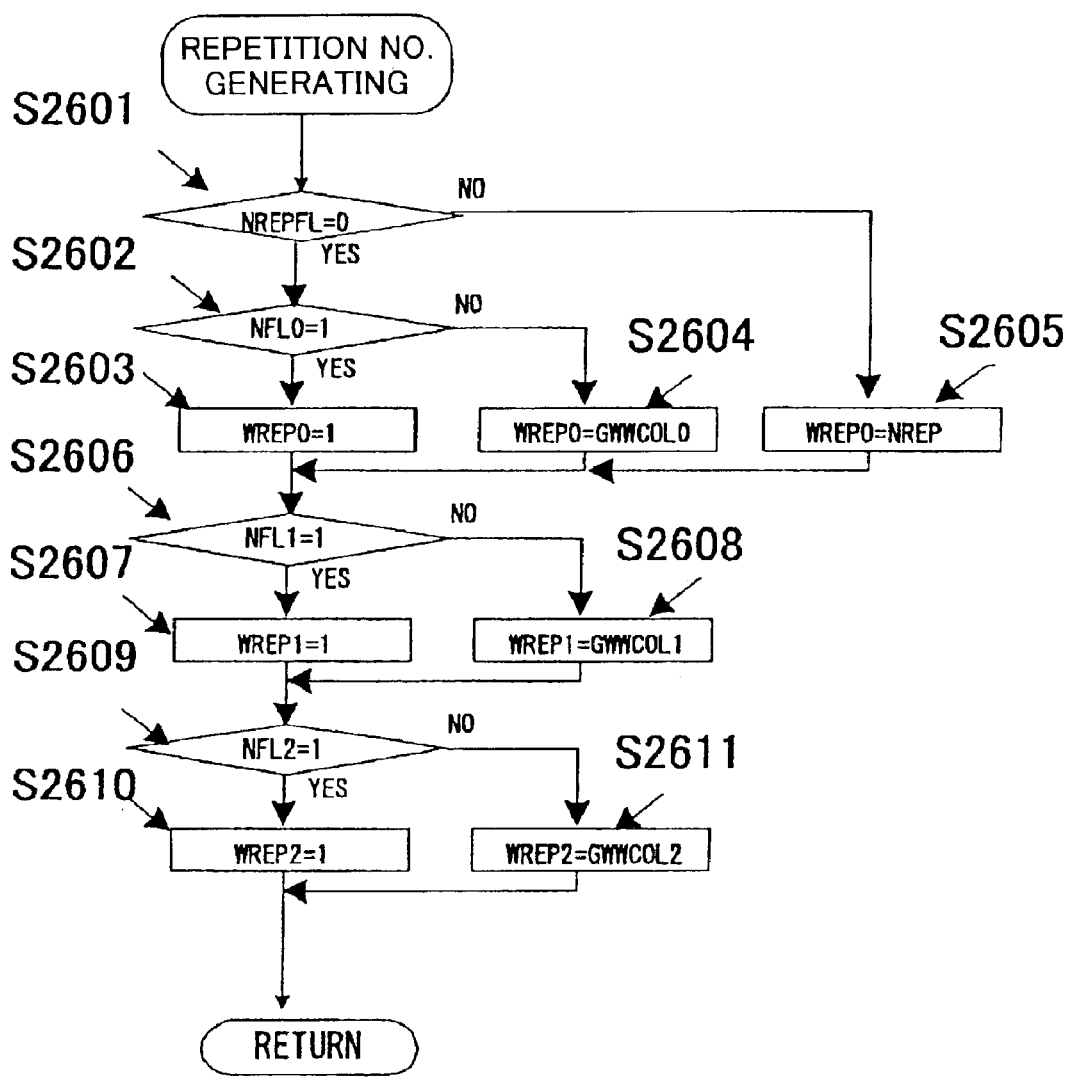
FIG. 48 is a flow chart for explaining a process of a repetition number generating unit.

FIG. 48 is a flow chart for explaining a process of the repetition number generating unit 443. In FIG. 48, a step S2601 judges whether or not NREPFL=0, and if the judgement result is YES, a step S2602 judges whether or not NFL0=1. If the judgement result in the step S2602 is YES, a step S2603 sets WREP0=1. If the judgement result in the step S2602 is NO, a step S2604 sets WREP0=GWWCOL0. If the judgement result in the step S2601 is NO, a step S2605 sets WREP0=NREP.

After the step S2603, S2604 or S2605, a step S2606 judges whether or not NFL1=1. A step S2607 sets WREP=1 if the judgement result in the step S2606 is YES. A step S2608 sets WREP1=GWWCOL1 if the judgement result in the step S2606 is NO. After the step S2607 or S2608, a step S2609 judges whether or not NFL2=1. A step S2610 sets WREP2=1 if the judgement result in the step S2609 is YES, and a step S2611 sets WREP2=GWWCOL2 if the judgement result in the step S2609 is NO. The process ends after the step S2610 or S2611.

As described above, the run length generating unit 444 receives from the reference run length generating unit 442 the black and white run length information which simplifies the repetition process. In addition, the run length generating unit 444 receives the repetition information from the repetition number generating unit 443, and develops the run length as follows, for example. In other words, if

| WWCOL | | 0 1 2 |
|---|---|---|
| Color | 0: | 3 3 3 |
| | 1: | 5 2 2 |
| WREP | | 1 1 7 | the development is made as follows

| WWCOL | | 0 1 2 3 4 5 6 7 8 |
|---|---|---|
| Color | 0: | 3 3 3 3 3 3 3 3 3 |
| | 1: | 5 2 2 2 2 2 2 2 2 | and the information 3, 2, 3, 2, 3, 2, 3, 2, 3, . . . , solely of the run length is obtained.

FIGS. 67 and 68 are diagrams showing the repetition patterns.

In this case, the repetition pattern of the input data is recognized from all of the repetition patterns shown in FIG. 67 in which 8 dots are repeated and the patterns shown in FIG. 68 in which only 3 run lengths exit. The run length is developed as in the above described case, and the number of data sufficient to fill the 8 runs is returned to the FIFO 441 as REPSH. In addition, the number of runs WRUNLENG, the run lengths, and the last halfway repetition number which remains after filling the 8 runs are supplied to a register 445.

The repetition number WNREP is supplemented. For example, in a case where

| WWCOL | | 0 1 2 3 4 5 6 7 8 |
|---|---|---|
| Color | 0: | 3 3 3 3 3 3 3 3 3 |
| | 1: | 5 2 2 2 2 2 2 2 2 | the following 8 runs are sufficient, and the 4 repetitions of the repetition number WREP2 is only used up to the halfway 2 repetitions, and the remaining 2 repetitions are held in NREP. When such remaining repetitions exist, the flag WNREPFL is set and supplied to the repetition number generating unit 443, and is used as the first repetition number.

| WWCOL | | 0 1 2 |
|---|---|---|
| Color | 0: | 3 3 3 |
| | 1: | 5 2 2 |

FIGS. 49 through 57 are flow charts for explaining a process of the run length generating unit 444.

Figure 49:
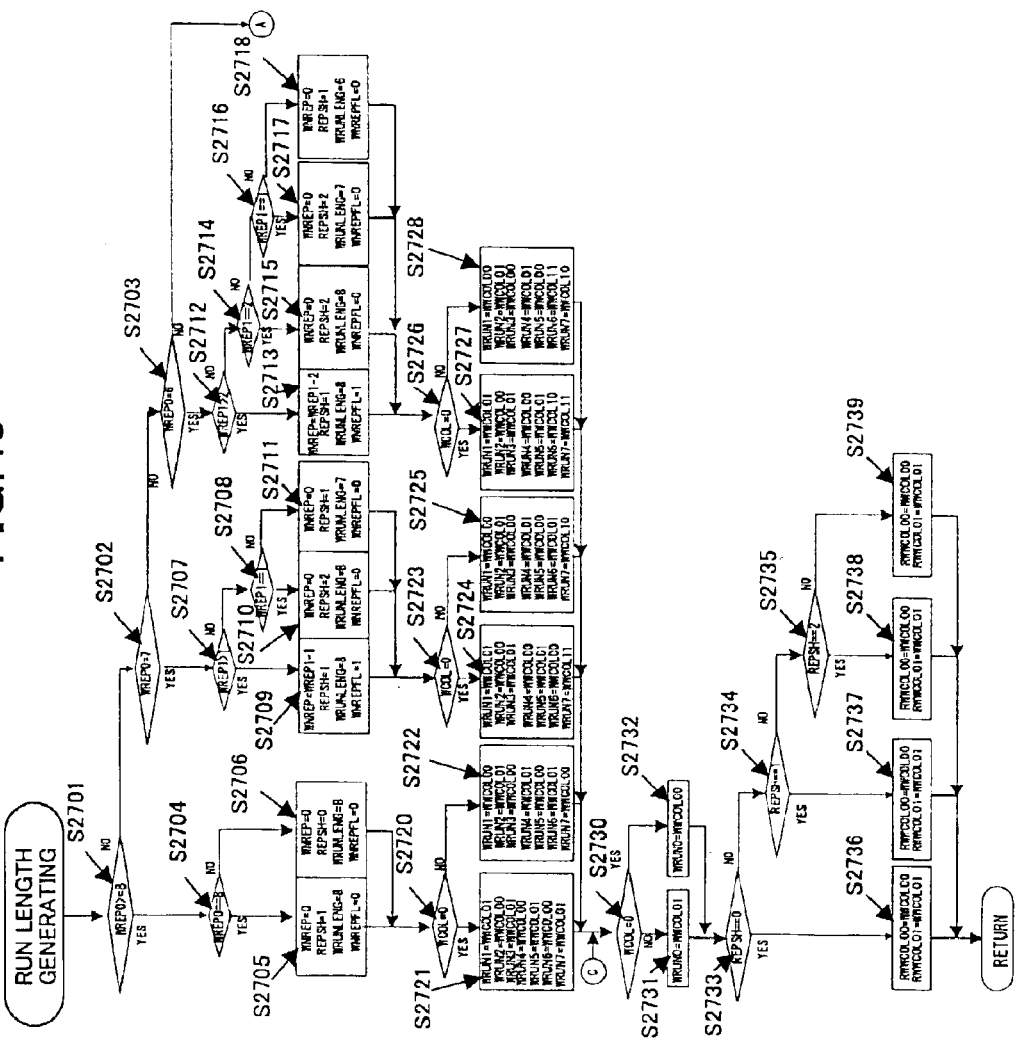
FIG. 49 is a flow chart for explaining a process of a run length generating unit.

In FIG. 49, a step S2701 judges whether or not WREP0 is 8 or less, and the process advances to a step S2703 if the judgement result is NO, and the process advances to a step S2704 if the judgement result is YES. Steps S2703, S2704, S2707, S2708, S2712, S2714, S2716, S2730, and S2733 through S2735 carry out similar judgements, and steps S2705, S2706, S2709 through S2711, S2713, S2715, S2717, S2718, S2721, S2722, S2724, S2725, S2727, S2728, S2731, S2732 and S2736 through S2739 make settings depending on the corresponding judgements. The process ends after the step S2736, S2737, S2738 or S2739.

Figure 50:
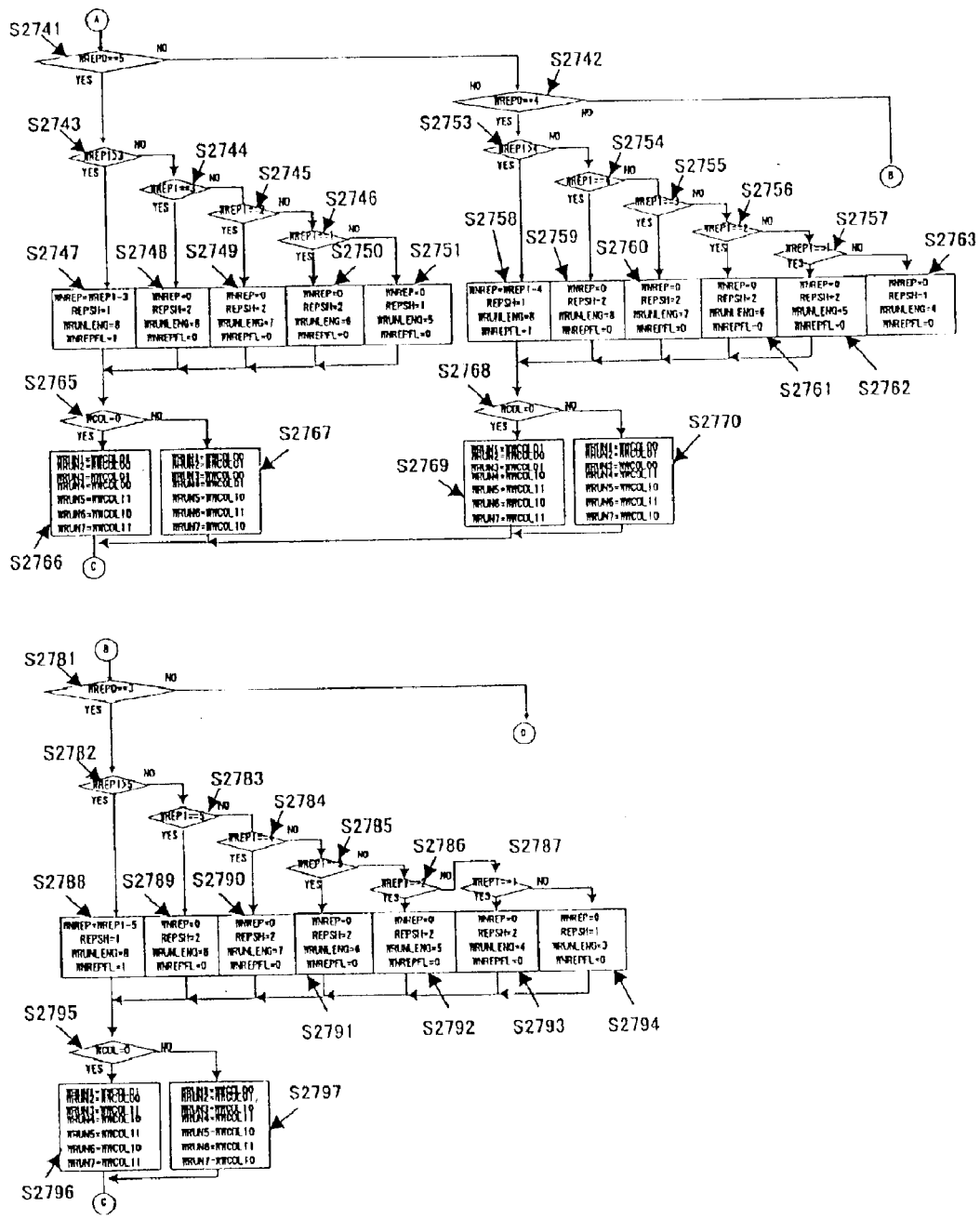
FIG. 50 is a flow chart for explaining the process of the run length generating unit.
Figure 54:
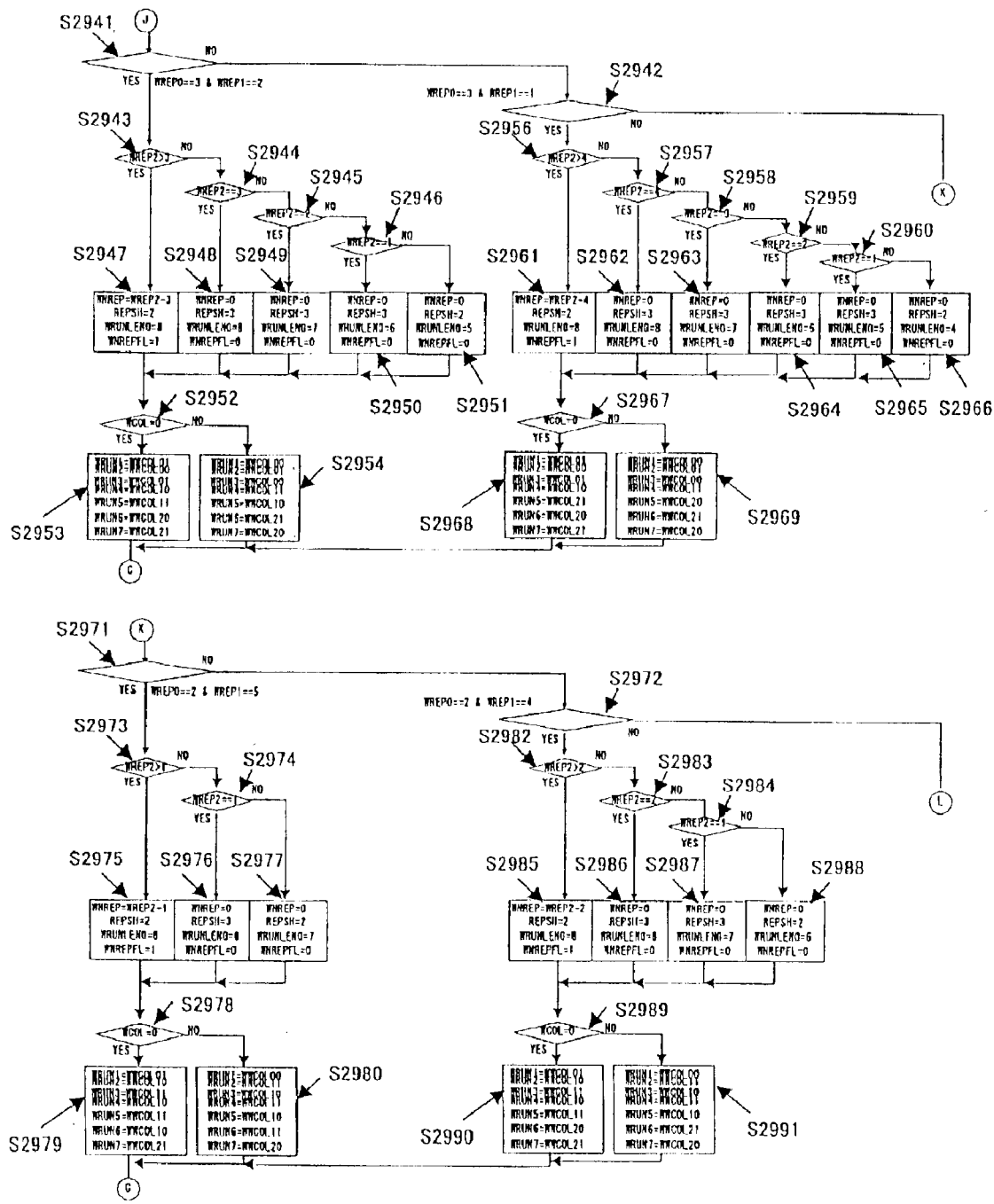
FIG. 54 is a flow chart for explaining the process of the run length generating unit.
Figure 55:
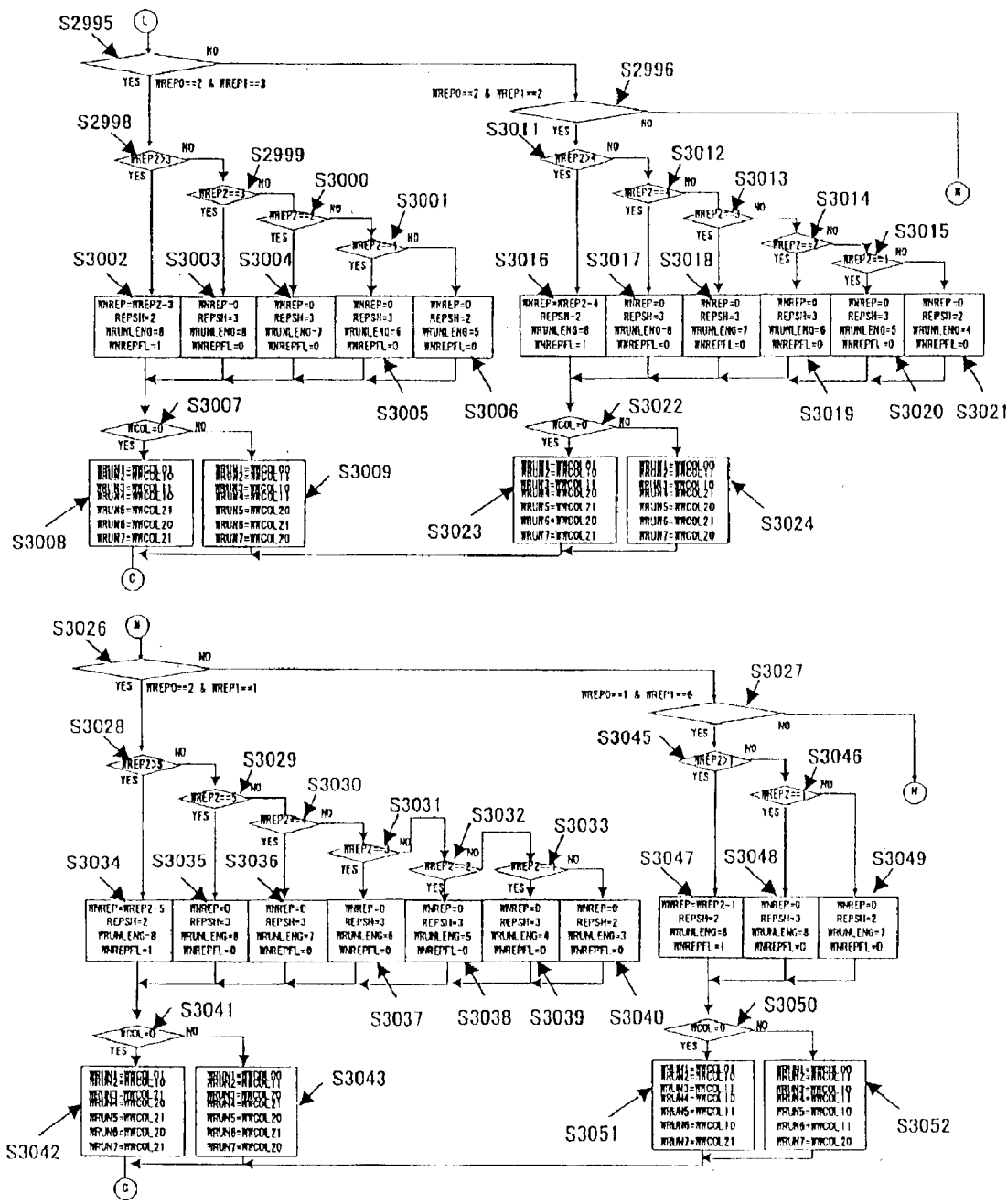
FIG. 55 is a flow chart for explaining the process of the run length generating unit.
Figure 56:
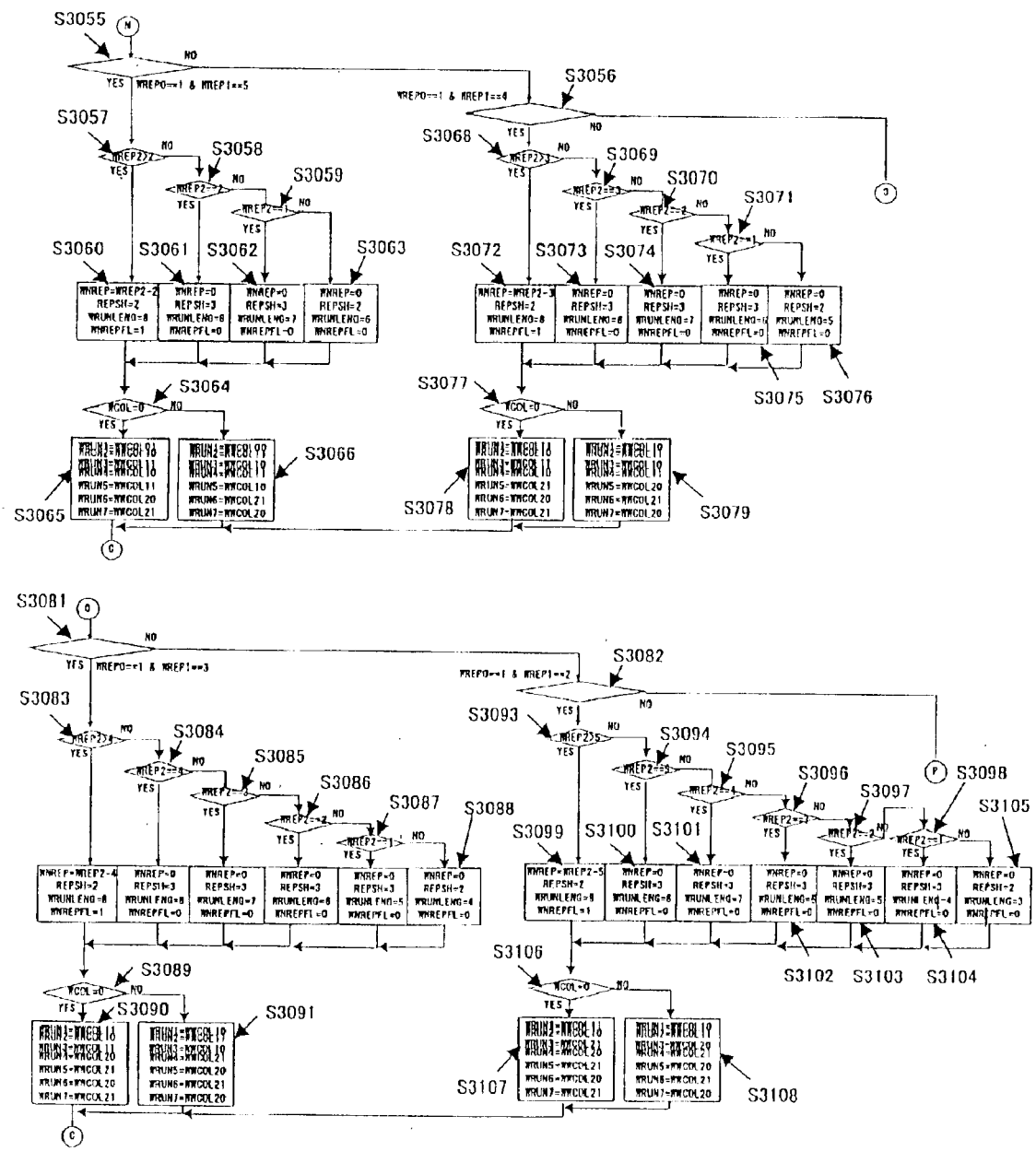
FIG. 56 is a flow chart for explaining the process of the run length generating unit.
Figure 57:
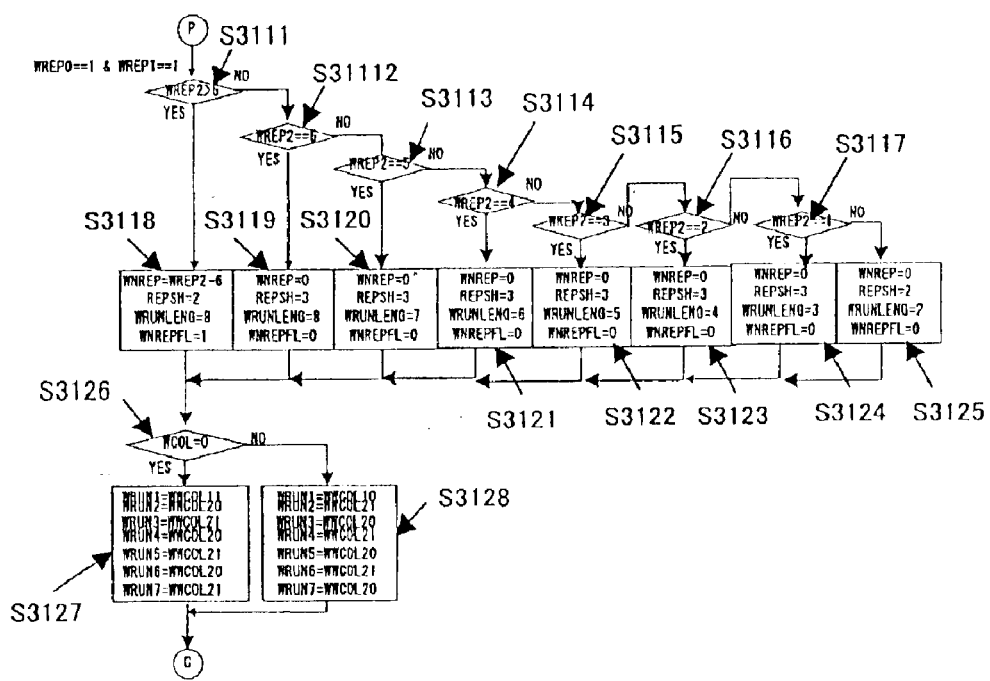
FIG. 57 is a flow chart for explaining the process of the run length generating unit.

Steps S2741 through S2797 shown in FIG. 50, steps S2801 through S2841 shown in FIG. 51, steps S2845 through S2885 shown in FIG. 52, steps S2887 through S2938 shown in FIG. 53, steps S2941 through S2991 shown in FIG. 54, steps S2995 through S3052 shown in FIG. 55, steps S3055 through S3108 shown in FIG. 56, and steps S3111 through S3128 shown in FIG. 57 carry out judgements and setting similarly to the steps S2701 through S2739 shown in FIG. 49.

If the judgement result in the step S2703 shown in FIG. 49 is NO, the process advances to the step S2741 shown in FIG. 50. After the step S2766, S2767, S2769, S2770, S2796 or S2797 shown in FIG. 50, the process advances to the step S2730 shown in FIG. 49. If the judgement result in the step S2781 shown in FIG. 50 is NO, the process advances to the step S2801 shown in FIG. 51. After the step S2818, S2819, S2840 or S2841 shown in FIG. 51, the process advances to the step S2730 shown in FIG. 49. If the judgement result in the step S2821 shown in FIG. 51 is NO, the process advances to the step S52 shown in FIG. 52. After the step S2853, S2854, S2862, S2863, S2875, S2876, S2884 or S2885 shown in FIG. 52, the process advances to the step S2730 shown in FIG. 49. If the judgement result in the step S2866 shown in FIG. 52 is NO, the process advances to the step S2887 shown in FIG. 53.

After the step S2897, S2898, S2911, S2912, S2924, S2925, S2937 or S2938 shown in FIG. 53, the process advances to the step S2730 shown in FIG. 49. If the judgement result in the step S2916 shown in FIG. 53 is NO, the process advances to the step S2941 shown in FIG. 54. After the step S2593, S2954, S2968, S2969, S2979, S2980, S2990 or S2991 shown in FIG. 54, the process advances to the step S2730 shown in FIG. 49. If the judgement result in the step S2972 shown in FIG. 54 is NO, the process advances to the step S2995 shown in FIG. 55. After the step S3008, S3009, S3023, S3024, S3042, S3043, S3051 or S3052 shown in FIG. 55, the process advances to the step S2730 shown in FIG. 49. If the judgement result in the step S3027 shown in FIG. 55 is NO, the process advances to the step S3055 shown in FIG. 56. After the step S3065, S3066, S3078, S3079, S3090, S3091, S3107 or S3108 shown in FIG. 55, the process advances to the step S2730 shown in FIG. 49. If the judgement result in the step S3082 shown in FIG. 56 is NO, the process advances to the step S3111 shown in FIG. 57. The process advances to the step S2730 shown in FIG. 49 after the step S3127 or S3128 shown in FIG. 57.

[DOT Processing Unit 405 of Image Expansion Apparatus 106*d*]

Figure 41:
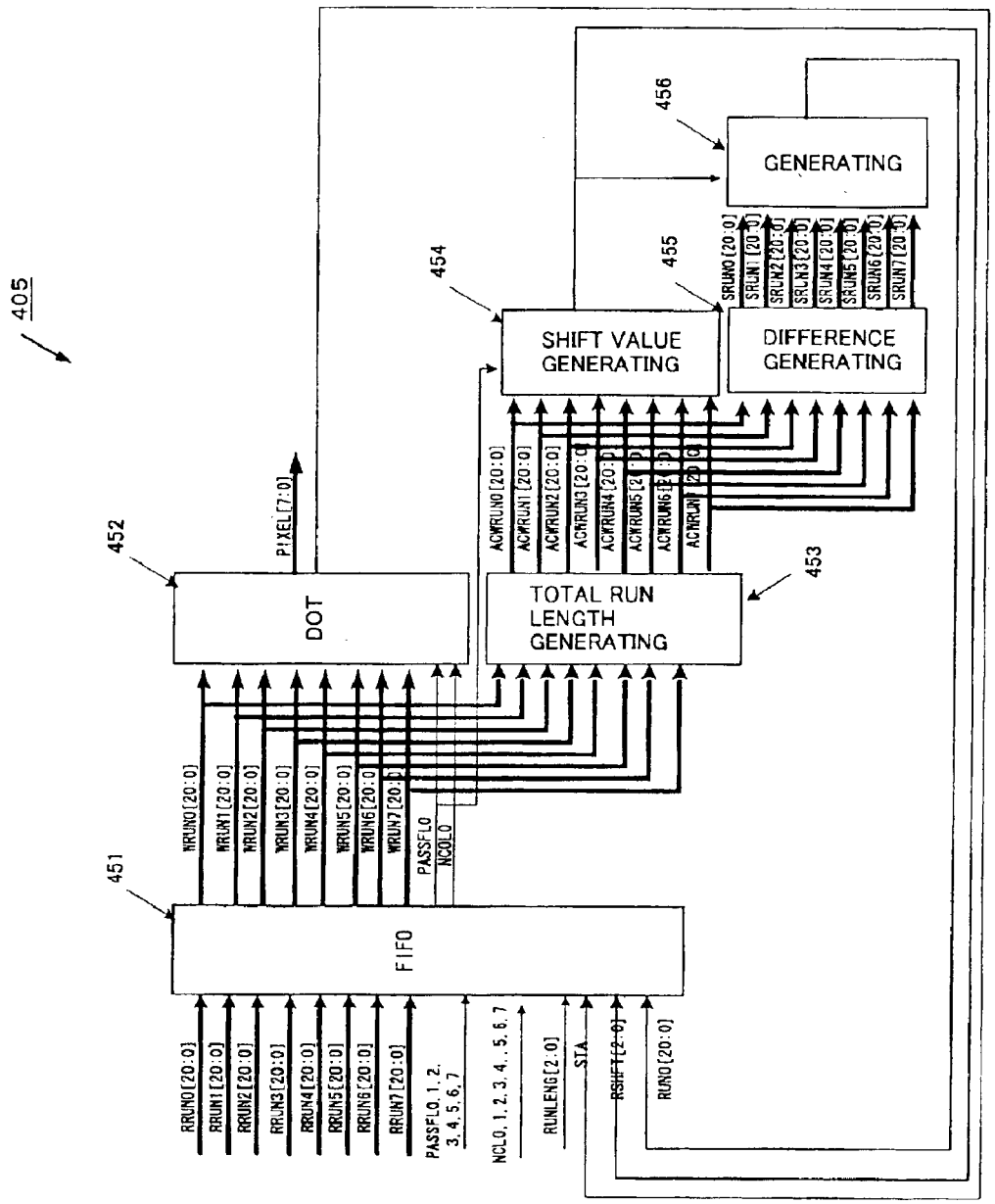
FIG. 41 is a system block diagram showing a structure of a DOT processing unit.

FIG. 41 is a system block diagram showing a structure of the DOT processing unit 405 within the image expansion apparatus 106d. The DOT processing unit 405 shown in FIG. 41 includes a FIFO 451, a DOT unit 452, a total run length generating unit 453, a shift value generating unit 454, a difference generating unit 455, and a RUN0 generating unit 456.

In the DOT processing unit 405, the DOT unit 452 receives the 8 run lengths from the FIFO 451, and carries out a DOT process with respect to the run lengths. In order to judge where the 8 dots are satisfied in the 8 run lengths, the total run length generating unit 453 obtains a total of the run lengths at each position of the 8 run lengths. The shift value generating unit 454 detects the position in the run lengths where the 8-dots are satisfied, and notifies the number of consumed run lengths so as to make a shift for the next 8 dots. If one of the 8 run lengths has a remainder when the 8 dots are satisfied, the difference generating unit 455 obtains a difference between thee 8 total run lengths obtained from the total run length generating unit 453 and the 8 values, so as to obtain the run length of the remainder. The RUN0 generating unit 456 selects RUN0 by receiving the actually used run value from the shift generating unit 454, and supplies the selected RUN0 to the FIFO 451. The above described processed is carried out in 1 clock, so that 9 pixels can be decoded for every clock.

Next, a more detailed description will be given of the various parts of the DOT processing unit 405. The FIFO 451 receives and successively stores the 8 run lengths, the valid number RUNLENG of the run lengths, and the like from the run length processing unit 404, and supplies the 8 run lengths and the like to the DOT unit 452 and the total run length generating unit 453. In addition, if one of the 8 run lengths has a remainder when 8 dots are satisfied, the FIFO 451 is notified of the remainder by a flag STA from the DOT unit 452, notified of the consumed number of run lengths from the shift generating unit 454, and the remaining run length from the RUN0 generating unit 456. When notified of the remainder, the FIFO 451 uses the run value RUN0 of the notified remainder as the next first run value, and outputs the next data by carried out the specified shift.

The DOT unit 452 receives the 8 run values and the like from the FIFO 451, and recognizes all combinations of the 8 runs filling the 8 dots. By using several runs from the start to fill the 8 dots, the DOT unit 452 generates 8 dots. If one of the 8 run lengths has a remainder when the 8 dots are satisfied, the DOT unit 451 notifies the existence of the remainder to the FIFO 451 by the flag STA.

Figure 58:
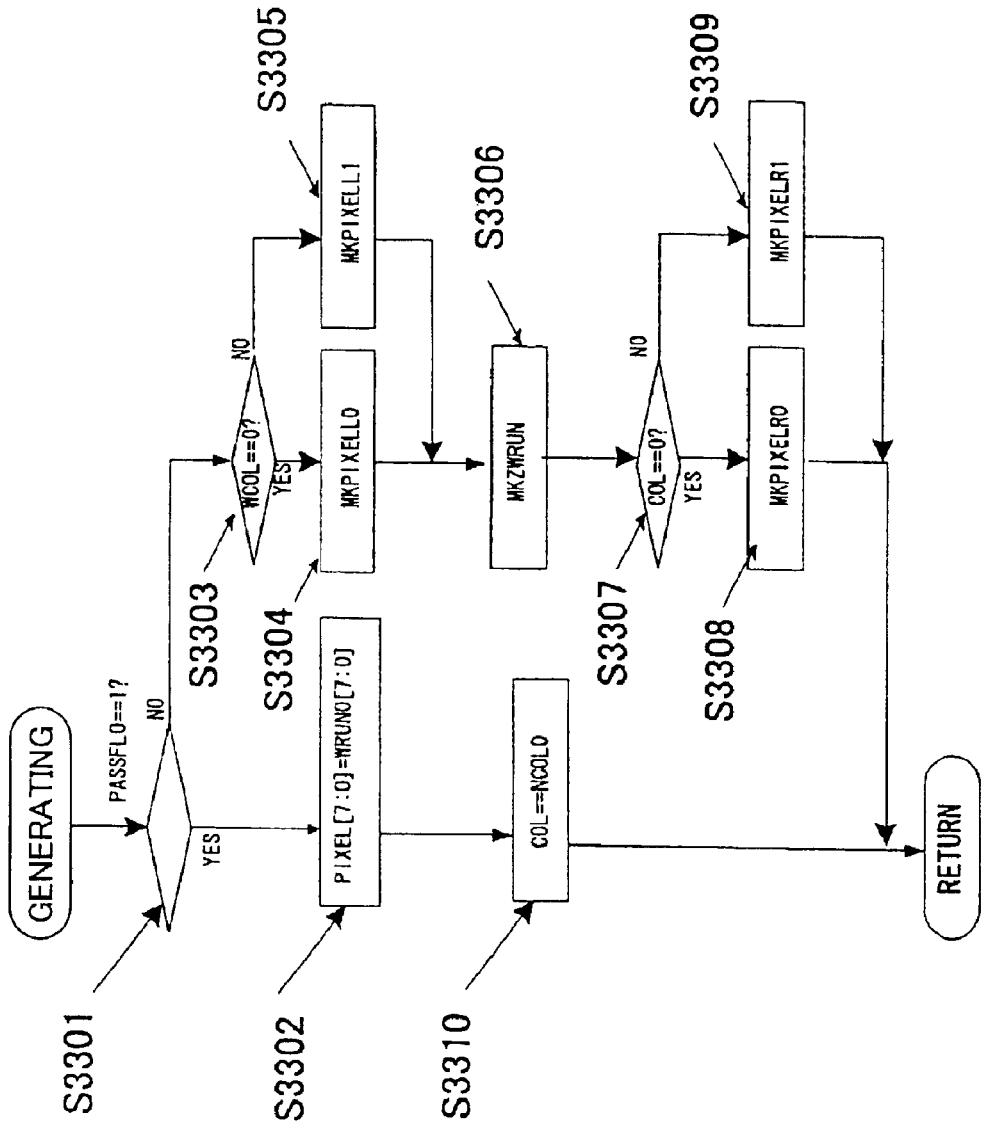
FIG. 58 is a flow chart for explaining a process of a DOT unit.
Figure 59:
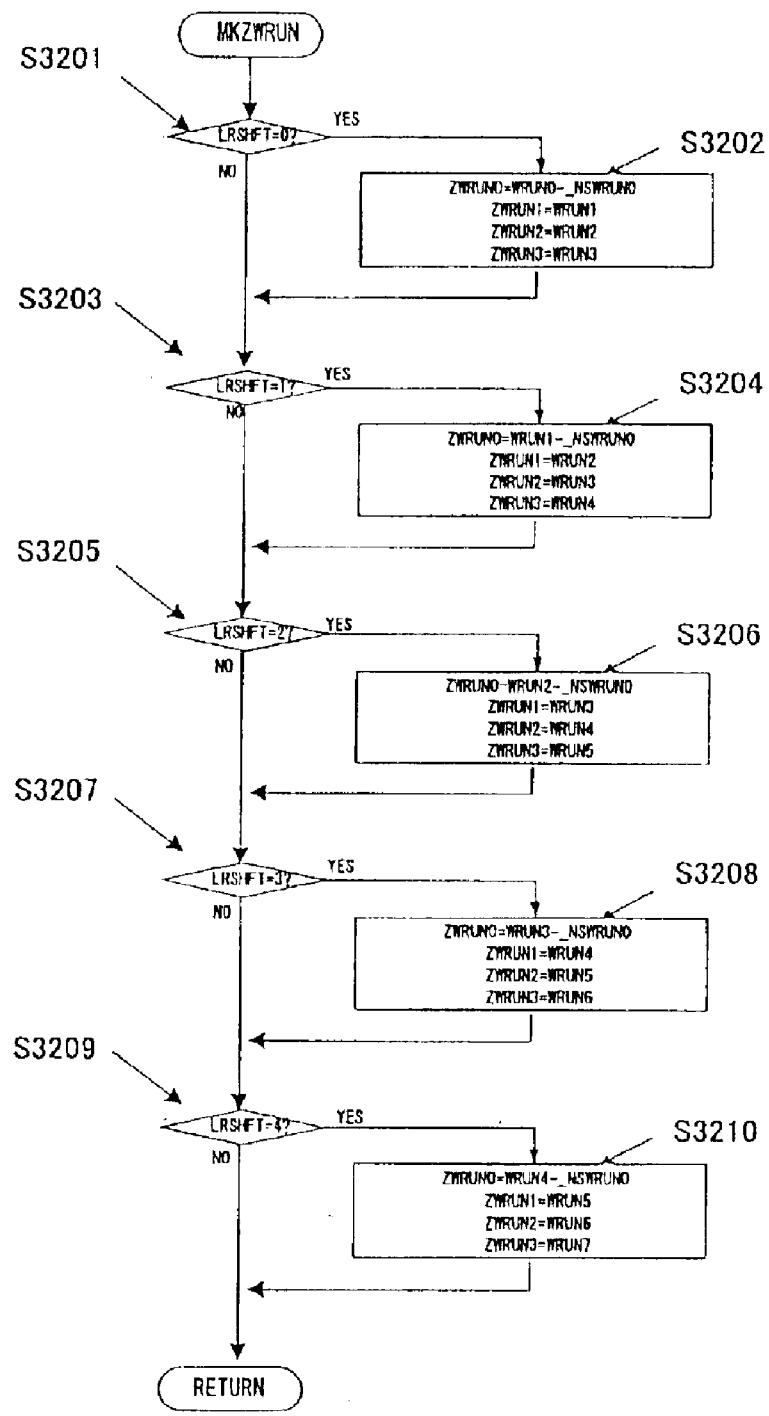
FIG. 59 is a flow chart for explaining a process of a step S3306 shown in FIG. 58.
Figure 60:
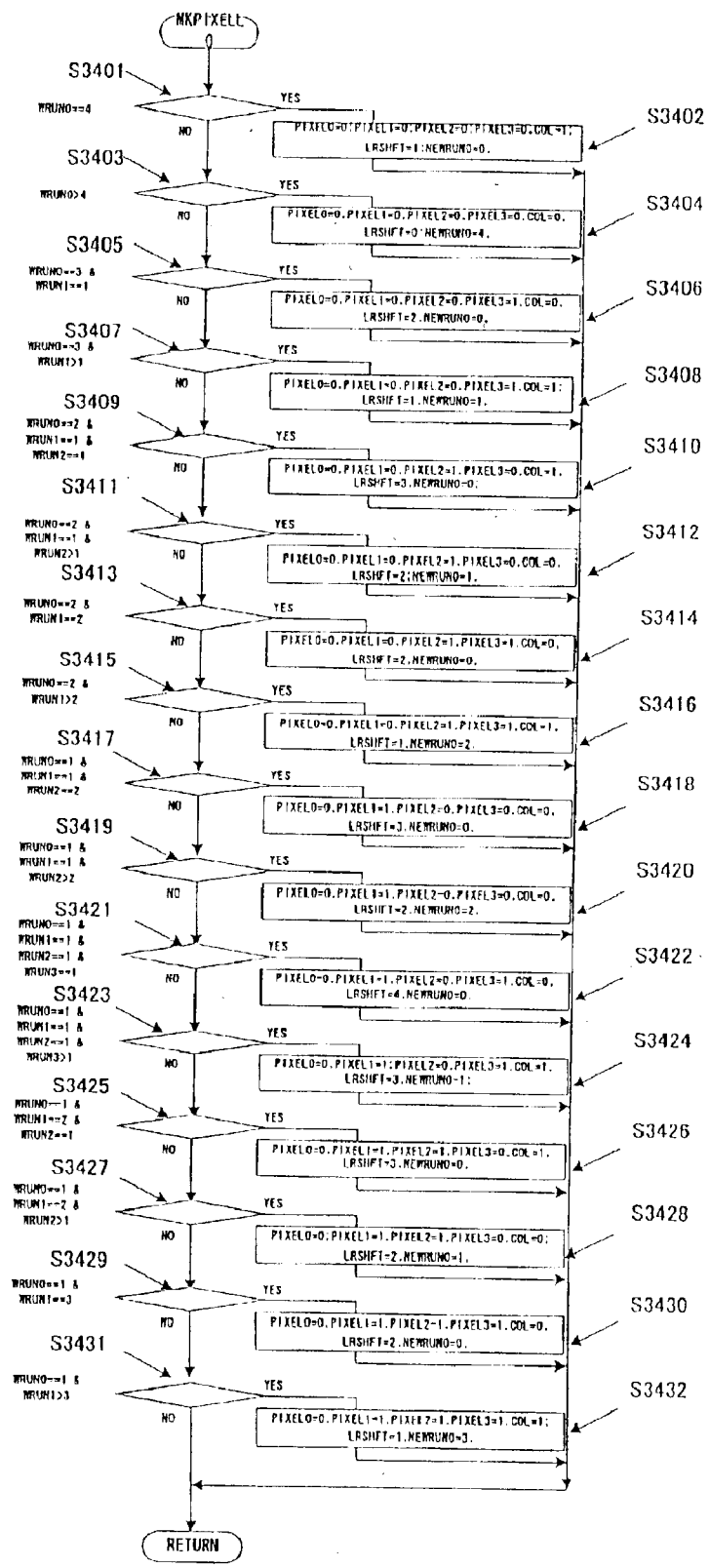
FIG. 60 is a flow chart showing a process of a step S3304 shown in FIG. 58.
Figure 61:
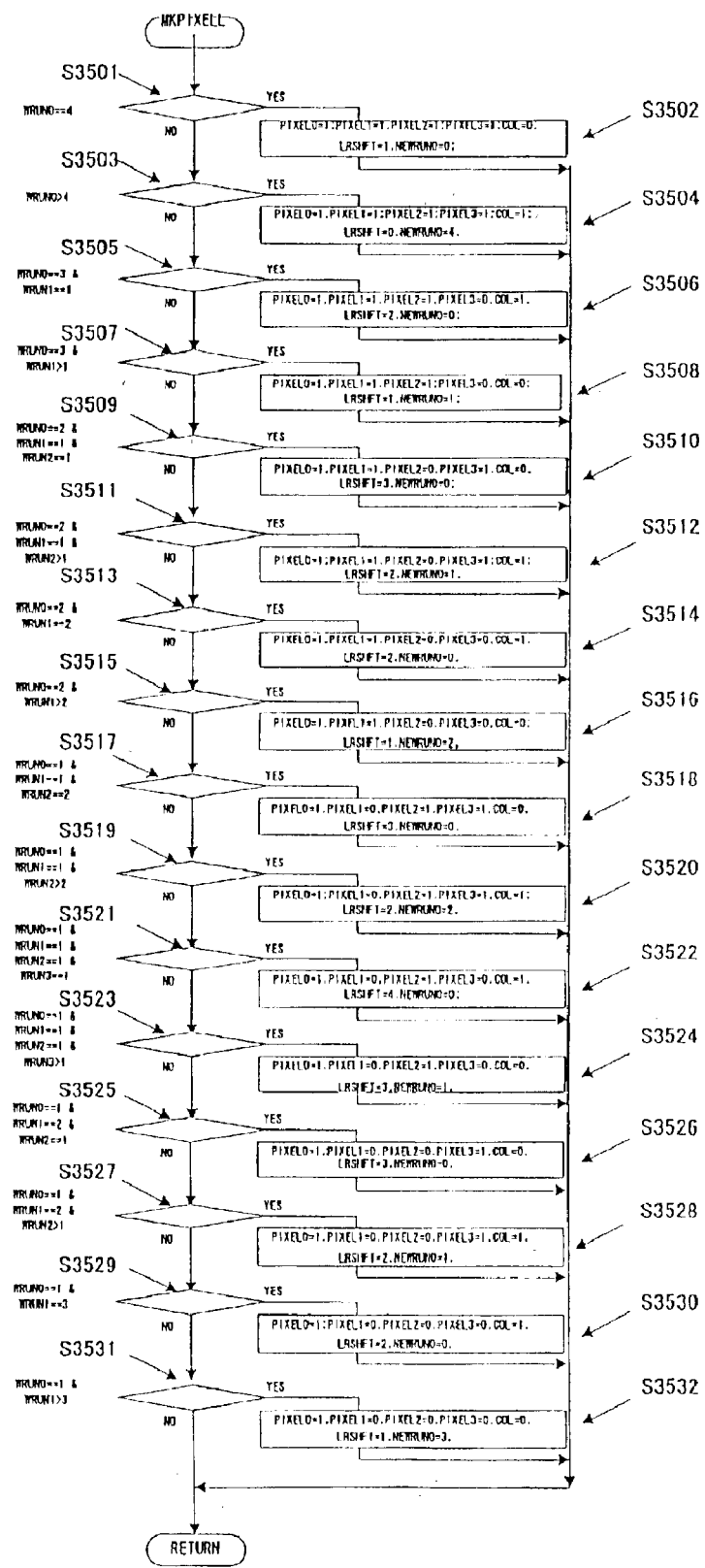
FIG. 61 is a flow chart showing a process of a step S3305 shown in FIG. 58.
Figure 62:
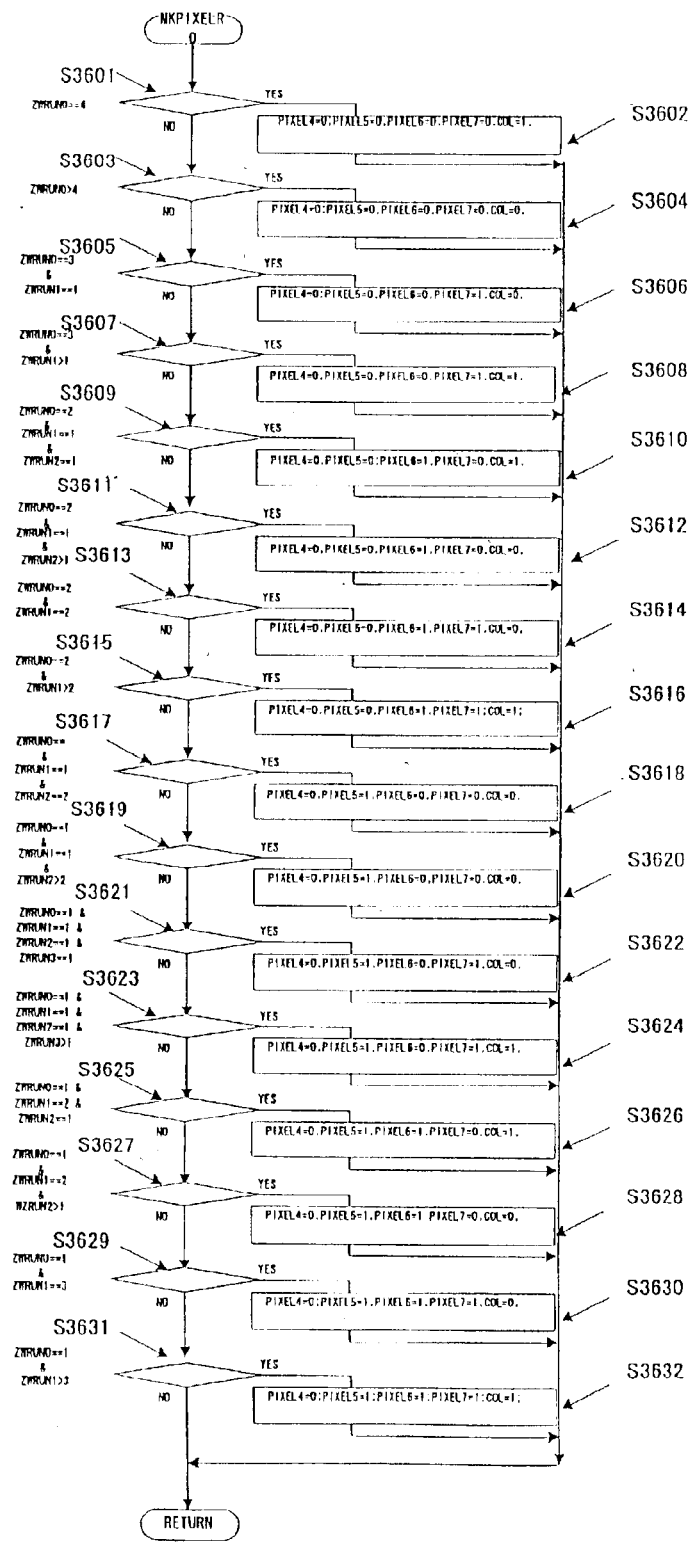
FIG. 62 is a flow chart for explaining a process of a step S3308 shown in FIG. 58.
Figure 63:
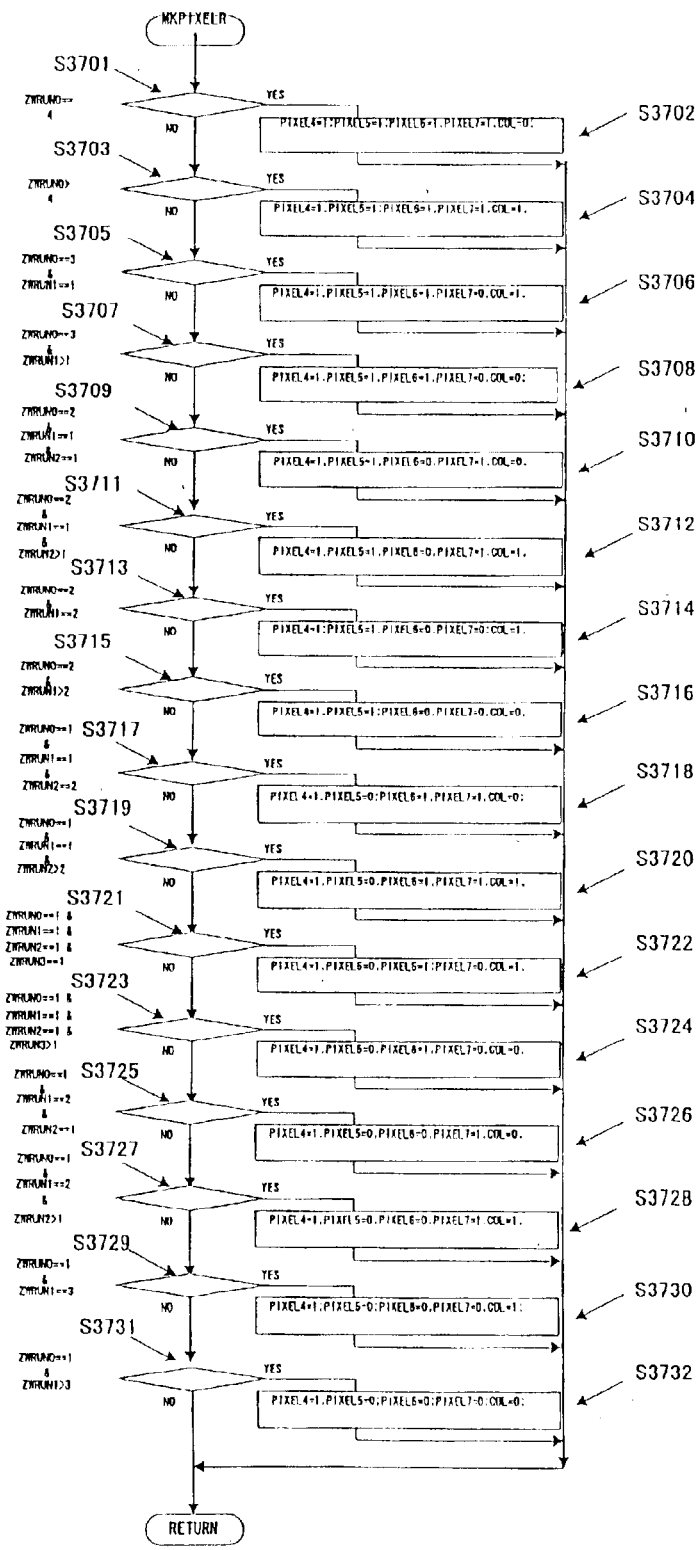
FIG. 63 is a flow chart for explaining a process of a step S3309 shown in FIG. 58.

FIG. 58 is a flow chart for explaining a process of the DOT unit 451. FIG. 60 is a flow chart showing a process of a step S3304 shown in FIG. 58. FIG. 61 is a flow chart showing a process of a step S3305 shown in FIG. 58. FIG. 62 is a flow chart for explaining a process of a step S3308 shown in FIG. 58. FIG. 63 is a flow chart for explaining a process of a step S3309 shown in FIG. 58. In addition, FIG. 59 is a flow chart for explaining a process of a step S3306 shown in FIG. 58.

In FIG. 58, a step S3301 judges whether or not the value of a first pass coding flag PASSFL0 is "1", and the pass coding process is carried out if the judgement result is YES. In other words, a step S3302 outputs the 8 bits of the first run length value as the image data. Next, a step S3310 sets the value of the next run length to the first value NCOL0 of NCOL which is the MSB value of the next dot of the pass code.

If the judgement result in the step S3301 is NO, a step S3303 judges whether or not the color value WCOL of the run length is "1". A step S3304 is carried out if the judgement result in the step S3303 is YES, and a step S3305 is carried out if the judgement result in the step S3303 is NO. The step S3304 obtains the first 4 bits of the image data from the value of each run length, as shown in FIG. 60. The step S3305 obtains the first 4 bits of the image data from the value of each run length as shown in FIG. 61.

For example, a step S340i shown in FIG. 60 judges whether or not WRUN0=4. If the judgement result in the step S3401 is YES, a step S3402 sets the pixel data and the like as PIXEL0=0, PIXEL1=0, PIXEL2=0, PIXEL3=0, COL=1, LRSHFT=1 and NEWRUN0=0. On the other hand, if the judgement result in the step S3401 is NO, a step S3403 judges whether or not WRUN0 is less than 4. Steps S3404 through S3432 are carried out similarly to make the corresponding judgements and outputs of the image data (pixel data).

For example, a step S3501 shown in FIG. 61 judges whether or not WRUN0=4. If the judgement result in the step S3501 is YES, a step S3502 sets the pixel data and the like as PIXEL0=1, PIXEL1=1, PIXEL2=1, PIXEL3=1, COL=0, LRSHFT=1 and NEWRUN0=0. On the other hand, if the judgement result in the step S3501 is NO, a step S3503 judges whether or not WRUN0 is greater than 4. Steps S3504 through S3532 are carried out similarly to make the corresponding judgements and outputs of the image data (pixel data).

Next, after the step S3304 or S3305 shown in FIG. 58, a step S3306 obtains the 4 run lengths continuing to the next 4 bits from a maximum of 8 run lengths, as shown in FIG. 59. In FIG. 59, a step S3201 judges whether or not LRSHFT=0. If the judgement result in the step S3201 is YES, a step S3202 sets ZWRUN0=WRUN0-_NSWRUN0, ZWRUN1=WRUN1, ZWRUN2=WRUN2 and ZWRUN3=WRUN3. After the step S3202 or if the judgement result in the step S3201 is NO, a step S3203 judges whether or not LRSHFT=1. Steps S3204 through S3210 are carried out similarly to the steps S3201 and S3202 to make the corresponding judgements and settings.

Next, a step S3307 shown in FIG. 58 judges whether or not the first color value of the run length of the next 4 bits is "1". A step S3308 is carried out if the judgement result in the step S3307 is YES, and a step S3309 is carried out if the judgement result in the step S3307 is NO. The step S3308 obtains the image data of the next 4 bits from the value of the remaining run length, as shown in FIG. 62. The step S3309 obtains the image data of the next 4 bits from the value of the remaining run length, as shown in FIG. 63.

For example, a step S3601 shown in FIG. 62 judges whether or not ZWRUN0=4. If the judgement result in the step S3601 is YES, a step S3602 sets the pixel data and the like as PIXEL4=0, PIXEL5=0, PIXEL6=0, PIXEL7=0 and. On the other hand, if the judgement result in the step S3601 is NO, a step S3603 judges whether or not ZWRUN0 is greater than 4. Steps S3604 through S3632 are carried out similarly to make the corresponding judgements and outputs of the image data (pixel data).

For example, a step S3701 shown in FIG. 63 judges whether or not ZWRUN0=4. If the judgement result in the step S3701 is YES, a step S3702 sets the pixel data and the like as PIXEL4=1, PIXEL5=1, PIXEL6=1, PIXEL7=1 and COL=0. On the other hand, if the judgement result in the step S3701 is NO, a step S3703 judges whether or not ZWRUN0 is greater than 4. Steps S3704 through S3732 are carried out similarly to make the corresponding judgements and outputs of the image data (pixel data).

In order to judge where the 8 dots re satisfied in the 8 run lengths (WRUN0 through WRUN7), the total run length generating unit 453 obtains totals ACRWUN0, ACWRUN1, ACWRUN2, ACWRUN3, ACWRUN4, ACWRUN5, ACWRUN6 and ACWRUN7 at each position of the 8 runs, where the following relationships stand.
ACWRUN0=WRUN0 (equal to run length 1)
ACWRUN1=WRUN0+WRUN1 (total of run lengths 1 and 2)
ACWRUN2=WRUN0+WRUN1+WRUN2 (total of run lengths 1, 2 and 3)
ACWRUN3=WRUN0+WRUN1+WRUN2+WRUN3
ACWRUN4=WRUN0+WRUN1+WRUN2+WRUN3+WRUN4
ACWRUN5=WRUN0+WRUN1+WRUN2+WRUN3+WRUN4+WRUN5
ACWRUN6=WRUN0+WRUN1+WRUN2+WRUN3+WRUN4+WRUN5+WRUN6
ACWRUN7=WRUN0+WRUN1+WRUN2+WRUN3+WRUN4+WRUN5+WRUN6+WRUN7

Figure 66:
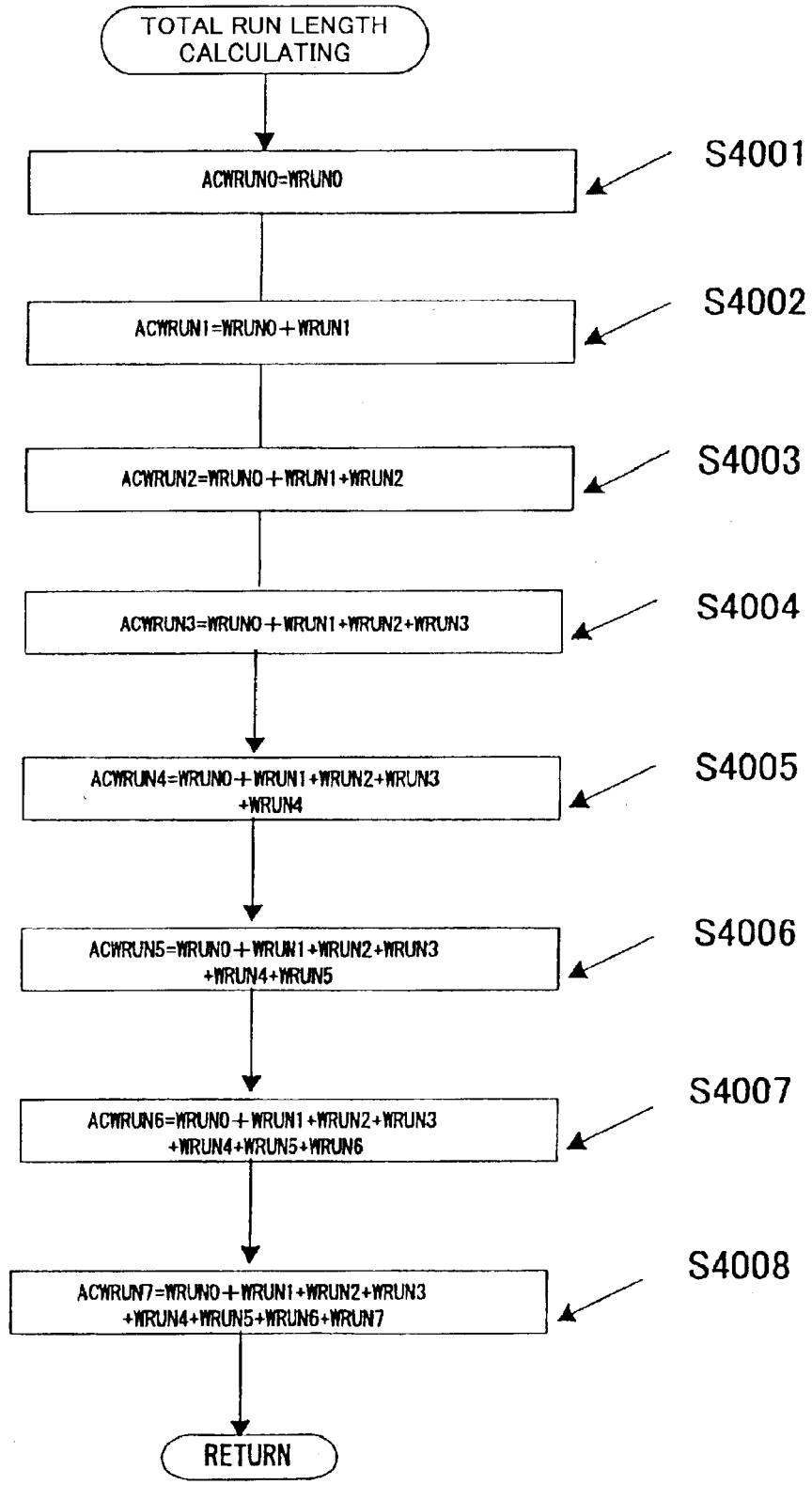
FIG. 66 is a flow chart for explaining a process of a total run length generating unit

FIG. 66 is a flow chart for explaining a process of the total run length generating unit 453. In FIG. 66, a step S4001 sets ACWRUN0=WRUN0 as described above. Steps S4002 through S4008 respectively set ACWRUN1 through ACWRUN7 as described above, and the process ends.

In order to detect the position of the run length satisfying the 8 dots, the shift value generating unit 454 detects the position where the value becomes 8 or greater, by putting priority from the beginning to the 8 total run lengths received from the total run length generating unit 453. The detected position is notified to the FIFO 451 and the RUN0 generating unit 456.

Figure 65:
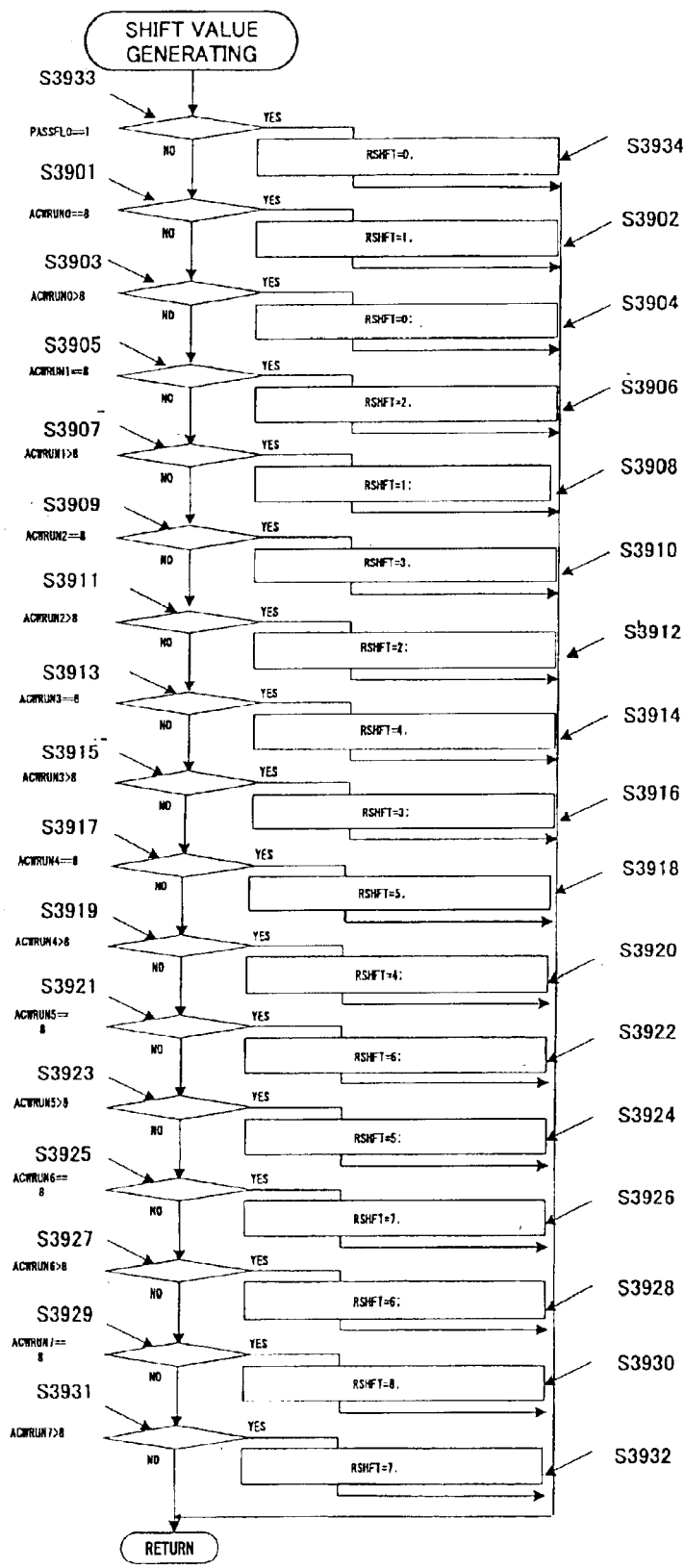
FIG. 65 is a flow chart for explaining a process of a shift value generating unit.

FIG. 65 is a flow chart for explaining a process of the shift value generating unit 453. In FIG. 65, a step S3933 judges whether or not PASSFL0=1, and if the judgement result is YES, a step S3934 sets RSHFT1=0. If the judgement result in the step S3933 is NO, a step S3901 judges whether or not ACWRUN0=8. If the judgement result in the step S3901 is YES, a step S3902 sets RSHFT=1. If the judgement result in the step S3901 is NO, a step S3903 judges whether or not ACWRUN0 is greater than 8. Steps S3903 through S3932 are carried out similarly to make the corresponding judgements and settings.

In order to obtain the run length of the remainder when one of the 8 run lengths has the remainder when the 8 dots are satisfied, the difference generating unit 455 obtains the difference between the 8 total run lengths received from the total run length generating unit 453 and the 8 total values to each of the run lengths. The obtained run length of the remainder is notified to the FIFO 451.

Figure 64:
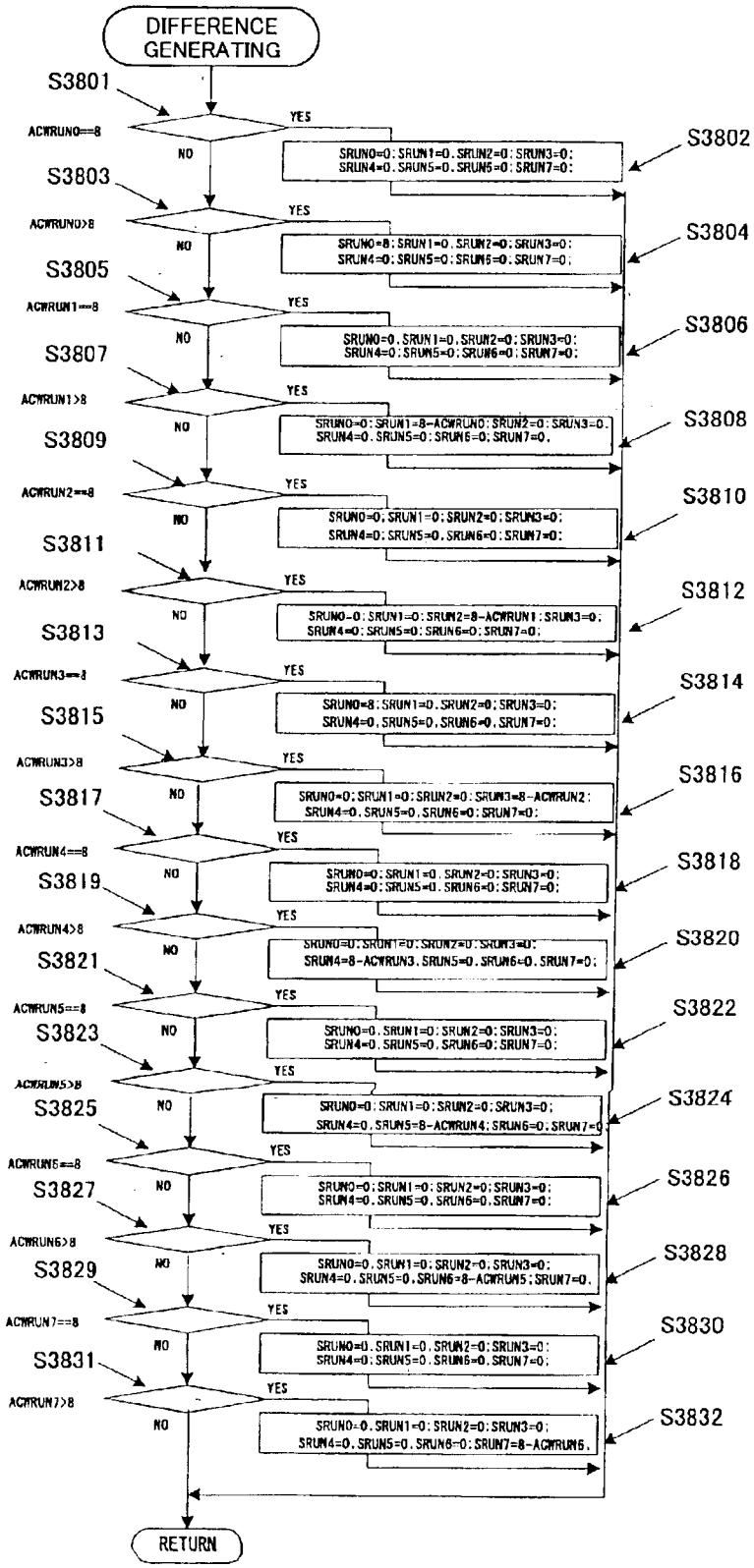
FIG. 64 is a flow chart for explaining a process of a difference generating unit.

FIG. 64 is a flow chart for explaining a process of the difference generating unit 455. In FIG. 64, a step S3801 judges whether or not ACWRUN0=8. A step S3802 sets SRUN0=0, SRUN1=0, SRUN2=0, SRUN3=0, SRUN4=0, SRUN5=0, SRUN6=0 and SRUN7=0. A step S3803 judges whether or not ACWRUN0 is greater than 8 if the judgement result in the step S3801 is NO. Steps S3803 through S3832 are carried out similarly to make the corresponding judgements and settings.

The RUN0 generating unit 456 receives the actually used run value from the shift generating unit 454, and selects the value of the remainder at the 8 points received from the difference generating unit 455. The selected value of the remainder is supplied to the FIFO 451 as the remainder RUN0 of the last run length.

Figure 46:
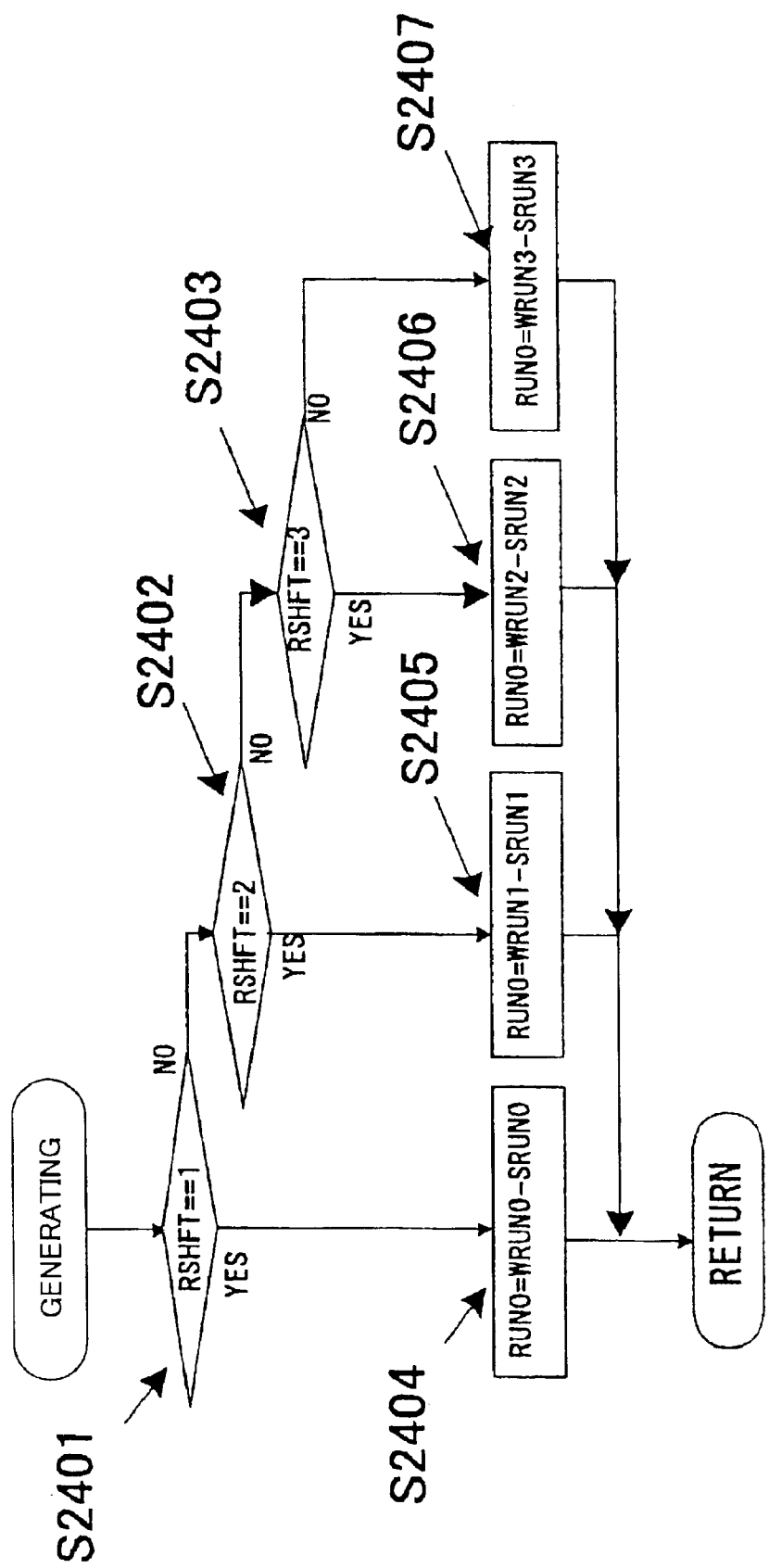
FIG. 46 is a flow chart for explaining a process of a RUN0 generating unit 456.

FIG. 46 is a flow chart for explaining a process of the RUN0 generating unit 456. In FIG. 46, steps S2401, S2402 and S2403 respectively judge whether or not RSHFT=1, RSHFT=2 and RSHFT=3. Steps S2404, S2405 and S2406 are respectively carried out if judgement results of the corresponding steps S2401, S2403 and S2403 are YES. A step S2407 is carried out if the judgement result in the step S2403 is NO. The step S2404 sets RUN0=WRUN0−SRUN0, and the step S2405 sets RUN0=WRUN1+SRUN1. The step S2406 sets RUN0=WRUN2−SRUN2, and the step S2407 sets RUN0=WRUN3−SRUN3.

Therefore, the code interpretation processing unit 403 forms a first processing means (or first processing step) of the image expansion apparatus (or method), and the run length processing unit 404 forms a second processing means (or second processing step) of the image expansion apparatus (or method). In addition, the DOT processing unit 405 forms a third processing means (or third processing step) of the image expansion apparatus (or method). The first through third processing means (or first through fourth processing steps) of the image expansion apparatus (or method) are referred to in the Summary of the Invention section of this specification.

As mentioned before, the present invention is not limited to the 8-bit parallel processing described above, and the present invention is similarly applicable to parallel processing in units of predetermined number of bits other than 8 bits.

Next, a description will be given of an embodiment of a computer-readable storage medium according to the present invention. This embodiment of the computer-readable storage medium stores a program for causing a computer to carry out the image compression method according to the present invention and/or the image expansion method according to the present invention. The computer may be realized by a CPU or the like of general purpose computers or personal computers. A storage medium which stores the program for such a computer may be formed by any kind of recording media capable of storing the program. The recording media may include magnetic, optical and magneto-optical recording media, semiconductor memory devices and the like.

The computer which executes the program stored in the computer-readable storage medium according to the present invention can thus replace the image compression apparatus 106e and/or the image expansion apparatus 106d, that is, replace the hardware by the software operation.

Further, the present invention is not limited to these embodiments, but various variations and modifications may be made without departing from the scope of the present invention.

What is claimed is:

1. An image compression apparatus for compressing image data by carrying out a parallel processing for every image pattern made up of a plurality of bits, comprising:
   first processing means for obtaining a run length of the image data and a repetition number of the run length;
   second processing means for coding the run length and the repetition number obtained by said first processing means; and
   third processing means for predicting whether or not a code length of a code generated by a word which is to be coded by said second processing means exceeds a predetermined threshold value, based on the run length and the repetition number obtained by said first processing means,
   said second processing means carrying out a pass coding to output the image pattern as it is when said third processing means predicts that the code length exceeds the predetermined threshold value.

2. The image compression apparatus as claimed in claim 1, wherein said first processing means includes:

means for obtaining a number of closed run lengths equal to the number of bits processed by the parallel processing for every image pattern and a run length carried over to a next image pattern; and means for cumulatively adding the run length which is carried over until said run length closes.

3. The image compression apparatus as claimed in claim 1, wherein said third processing means includes:

means for obtaining a code length of the code generated by the word which is to be coded by said second processing means based on the run length and the repetition number obtained by said first processing means; and means for comparing the obtained code length and the predetermined threshold value.

4. The image compression apparatus as claimed in claim 1, wherein said third processing means includes:

means for obtaining a code length of the code generated by the word which is to be coded by said second processing means based on the run length and the repetition number obtained by said first processing means;

correcting means for correcting the obtained code length so as to include halfway run lengths and halfway repetition numbers which are not closed in the word which is to be coded; and means for comparing the corrected code length and the predetermined threshold value.

5. The image compression apparatus as claimed in claim 4, further comprising:

fourth processing means for judging whether or not a pass coding is carried out in a word which is next to the word which is to be processed by said second processing means, based on the run length and the repetition number obtained by said first processing means, and outputting a judgement result, said judgement result of said fourth processing means controlling a correction amount of the code length by said correcting means included in said second processing means.

6. An image expansion apparatus for restoring an image data by a parallel processing based on coded data including a code of a run length, a code of a repetition number and a pass code, comprising:

first processing means for analyzing the coded data and outputting output information which includes the run length, the repetition number and the pass code;

second processing means for generating a run length based on the output information of said first processing means; and third processing means for generating image data made up of a plurality of bits, based on the run length generated by said second processing means and the pass code obtained by said first processing means.

7. An image forming apparatus comprising:

an image compression apparatus;

storage means for storing coded data compressed and output by said image compression apparatus;

an image expansion apparatus; and image forming means for forming the image data expanded by said image expansion apparatus on a recording medium, said image compression apparatus compressing image data by carrying out a parallel processing for every image pattern made up of a plurality of bits, and comprising:

first means for obtaining a run length of the image data and a repetition number of the run length;

second means for coding the run length and the repetition number obtained by said first means; and third means for predicting whether or not a code length of a code generated by a word which is to be coded by said second means exceeds a predetermined threshold value, based on the run length and the repetition number obtained by said first means, said second means carrying out a pass coding to output the image pattern as it is when said third means predicts that the code length exceeds the predetermined threshold value, said image expansion apparatus restoring the image data by a parallel processing based on the coded data including a code of a run length, a code of a repetition number and a pass code, and comprising:

fourth means for analyzing the coded data and outputting output information which includes the run length, the repetition number and the pass code;

fifth means for generating a run length based on the output information of said first means; and sixth means for generating image data made up of a plurality of bits, based on the run length generated by said fifth means and the pass code obtained by said fourth means.

8. An image compression method for compressing image data by carrying out a parallel processing for every image pattern made up of a plurality of bits, comprising:

a first processing step obtaining a run length of the image data and a repetition number of the run length;

a second processing step coding the run length and the repetition number obtained by said first processing step; and a third processing step predicting whether or not a code length of a code generated by a word which is to be coded by said second processing step exceeds a predetermined threshold value, based on the run length and the repetition number obtained by said first processing step, said second processing step carrying out a pass coding to output the image pattern as it is when said third processing step predicts that the code length exceeds the predetermined threshold value.

9. The image compression method as claimed in claim 8, wherein said first processing step includes:

a step obtaining a number of closed run lengths equal to the number of bits processed by the parallel processing for every image pattern and a run length carried over to a next image pattern; and a step cumulatively adding the run length which is carried over until said run length closes.

10. The image compression method as claimed in claim 8, wherein said third processing step includes:

a step obtaining a code length of the code generated by the word which is to be coded by said second processing step based on the run length and the repetition number obtained by said first processing step; and a step comparing the obtained code length and the predetermined threshold value.

11. The image compression method as claimed in claim 8, wherein said third processing step includes:

a step obtaining a code length of the code generated by the word which is to be coded by said second processing step based on the run length and the repetition number obtained by said first processing step;

a correcting step correcting the obtained code length so as to include halfway run lengths and halfway repetition numbers which are not closed in the word which is to be coded; and a step comparing the corrected code length and the predetermined threshold value.

12. The image compression method as claimed in claim 11, further comprising:

a fourth processing step judging whether or not a pass coding is carried out in a word which is next to the word which is to be processed by said second processing step, based on the run length and the repetition number obtained by said first processing step, and outputting a judgement result, said judgement result of said fourth processing step controlling a correction amount of the code length by said correcting step included in said second processing step.

13. An image expansion method for restoring an image data by a parallel processing based on coded data including a code of a run length, a code of a repetition number and a pass code, comprising:

a first processing step analyzing the coded data and outputting output information which includes the run length, the repetition number and the pass code;

a second processing step generating a run length based on the output information of said first processing step; and a third processing step generating image data made up of a plurality of bits, based on the run length generated by said second processing step and the pass code obtained by said first processing step.

14. A computer-readable storage medium which stores a program for causing a computer to execute an image compression process which compresses image data by carrying out a parallel processing for every image pattern made up of a plurality of bits, said program comprising:

a first processing procedure which causes the computer to obtain a run length of the image data and a repetition number of the run length;

a second processing which causes the computer to code the run length and the repetition number obtained by said first processing procedure; and a third processing procedure which causes the computer to predict whether or not a code length of a code generated by a word which is to be coded by said second processing procedure exceeds a predetermined threshold value, based on the run length and the repetition number obtained by said first processing procedure, said second processing procedure causing the computer to carry out a pass coding to output the image pattern as it is when said third processing procedure predicts that the code length exceeds the predetermined threshold value.

15. A computer-readable storage medium which stores a program for causing a computer to execute an image expansion process which restores an image data by a parallel processing based on coded data including a code of a run length, a code of a repetition number and a pass code, said program comprising:

a first processing procedure which causes the computer to analyze the coded data and outputting output information which includes the run length, the repetition number and the pass code;

a second processing procedure which causes the computer to generate a run length based on the output information of said first processing procedure; and a third processing procedure which causes the computer to generate image data made up of a plurality of bits, based on the run length generated by said second processing procedure and the pass code obtained by said first processing procedure.

* * * * *